(12) United States Patent
Golle et al.

(10) Patent No.: US 10,595,469 B2
(45) Date of Patent: Mar. 24, 2020

(54) LIGHTING FIXTURE AND METHOD FOR MAKING AND USING

(71) Applicant: Grow Lites, LLC, Eden Prairie, MN (US)

(72) Inventors: John T. Golle, Eden Prairie, MN (US); Aaron J. Golle, Farmington, MN (US); Barbara A. DeBaun, Woodbury, MN (US); David T. Doan, Hopkins, MN (US); Matthew P. Limpert, Bloomington, MN (US); Walter J. Paciorek, Phoenix, AZ (US); Jason P. Green, Minneapolis, MN (US); Charles A. Lemaire, Apple Valley, MN (US)

(73) Assignee: Grow Lites, LLC, Eden Prairie, MN (US)

(*) Notice: Subject to any disclaimer, the term of this patent is extended or adjusted under 35 U.S.C. 154(b) by 0 days.

(21) Appl. No.: 16/300,033

(22) PCT Filed: Nov. 13, 2017

(86) PCT No.: PCT/US2017/061416
§ 371 (c)(1),
(2) Date: Nov. 8, 2018

(87) PCT Pub. No.: WO2018/089955
PCT Pub. Date: May 17, 2018

(65) Prior Publication Data
US 2019/0150372 A1     May 23, 2019

Related U.S. Application Data

(60) Provisional application No. 62/576,646, filed on Oct. 24, 2017, provisional application No. 62/574,172, (Continued)

(51) Int. Cl.
*A01G 7/04*     (2006.01)
*H01L 25/075*   (2006.01)
(Continued)

(52) U.S. Cl.
CPC .......... *A01G 7/045* (2013.01); *F21V 19/0015* (2013.01); *F21V 21/35* (2013.01);
(Continued)

(58) Field of Classification Search
CPC .......... A01G 7/045; A01G 9/20; A01G 9/249; H01L 25/0753; H01L 33/62; H01L 33/48;
(Continued)

(56) References Cited

U.S. PATENT DOCUMENTS 4,669,817 A * 6/1987 Mori ................. A01G 7/045
                                                    359/591
6,095,661 A    8/2000 Lebens et al.
(Continued)

FOREIGN PATENT DOCUMENTS

JP  2007267645 A * 10/2007 ............... A01G 7/00
JP  2009089631 A *  4/2009 ............... A01G 7/00
(Continued)

OTHER PUBLICATIONS

Machine translation of JP 2012120477 to Tomita, published Jun. 2012.*

*Primary Examiner* — Kathleen I Alker
(74) *Attorney, Agent, or Firm* — Charles A. Lemaire; Johnathan M. Rixen; Lemaire Patent Law Firm, P.L.L.C.

(57) ABSTRACT

A lighting apparatus that includes a flexible circuit substrate that has a front face and an opposite back face, and a first end and an opposite second end; a first plurality of LED dice on the flexible substrate, wherein each die of the first plurality of LED dice emits blue light; a second plurality of LED dice that emits red light; a third plurality of LED dice that emits
(Continued)

infrared, wherein the first, second and third plurality of LEDs each emit a full-width-half-maximum bandwidth of no more than 50 nm in each of their respective colors; a first and second end cap affixed to opposite ends of flexible substrate and configured to curve the first face of the flexible circuit substrate into a concave shape; and a pole bracket connected to the end caps for attaching to a pole that supports the lighting apparatus.

21 Claims, 41 Drawing Sheets

Related U.S. Application Data filed on Oct. 18, 2017, provisional application No. 62/574,193, filed on Oct. 18, 2017, provisional application No. 62/574,194, filed on Oct. 18, 2017, provisional application No. 62/486,444, filed on Apr. 17, 2017, provisional application No. 62/421,970, filed on Nov. 14, 2016.

(51) Int. Cl.

| | | |
|---|---|---|
| F21V 33/00 | (2006.01) | |
| F21V 19/00 | (2006.01) | |
| F21V 21/35 | (2006.01) | |
| F21V 23/02 | (2006.01) | |
| F21V 23/06 | (2006.01) | |
| H05B 33/08 | (2020.01) | |
| F21V 23/00 | (2015.01) | |
| H01L 33/62 | (2010.01) | |
| F21Y 107/10 | (2016.01) | |
| F21Y 113/13 | (2016.01) | |
| F21Y 107/70 | (2016.01) | |
| F21Y 107/60 | (2016.01) | |
| H01L 33/48 | (2010.01) | |
| F21Y 105/14 | (2016.01) | |
| F21Y 115/10 | (2016.01) | |

(52) U.S. Cl.
CPC ............ *F21V 23/003* (2013.01); *F21V 23/02* (2013.01); *F21V 23/06* (2013.01); *F21V 33/006* (2013.01); *H01L 25/0753* (2013.01); *H01L 33/62* (2013.01); *H05B 33/0857* (2013.01); *F21Y 2105/14* (2016.08); *F21Y 2107/10* (2016.08); *F21Y 2107/60* (2016.08); *F21Y 2107/70* (2016.08); *F21Y 2113/13* (2016.08); *F21Y 2115/10* (2016.08); *H01L 33/48* (2013.01); *Y02P 60/149* (2015.11)

(58) Field of Classification Search
CPC ............ H05B 33/0857; F21Y 2107/60; F21Y 2107/10; F21Y 2113/13; F21Y 2105/14; F21Y 2115/10; F21Y 2107/70; Y02P 60/149

See application file for complete search history.

(56) References Cited

U.S. PATENT DOCUMENTS

| | | | | |
|---|---|---|---|---|
| 7,052,924 | B2* | 5/2006 | Daniels | H01L 27/14625 438/22 |
| 7,374,315 | B2* | 5/2008 | Dorsey | F21V 23/04 362/294 |
| 7,607,815 | B2 | 10/2009 | Pang | |
| 7,617,857 | B2 | 11/2009 | Froese | |
| 7,905,052 | B2* | 3/2011 | Hurst | A01G 7/045 47/17 |
| 8,454,991 | B2 | 6/2013 | Woo et al. | |
| 8,471,274 | B2 | 6/2013 | Golle et al. | |
| 8,523,385 | B2* | 9/2013 | Lu | A01G 7/045 362/231 |
| 9,029,883 | B2 | 5/2015 | Chung | |
| 9,060,468 | B2 | 6/2015 | Klase et al. | |
| 9,074,758 | B2 | 7/2015 | Oraw et al. | |
| 9,116,276 | B2 | 8/2015 | Montfort et al. | |
| 9,282,699 | B2 | 3/2016 | Anderson et al. | |
| 9,288,948 | B2* | 3/2016 | McNamara | A01G 9/16 |
| 9,391,054 | B2 | 7/2016 | Dubin | |
| 9,474,217 | B2 | 10/2016 | Anderson et al. | |
| 9,510,524 | B2 | 12/2016 | Anderson et al. | |
| 9,814,186 | B2 | 11/2017 | Anderson et al. | |
| 9,826,689 | B2* | 11/2017 | Shaughnessy | H05B 33/00 |
| 9,901,039 | B1* | 2/2018 | Dellerson | F04D 29/384 |
| 9,903,574 | B2 | 2/2018 | Golle et al. | |
| 2005/0212439 | A1 | 9/2005 | Zampini et al. | |
| 2005/0237741 | A1* | 10/2005 | Chang | A47H 13/00 362/249.01 |
| 2012/0054061 | A1* | 3/2012 | Fok | A01G 31/00 705/26.5 |
| 2012/0140468 | A1 | 6/2012 | Chang | |
| 2013/0285073 | A1 | 10/2013 | Golle et al. | |
| 2014/0000162 | A1* | 1/2014 | Blank | A01G 31/06 47/62 A |
| 2015/0150195 | A1* | 6/2015 | Grajcar | A01G 7/045 47/58.1 LS |
| 2015/0208592 | A1 | 7/2015 | Marchildon | |
| 2015/0319933 | A1 | 11/2015 | Li | |
| 2016/0000019 | A1* | 1/2016 | Koerner | F21V 23/02 47/58.1 LS |
| 2016/0192598 | A1* | 7/2016 | Haggarty | A01G 7/045 315/297 |
| 2017/0211764 | A1* | 7/2017 | Price | F21V 3/00 |
| 2018/0135840 | A1 | 5/2018 | Golle et al. | |
| 2019/0041048 | A1* | 2/2019 | Martin | F21V 23/06 |

FOREIGN PATENT DOCUMENTS

| | | | | |
|---|---|---|---|---|
| JP | 2011120557 A | * | 6/2011 | ............ A01G 7/00 |
| JP | 2012120477 A | * | 6/2012 | ............ A01G 7/045 |
| WO | WO-2013024682 A1 | * | 2/2013 | ............ A01G 7/045 |

* cited by examiner

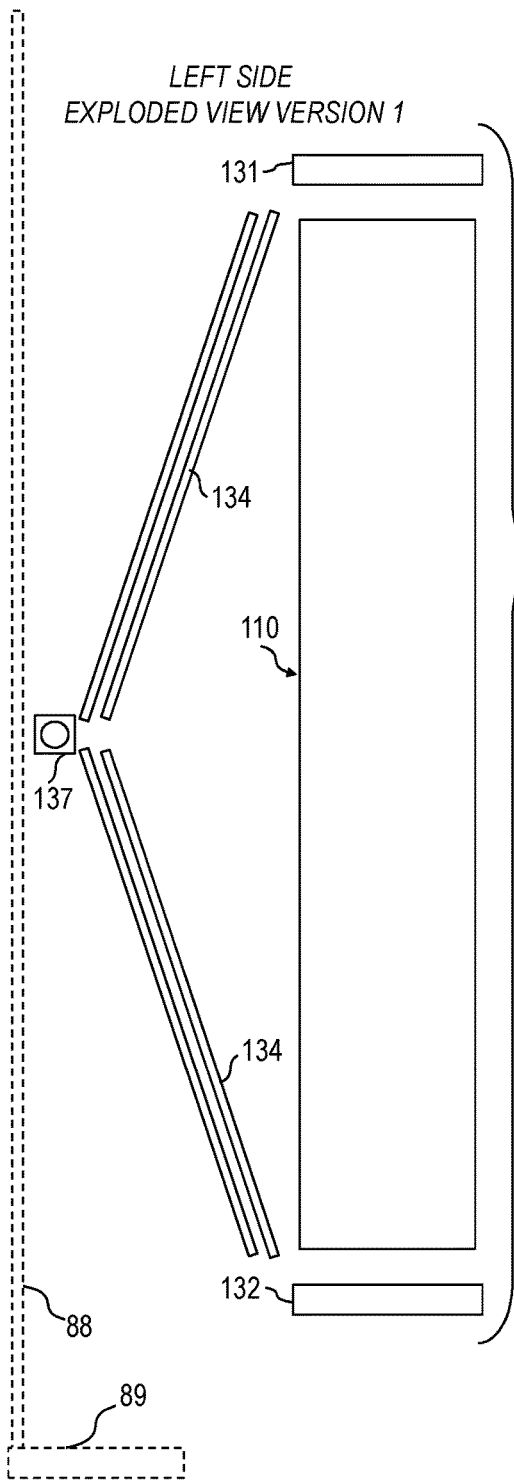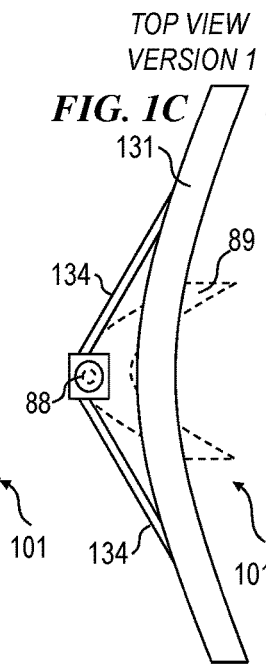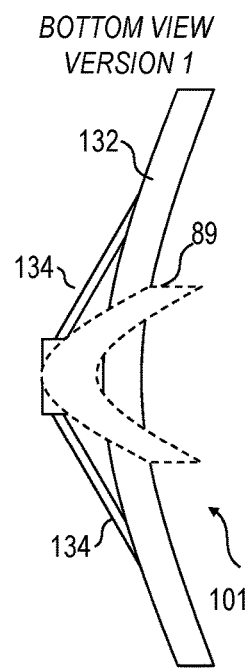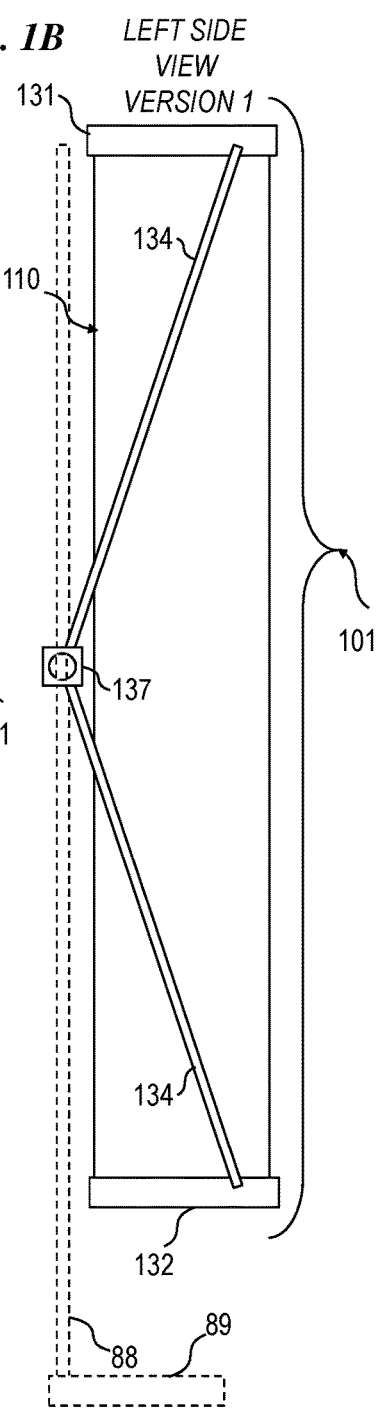

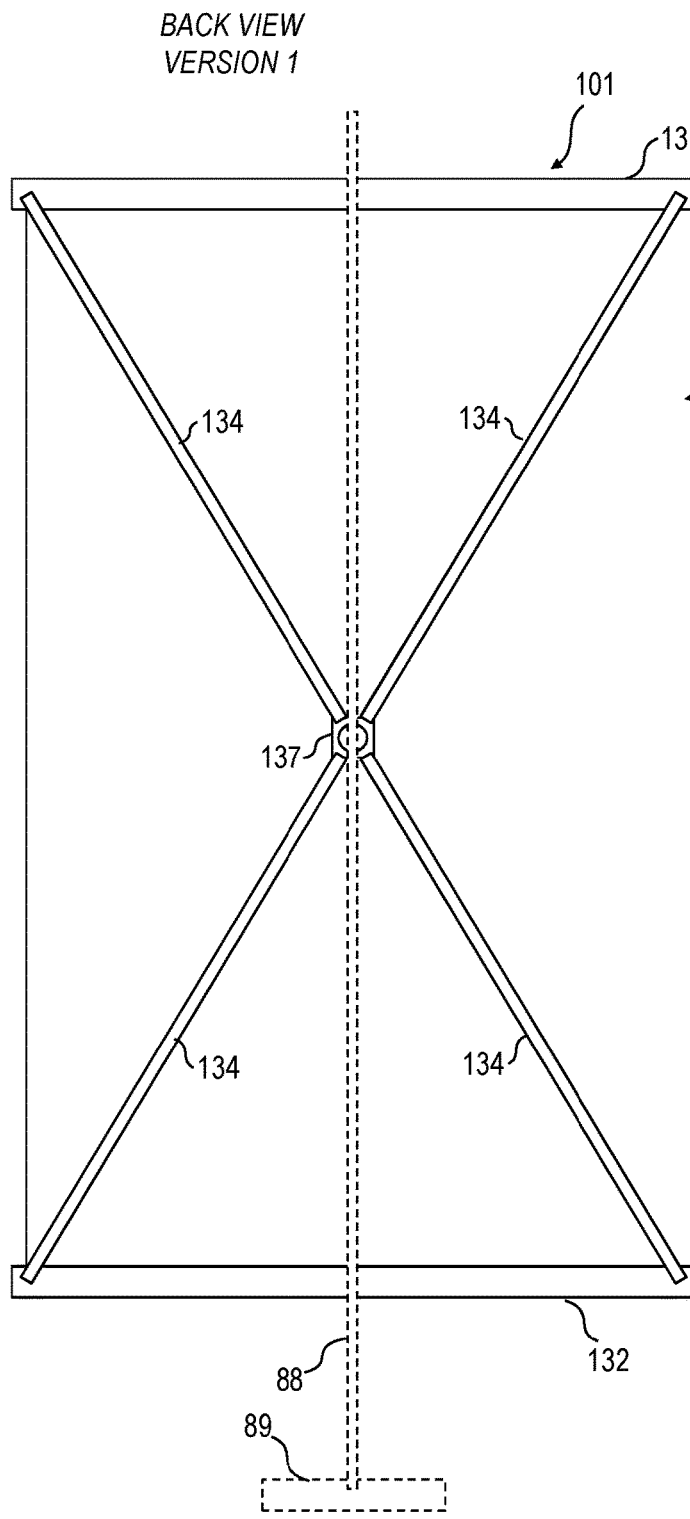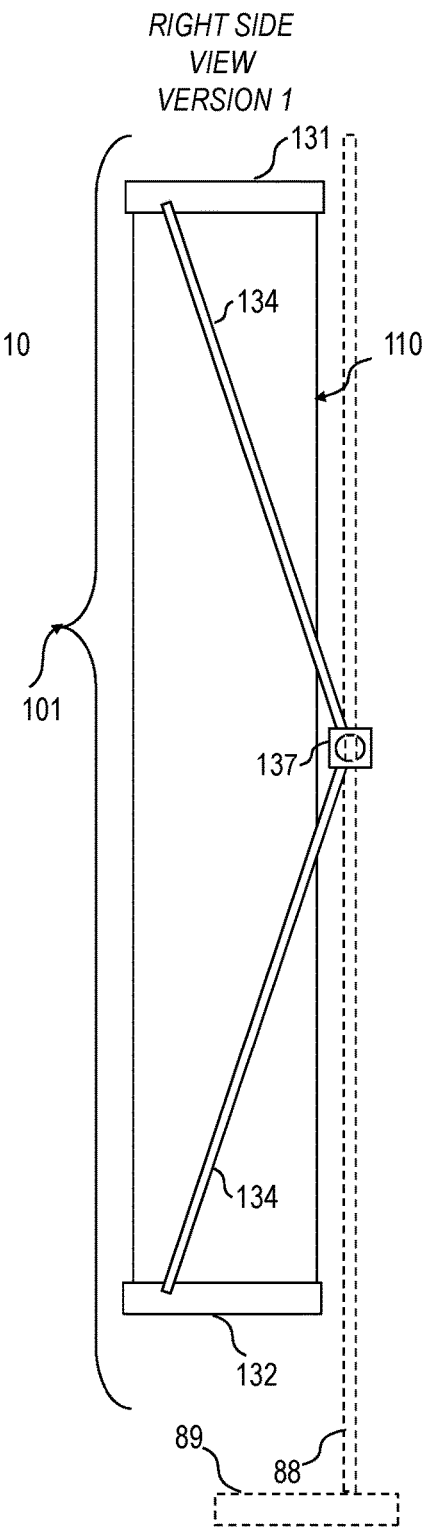

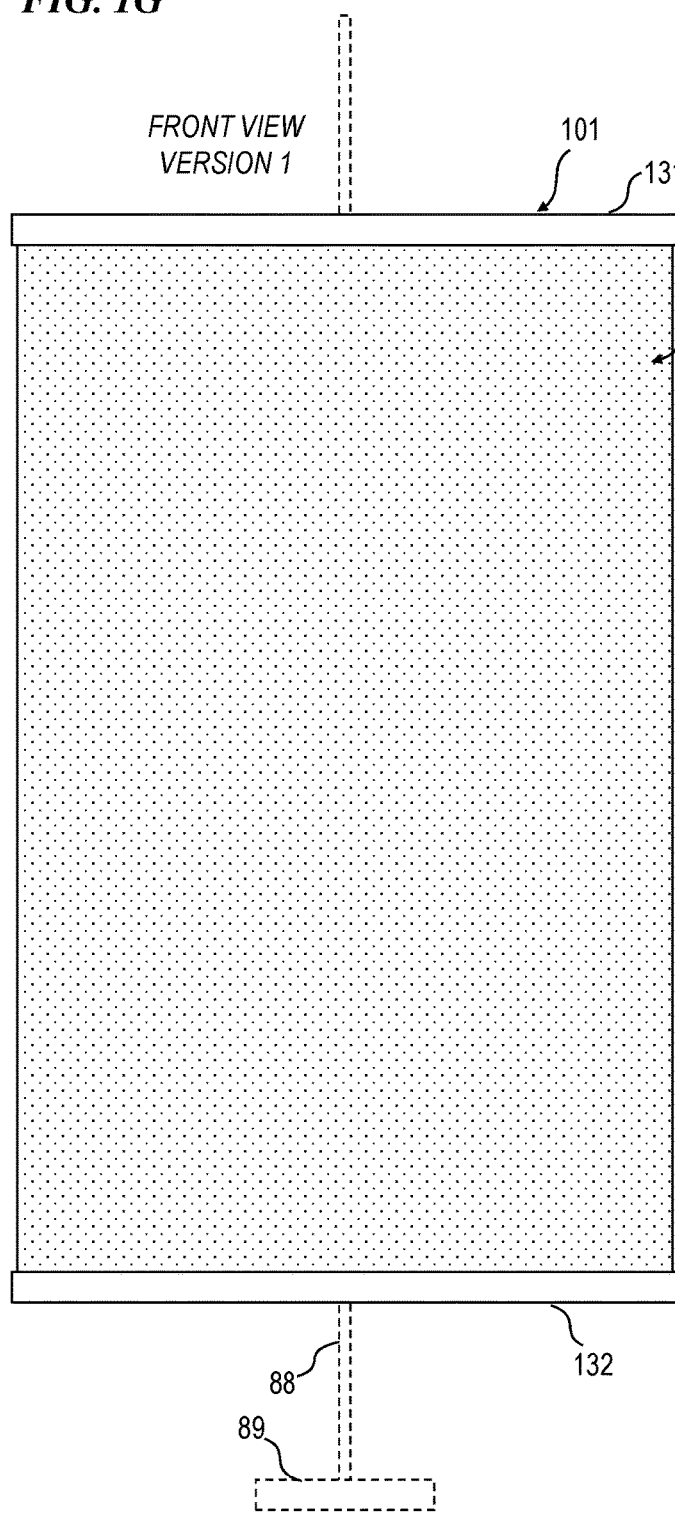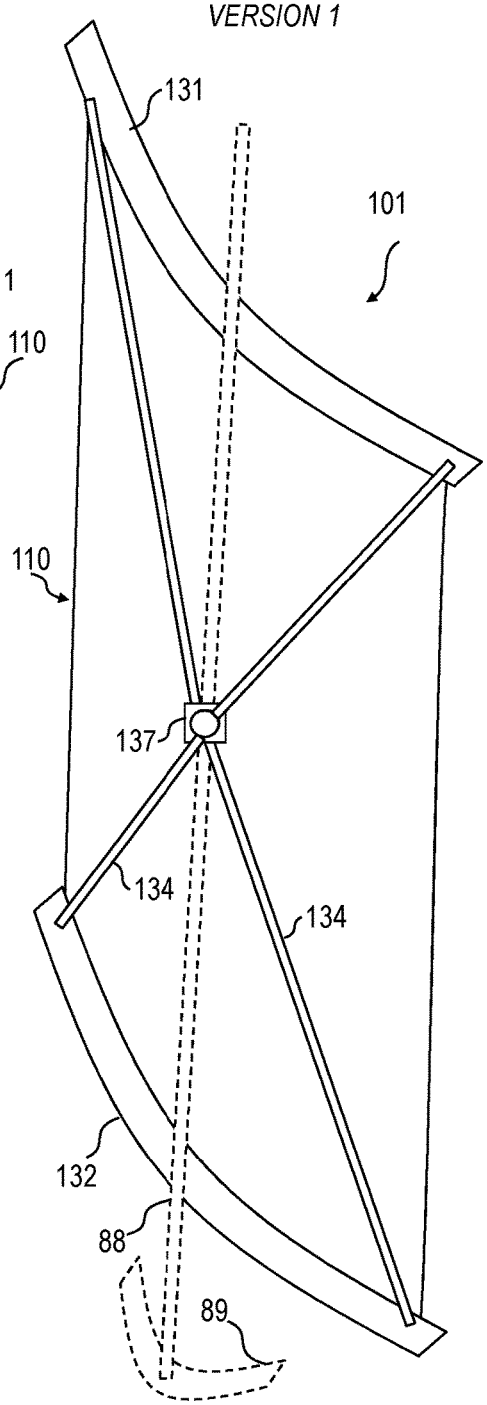

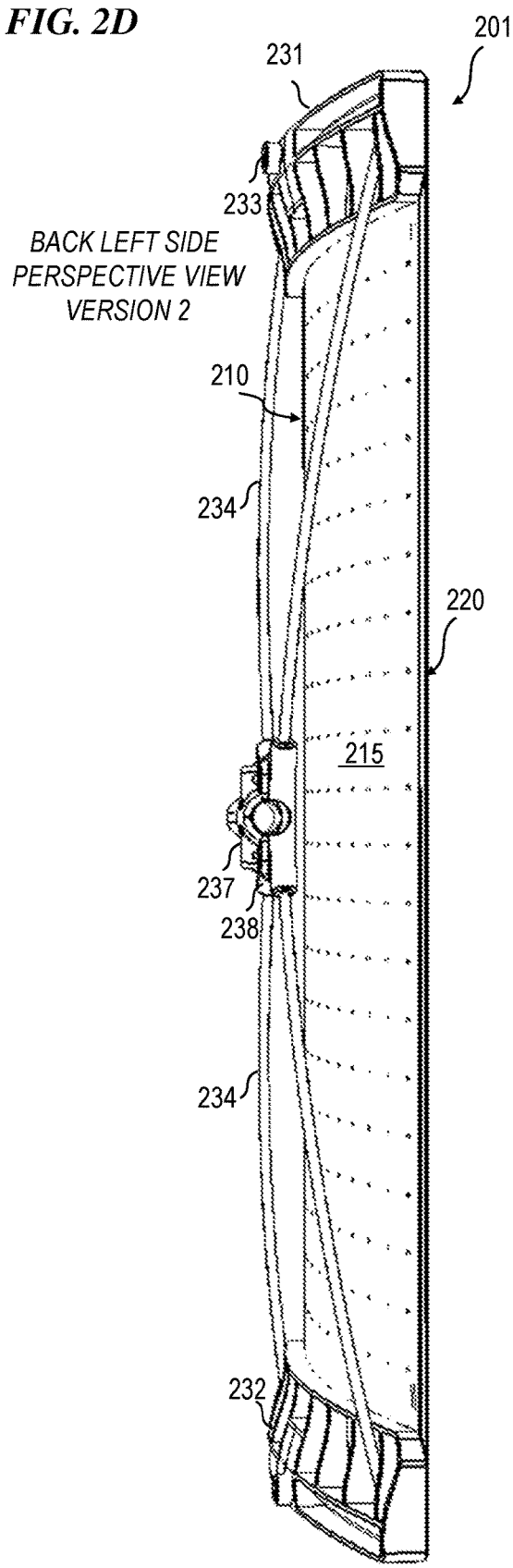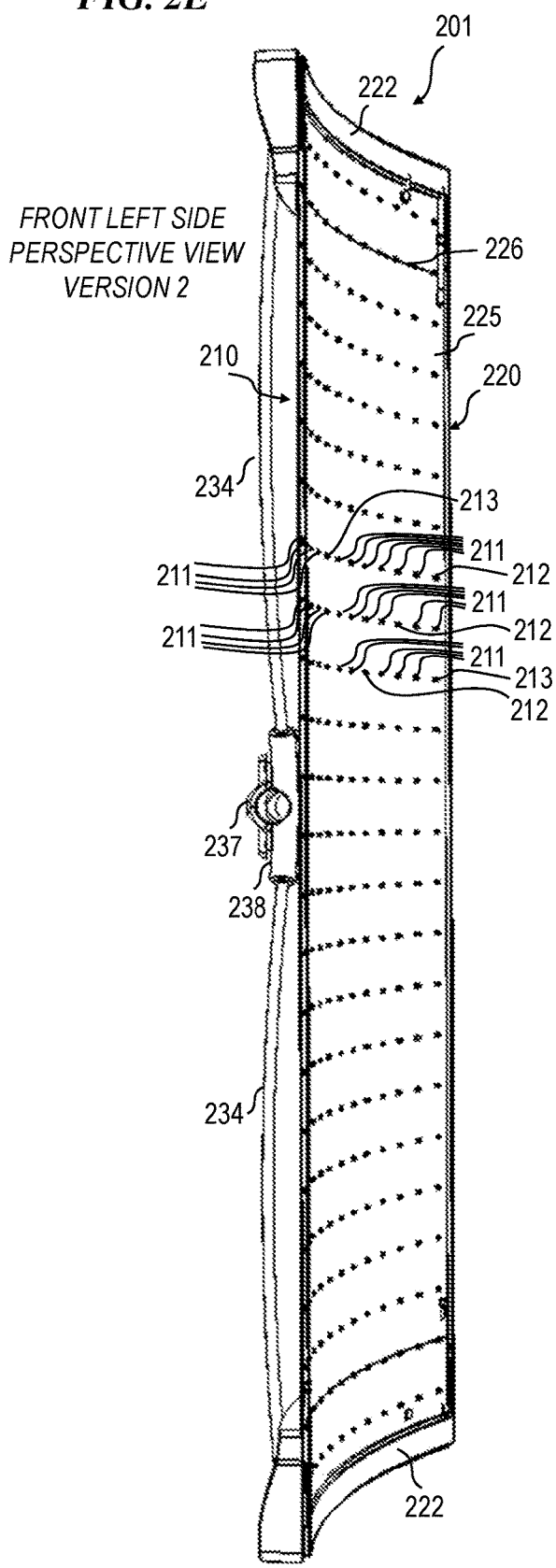

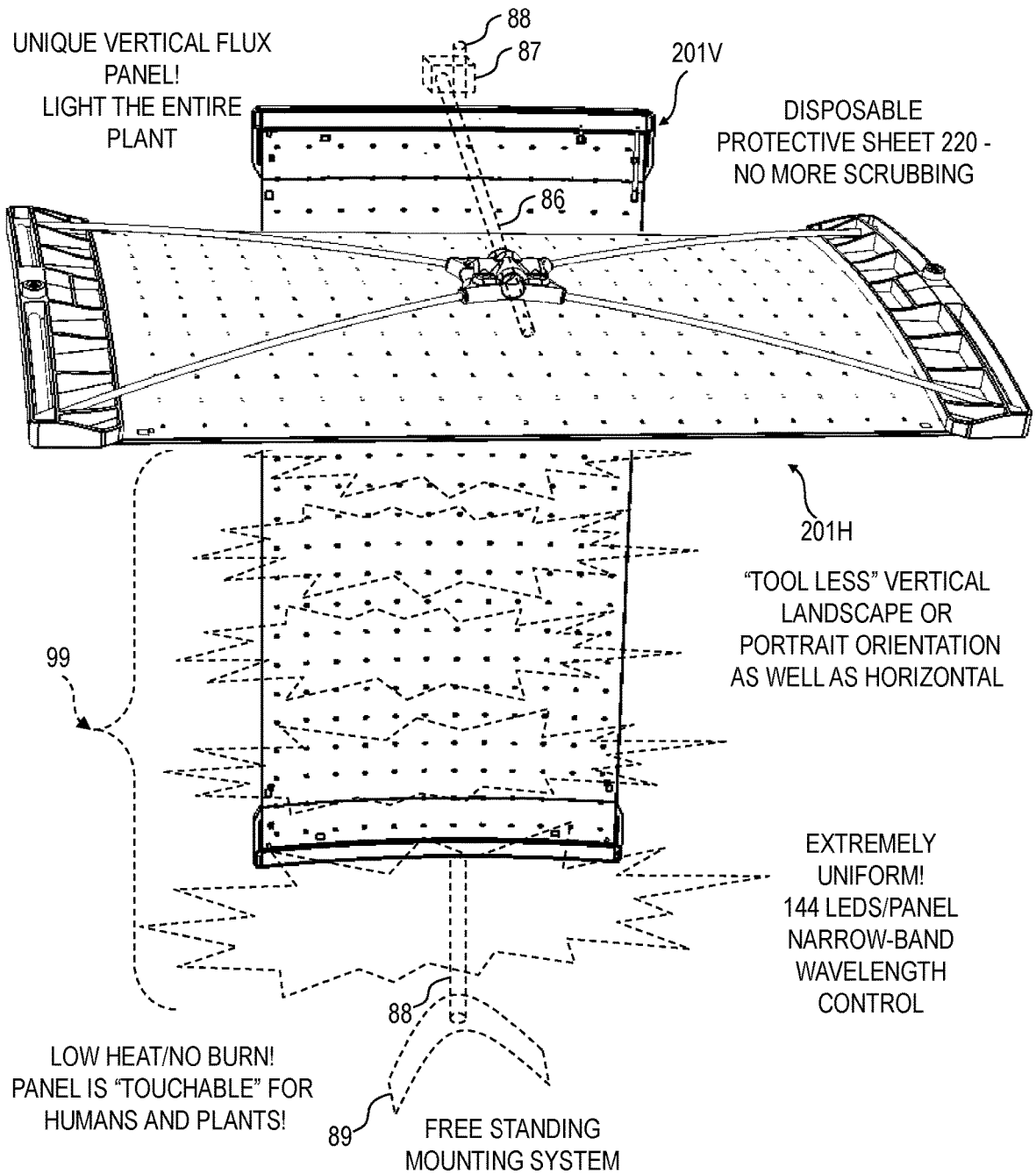

FIG. 4A
FIG. 4B
FIG. 4C
FIG. 4D
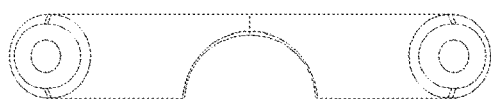
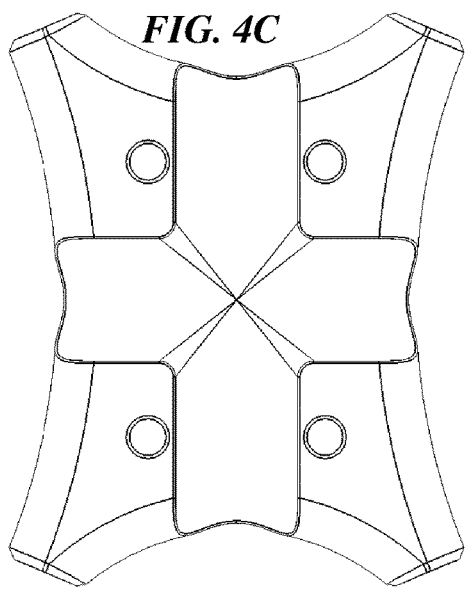
FIG. 4E
FIG. 4F
FIG. 4G
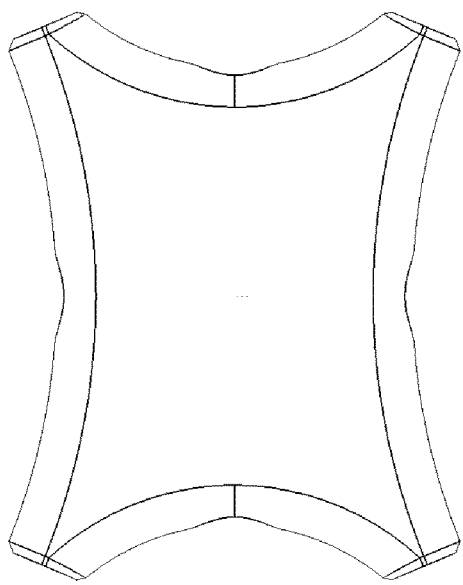
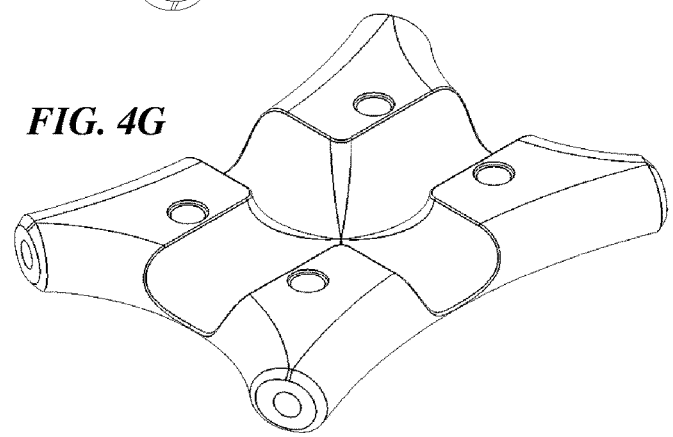
FIG. 4H
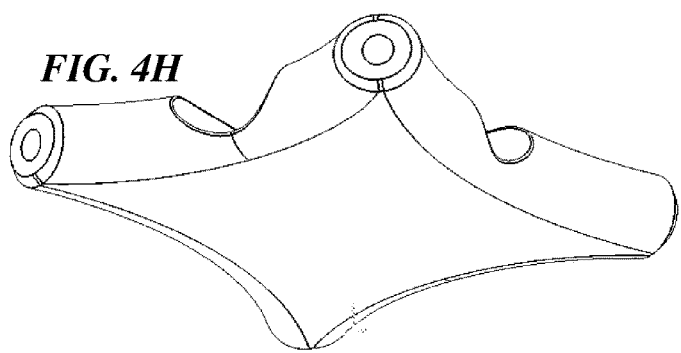

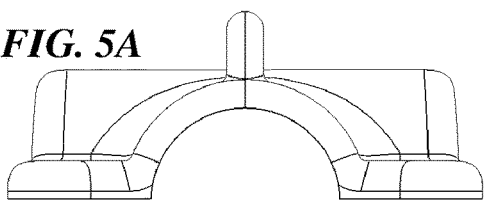
FIG. 5A
FIG. 5B  FIG. 5D
FIG. 5C
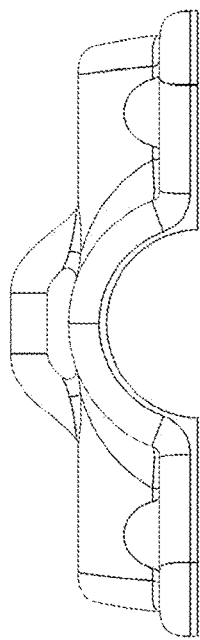
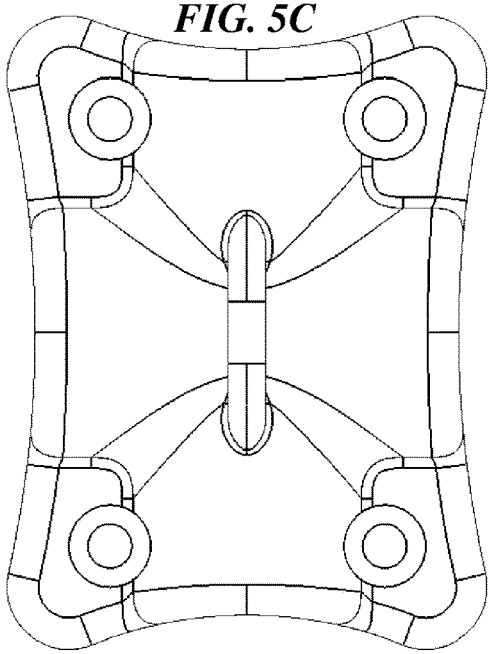
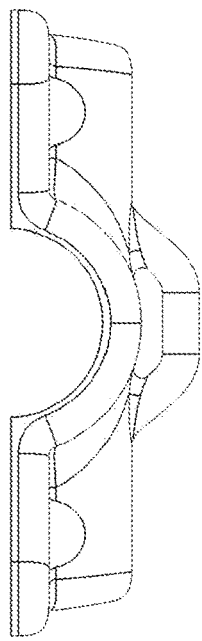
FIG. 5E
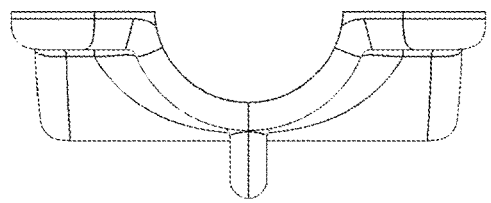
FIG. 5F
FIG. 5G
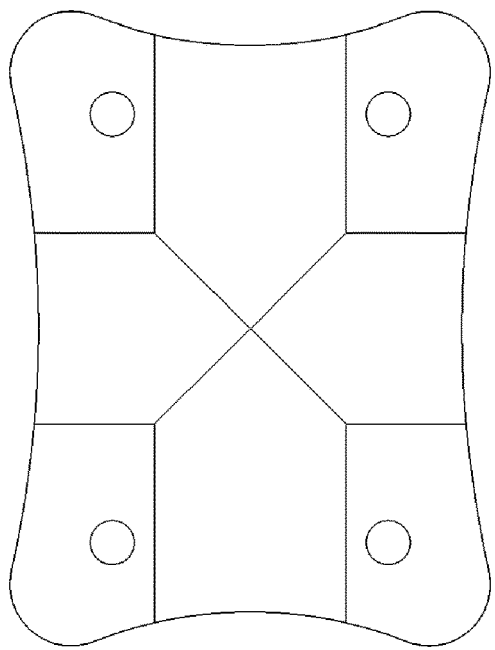
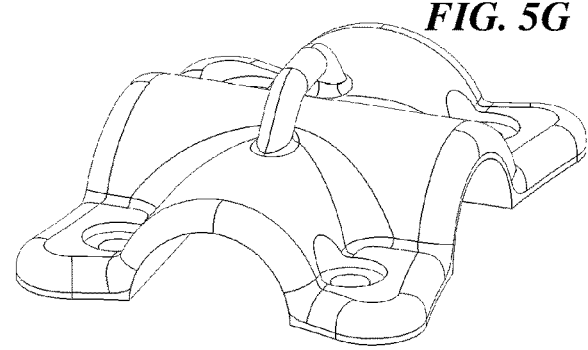
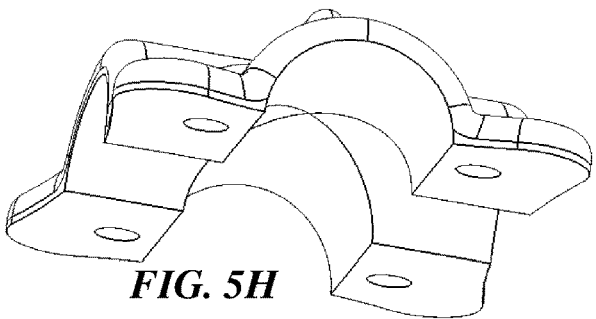
FIG. 5H

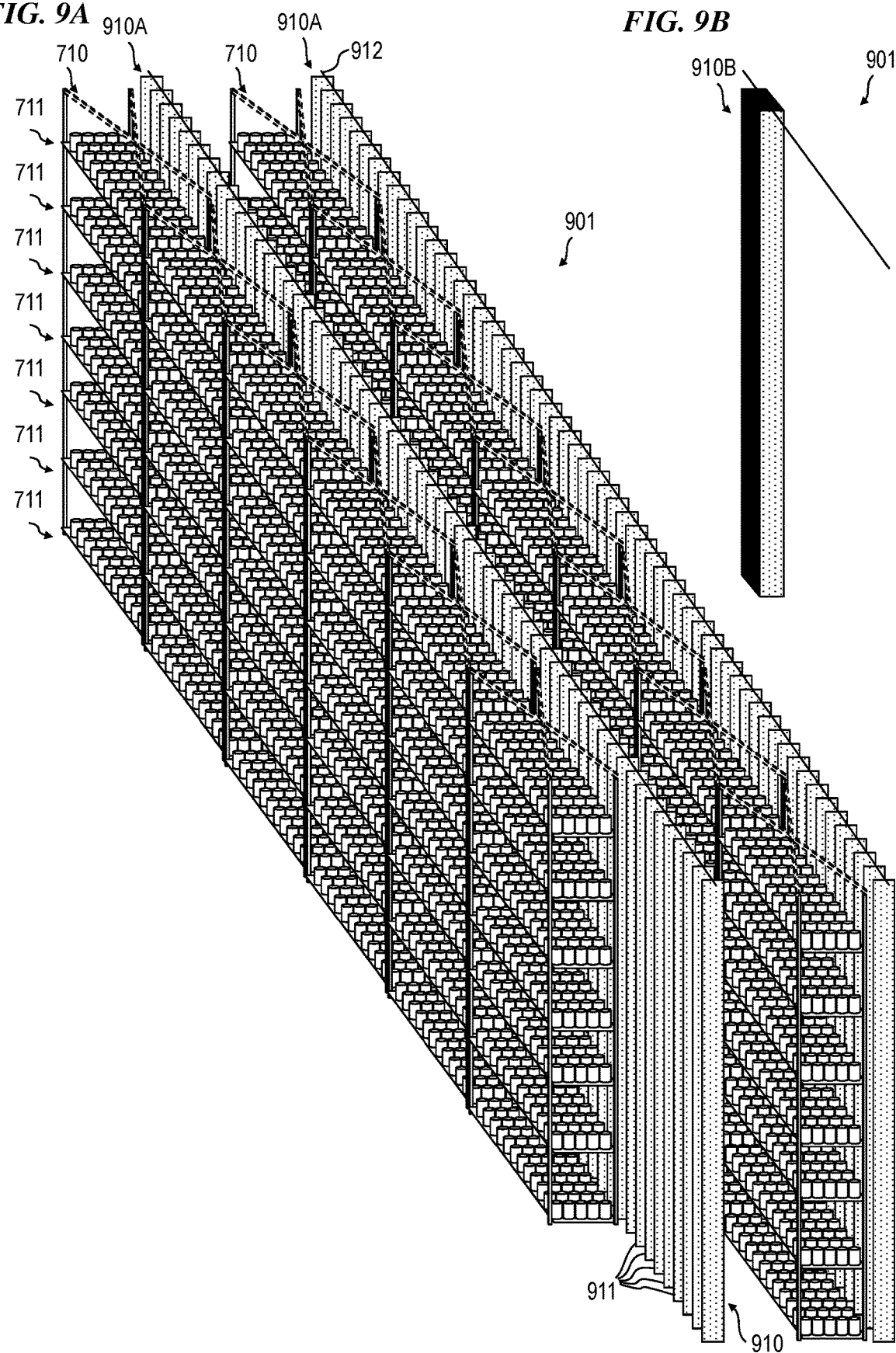

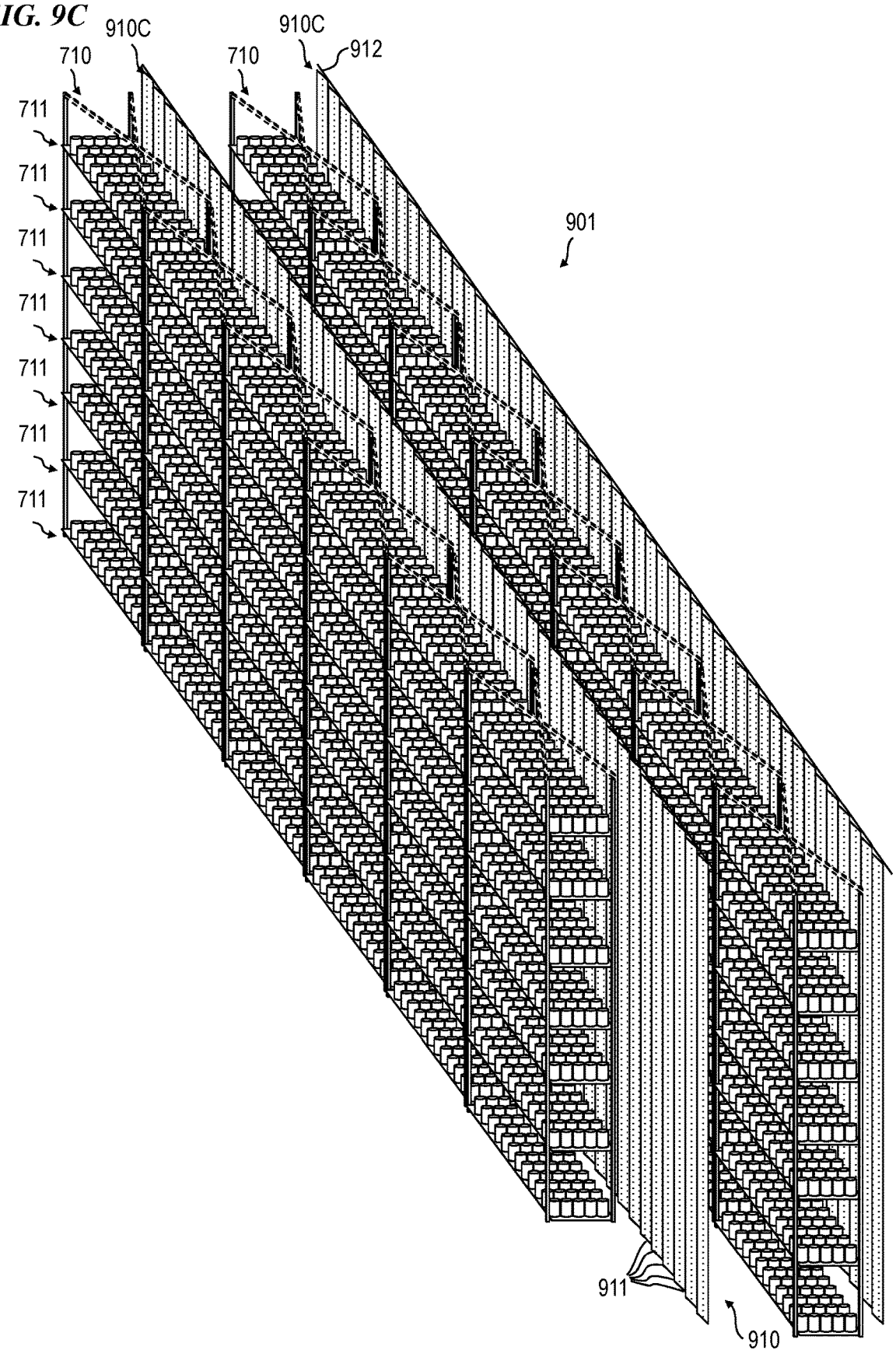

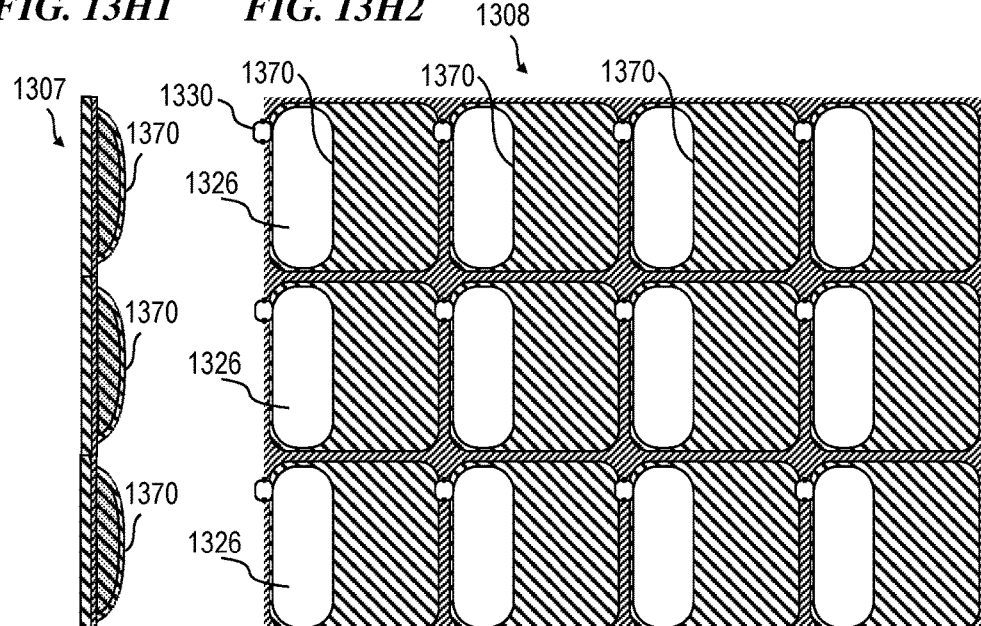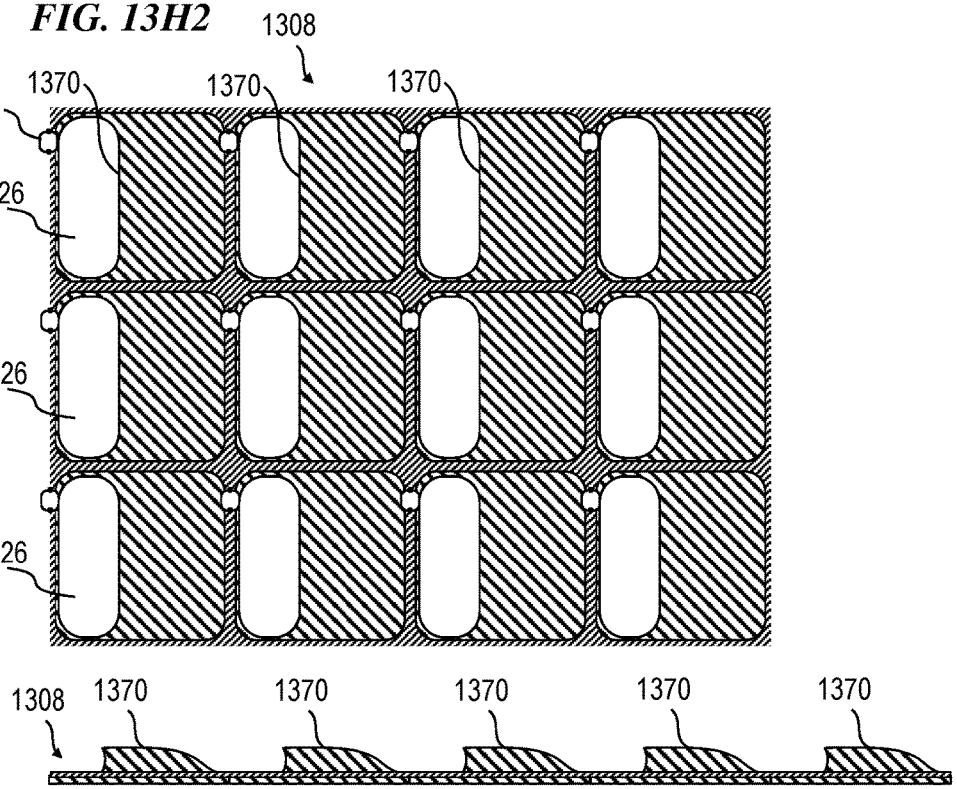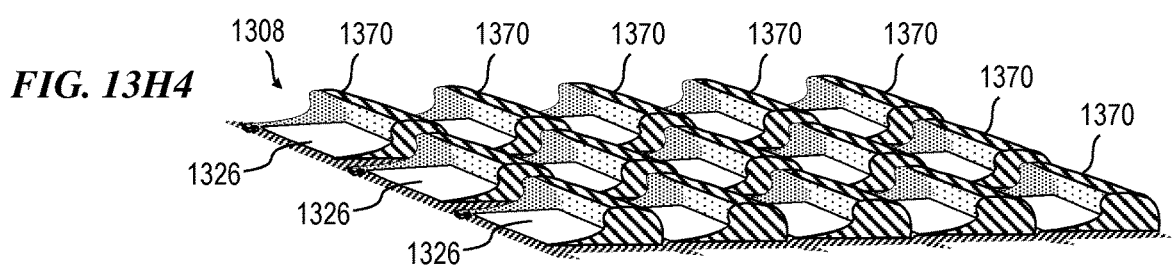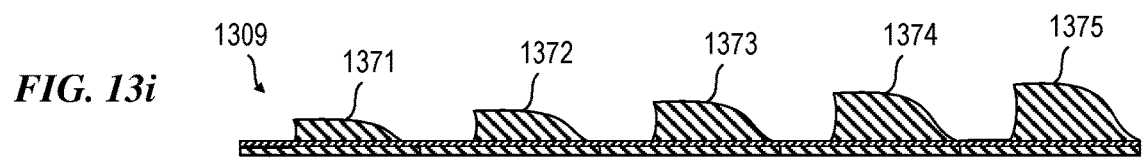

FIG. 14A
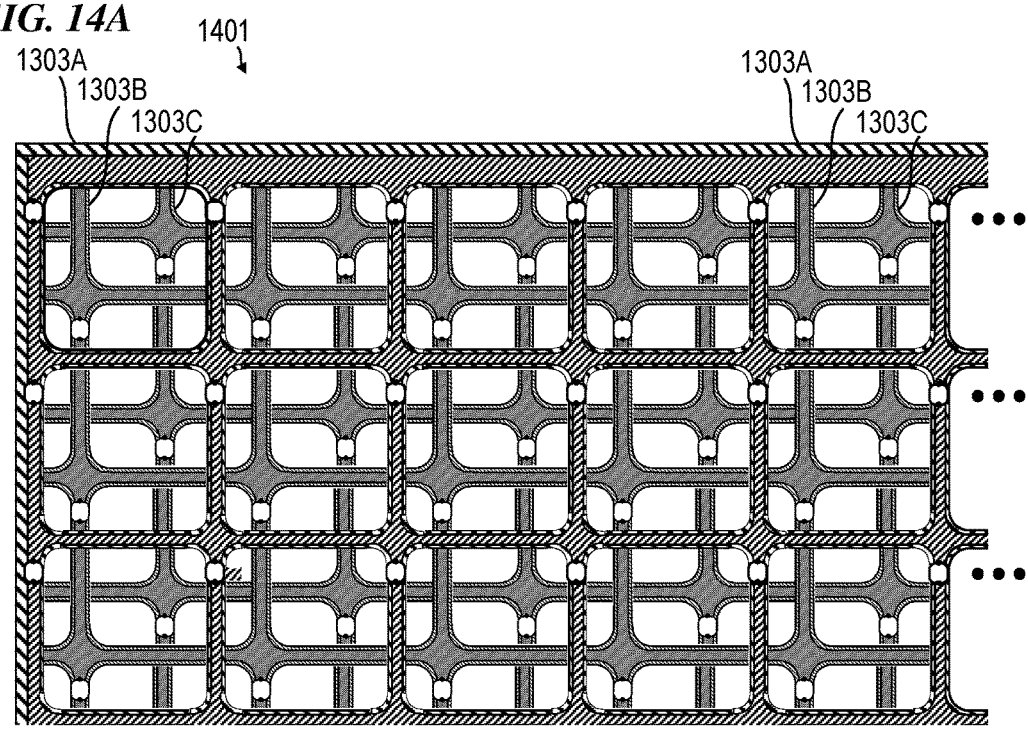
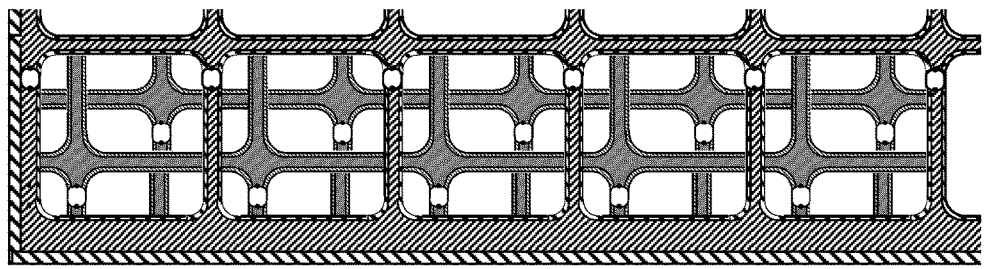
FIG. 14B
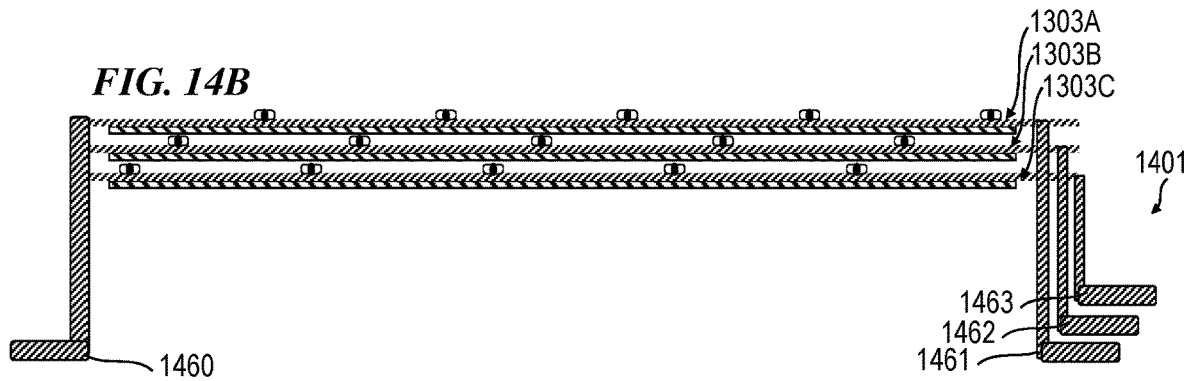

*FIG. 15A*
*FIG. 15B*
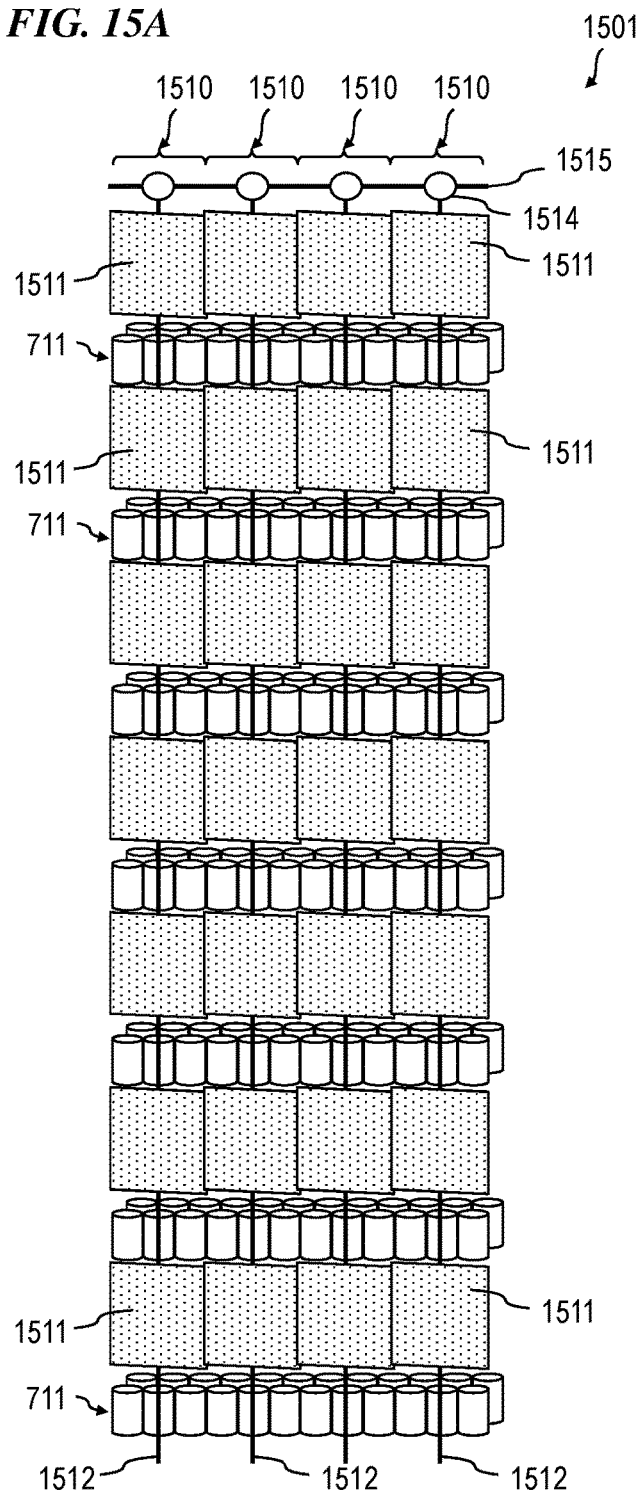
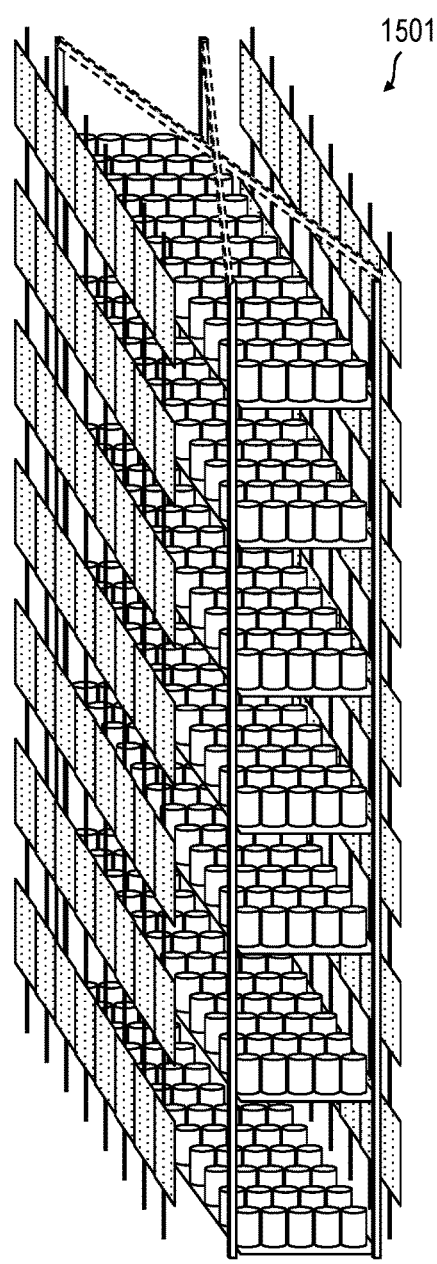

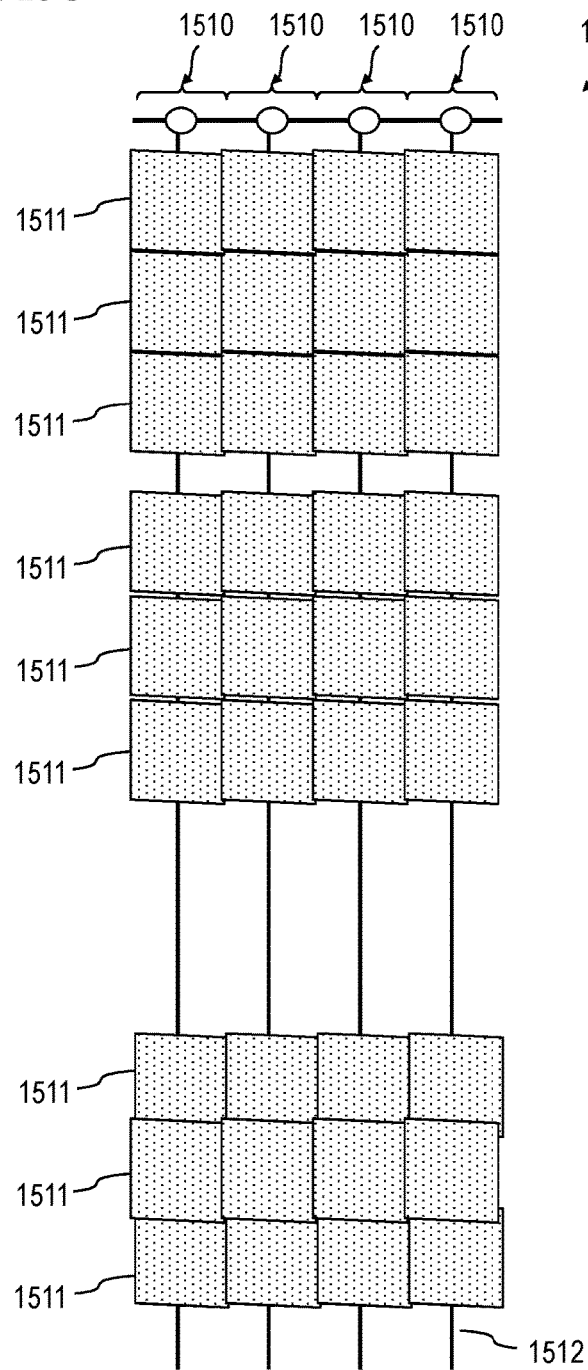
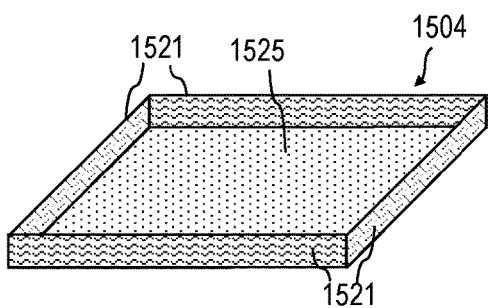
FIG. 15C
FIG. 15D

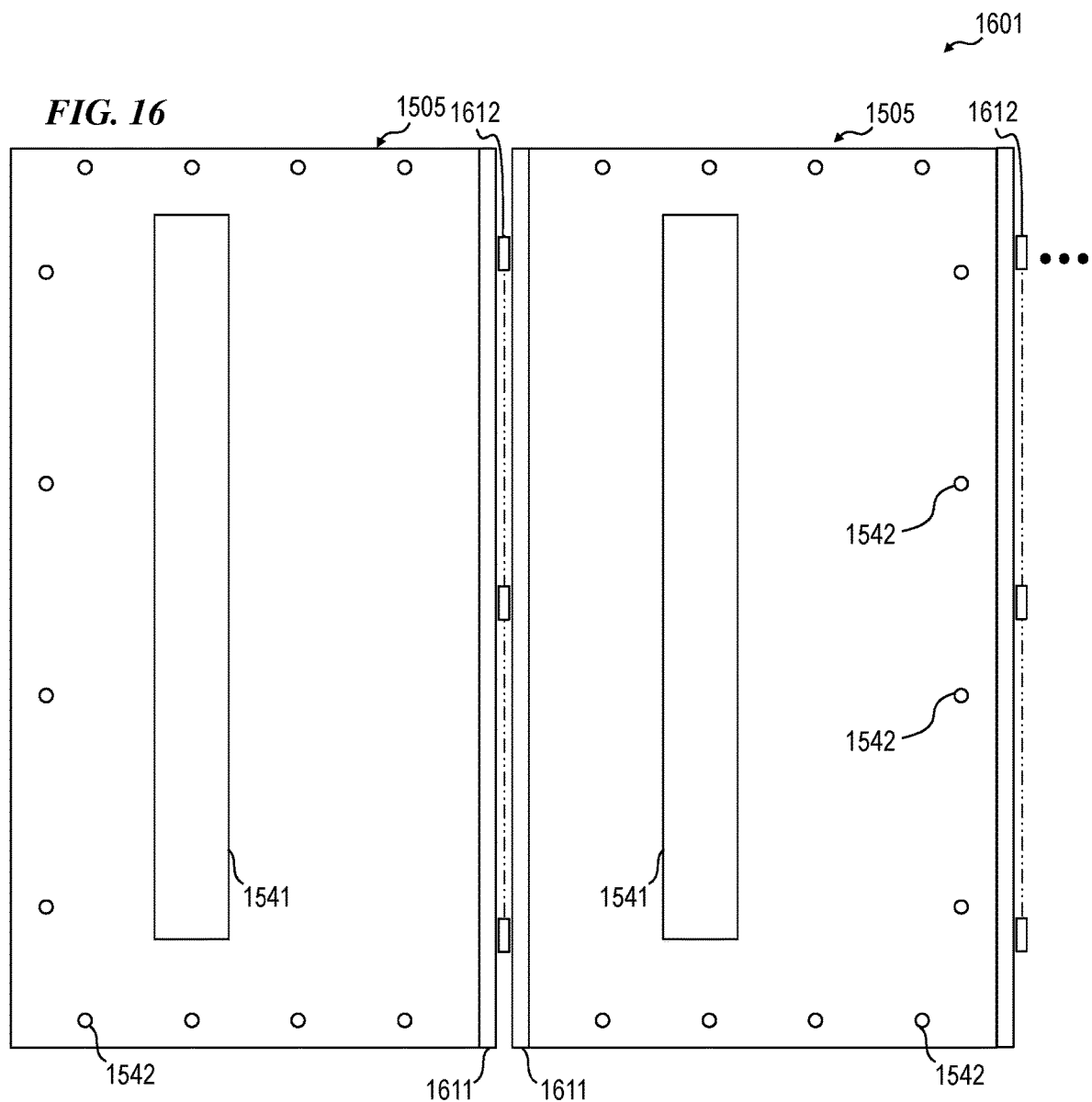

LIGHTING FIXTURE AND METHOD FOR MAKING AND USING

CROSS-REFERENCE TO RELATED APPLICATION

This United States patent application is a national-phase filing of, and claims priority benefit of, PCT Patent Application No. PCT/US2017/061416, filed Nov. 13, 2017 and titled "LIGHTING FIXTURE AND METHOD FOR MAKING AND USING," which is incorporated herein by reference in its entirety.

CROSS-REFERENCE TO RELATED APPLICATIONS

This application claims priority benefit, including under 35 U.S.C. § 119(e), of U.S. Provisional Patent Application No. 62/421,970 filed Nov. 14, 2016 by Michael C. Naylor et al., titled "Plant growth lighting system and method," U.S. Provisional Patent Application No. 62/486,444 filed Apr. 17, 2017 by John T. Golle et al., titled "Plant growth lighting system and method," U.S. Provisional Patent Application No. 62/574,172 filed Oct. 18, 2017 by John T. Golle et al., titled "Lighting fixture and method for making and using," U.S. Provisional Patent Application No. 62/574,193 filed Oct. 18, 2017 by John T. Golle et al., titled "Lighting fixture and method for making and using," U.S. Provisional Patent Application No. 62/574,194 filed Oct. 18, 2017 by John T. Golle et al., titled "Lighting fixture and method for making and using," and U.S. Provisional Patent Application No. 62/576,646 filed Oct. 24, 2017 by John T. Golle et al., titled "Lighting fixture and method for making and using," each of which is incorporated herein by reference in its entirety.

This invention is related to

U.S. Provisional Patent Application No. 61/894,495 filed Oct. 23, 2013 by Aaron J. Golle et al., titled "High powered LED light module with a balanced matrix circuit,"

P.C.T. Patent Application No. PCT/US2014/061594 filed Oct. 21, 2014 by Aaron J. Golle et al., titled "High powered LED light module with a balanced matrix circuit,"

U.S. patent application Ser. No. 15/031,564 filed Apr. 22, 2016 by Aaron J. Golle et al., titled "High powered LED light module with a balanced matrix circuit,"

U.S. Pat. No. 8,471,274 issued Jun. 25, 2013 to Aaron J. Golle, et al. with the title "LED light disposed on a flexible substrate and connected with a printed 3D conductor,"

which are all incorporated herein by reference in their entirety.

FIELD OF THE INVENTION

The present invention relates to devices and methods for lighting, and in particular to a lighting system and methods for making and using the lighting system for such applications as architectural lighting and agricultural lighting for enhanced growth of plants to improve time to harvest, plant size, and plant quality, and to obtain better taste, smell and/or potency of products from the plants, and in some embodiments, the present invention provides a perforated flexible plant-illumination sheet for use in controlled-environment agriculture.

BACKGROUND OF THE INVENTION

One problem with LED illumination of large areas with a large amount of light is to manage the heat from the LED devices, and in particular, to prevent the large temperature rise associated with locating a large number of LED devices in a small area, to efficiently power the devices from a low-cost power supply, and to provide a low-cost substrate on which to mount the LED devices.

Architectural lighting often needs different spectra of light and different amounts of light for different times of the day.

The conventional approach for home growers of plants is to select lighting depending on the types and quantity of plants they grow. As a general rule, inexpensive lights tend to be the most expensive to operate and least effective in promoting plant growth. Home growers typically choose fluorescent to grow herbs and to germinate flowering varieties. High-pressure sodium (HPS) lights or metal halide (MH) lights are often chosen for commercial-scale indoor growing of plants, but these high-wattage systems create excessive heat and consume excessive energy. All of these sources generate much heat and much of their light is in wavelengths that are not efficiently used by plants.

Some light-emitting-diode (LED) grow lights maximize blue and red light to provide a balance for plants, but high initial purchase cost has prohibited mass adoption for home growers. In addition, even conventional LED grow lights are driven with high current, often consuming 100 to 300 watts of electrical power, which leads to excess heat, forcing growers to keep the LEDs 18 to 30 or more inches away from the plants (which uses up valuable volumetric indoor space) and to use fans and air conditioning (involving further cost and volumetric space) in order to remove harmful excess heat.

U.S. Pat. No. 8,471,274 to Golle, et al. issued on Jun. 25, 2013 with the title "LED light disposed on a flexible substrate and connected with a printed 3D conductor," and is incorporated herein by reference. U.S. Pat. No. 8,471,274 describes a flexible planar substrate including a first surface that is planar, at least one bare light-emitting-diode ("LED") die coupled to the substrate and conductive ink electrically coupling the at least one bare LED die, wherein the conductive ink is disposed on the substrate and extends onto a surface of the LED that is out-of-plane from the first surface.

U.S. Pat. No. 7,607,815 to Pang issued on Oct. 27, 2009 with the title "Low profile and high efficiency lighting device for backlighting applications" and is incorporated herein by reference. U.S. Pat. No. 7,607,815 describes a light source having a flexible substrate and a plurality of dies having LEDs is disclosed. The light source can be conveniently utilized to provide an extended light source by bonding the light source to a suitable light pipe. The substrate is divided into first and second regions. The dies are bonded to the substrate in a first region. A portion of the surface of the substrate in the second region is reflective. The substrate is bent such that the second region forms a reflector that reflects light that would otherwise be emitted in a non-useful direction to a more useful direction. The substrate can be constructed from a three-layer flexible circuit carrier in which the dies are mounted on a bottom metal layer to provide an improved thermal path for heat generated in the dies.

U.S. Pat. No. 7,617,857 to Froese issued Nov. 17, 2009 with the title "Illuminated window blind assembly" and is incorporated herein by reference. U.S. Pat. No. 77,617,857 describes an illuminated blind assembly having either horizontally oriented slats or vertically oriented slats. The slats have structure that allows them to be illuminated. The slats can be A.C. or D.C. powered. The window blind assembly may have a housing containing rechargeable batteries. These batteries can be charged by photovoltaic solar cells that are positioned on the top surfaces of the slats. The window blind assembly can have a tilt/raise/lower pulley system structure and electrical servos in a housing extending across the top of the window blind assembly. An infrared remote sensor can be located in the front of the housing for controlling the electric servos and the switch for lighting up the slats.

U.S. Pat. No. 9,116,276 to Montfort et al. issued on Aug. 25, 2015 with the title "Room divider with illuminated light guide blind blade" and is incorporated herein by reference. U.S. Pat. No. 9,116,276 describes an apparatus that includes a first holder configured to hold a light source and having an interface for receiving power to feed to said light source, and a light guide plate configured to be coupled to said first holder and guide light emitted by the light source out from at least one surface of the light guide plate.

What is needed is a more efficient and effective lighting solutions that are useful for architectural lighting as well as for growing plants, particularly in large mass-production warehouse indoor growing facilities.

SUMMARY OF THE INVENTION

The present invention provides perforated flexible LED illumination sheets, each supporting an array of LEDs that are interconnected in parallel and in series. In some embodiments, the parallel-series interconnections connect rows of LEDs in parallel, wherein each LED in the row has substantially the same voltage drop and substantially the same current through the respective LED, and a plurality of such rows are connected in series from a common voltage supply conductor to a common ground conductor. In some embodiments, there are no required conductor crossings of the parallel-series interconnections, so a single single-layer conductor pattern is deposited on the substrate, reducing the cost of the substrate.

In some embodiments, the parallel-series interconnections are arranged in a rectangular grid (e.g., in some embodiments, a grid of squares), and in the center of each grid rectangle or square, the substrate is removed, leaving a rectangle or square opening, optionally having rounded corners to help prevent tearing that can otherwise occur if the corners were sharp.

In some embodiments, the perforated flexible LED illumination sheets of the present invention are used in controlled-environment agriculture (CEA) applications.

BRIEF DESCRIPTION OF THE FIGURES

FIG. 1A is a left-side exploded view schematic diagram of a plant light apparatus 101, according to some embodiments of the present invention.

FIG. 1B is a left-side view of assembled plant light apparatus 101, according to some embodiments of the present invention.

FIG. 1C is a top view of assembled plant light apparatus 101, according to some embodiments of the present invention.

FIG. 1D is a bottom view of assembled plant light apparatus 101, according to some embodiments of the present invention.

FIG. 1E is a back view of assembled plant light apparatus 101, according to some embodiments of the present invention.

FIG. 1F is a right-side view of assembled plant light apparatus 101, according to some embodiments of the present invention.

FIG. 1G is a front view of assembled plant light apparatus 101, according to some embodiments of the present invention.

FIG. 1H is a perspective view of assembled plant light apparatus 101, according to some embodiments of the present invention.

FIG. 2D is a back-left-side view of assembled plant light apparatus 201, according to some embodiments of the present invention.

FIG. 2E is a front-left-side view of assembled plant light apparatus 201, according to some embodiments of the present invention.

FIG. 2F is a perspective view with two assembled plant light devices 201 positioned at the top and side relative to plant 99, according to some embodiments of the present invention.

FIG. 4A is a top-end view of the design of pole-mount hub 238, according to some embodiments of the present invention.

FIG. 4B is a left-side view of the design of pole-mount hub 238, according to some embodiments of the present invention.

FIG. 4C is a back view of the design of pole-mount hub 238, according to some embodiments of the present invention.

FIG. 4D is a right-side view of the design of pole-mount hub 238, according to some embodiments of the present invention.

FIG. 4E is a bottom-end view of the design of pole-mount hub 238, according to some embodiments of the present invention.

FIG. 4F is a front view of the design of pole-mount hub 238, according to some embodiments of the present invention.

FIG. 4G is a back-perspective view of the design of pole-mount hub 238, according to some embodiments of the present invention.

FIG. 4H is a front perspective view of the design of pole-mount hub 238, according to some embodiments of the present invention.

FIG. 5A is a top-end view of the design of pole-mount hub clamp plate 237, according to some embodiments of the present invention.

FIG. 5B is a left-side view of the design of pole-mount hub clamp plate 237, according to some embodiments of the present invention.

FIG. 5C is a back view of the design of pole-mount hub clamp plate 237, according to some embodiments of the present invention.

FIG. 5D is a right-side view of the design of pole-mount hub clamp plate 237, according to some embodiments of the present invention.

FIG. 5E is a bottom-end view of the design of pole-mount hub clamp plate 237, according to some embodiments of the present invention.

FIG. 5F is a front view of the design of pole-mount hub clamp plate 237, according to some embodiments of the present invention.

FIG. 5G is a back-perspective view of the design of pole-mount hub clamp plate 237, according to some embodiments of the present invention.

FIG. 5H is a front perspective view of the design of pole-mount hub clamp plate 237, according to some embodiments of the present invention.

FIG. 9A is a perspective view of plant growing system 901, with a plurality of plant light systems 910 in a first mode 910A, according to some embodiments of the present invention.

FIG. 9B is a perspective view of plant growing system 901, with plant light systems 910 in a second mode 910B, according to some embodiments of the present invention.

FIG. 9C is a perspective view of plant growing system 901, with plant light systems 910 in a third deployed mode 910C, according to some embodiments of the present invention.

FIG. 13H1 is an end view of a portion of a perforated light-sheet 1308 with air scoops 1370, according to some embodiments of the present invention.

FIG. 13H2 is a plan view of a portion of perforated light-sheet 1308 with air scoops 1370, according to some embodiments of the present invention.

FIG. 13H3 is a side view of a portion of perforated light-sheet 1308 with air scoops 1370, according to some embodiments of the present invention.

FIG. 13H4 is a perspective view of a portion of perforated light-sheet 1308 with air scoops 1370, according to some embodiments of the present invention.

FIG. 13i is a side view of a portion of perforated light-sheet 1309 with air scoops 1371-1375 of varying heights, according to some embodiments of the present invention.

FIG. 14A is a plan view of a portion of a perforated light-sheet system 1401 with a plurality of layers of perforated light-sheet 1303, according to some embodiments of the present invention.

FIG. 14B is a cross-section view of a portion of perforated light-sheet system 1401, according to some embodiments of the present invention.

FIG. 15A is a side perspective view of a portion of a plant light system 1501, with a plurality of cartridges that are spaced apart on vertical rods for variable light-to-plant spacings and less wasted light adjacent to non-plant portions of plant shelves 711, according to some embodiments of the present invention.

FIG. 15B is a perspective view of a portion of a plant light system 1501, with a plurality of cartridges that are spaced apart on vertical rods for variable light-to-plant spacings and less wasted light adjacent to non-plant portions of plant shelves 711, according to some embodiments of the present invention.

FIG. 15C is a perspective view of a portion of a plant light system 1503, with a plurality of cartridges that are movable to different vertical locations and spacings on vertical rods, according to some embodiments of the present invention.

FIG. 15D is a perspective view of a plant light cartridge 1504, with a raised flange 1521 that spaces the LEDs of light sheet 1525 (which is implemented as light sheet 1301 of FIG. 13A, light sheet 1302 of FIG. 13B, light sheet 1303 of FIG. 13C, stacked light sheet system 1401 of FIG. 14A, or other light sheets as described and shown herein), according to some embodiments of the present invention.

FIG. 16 is a plan view of a hinged plant light cartridge system 1601, according to some embodiments of the present invention.

DETAILED DESCRIPTION OF THE INVENTION

Figure 2A:
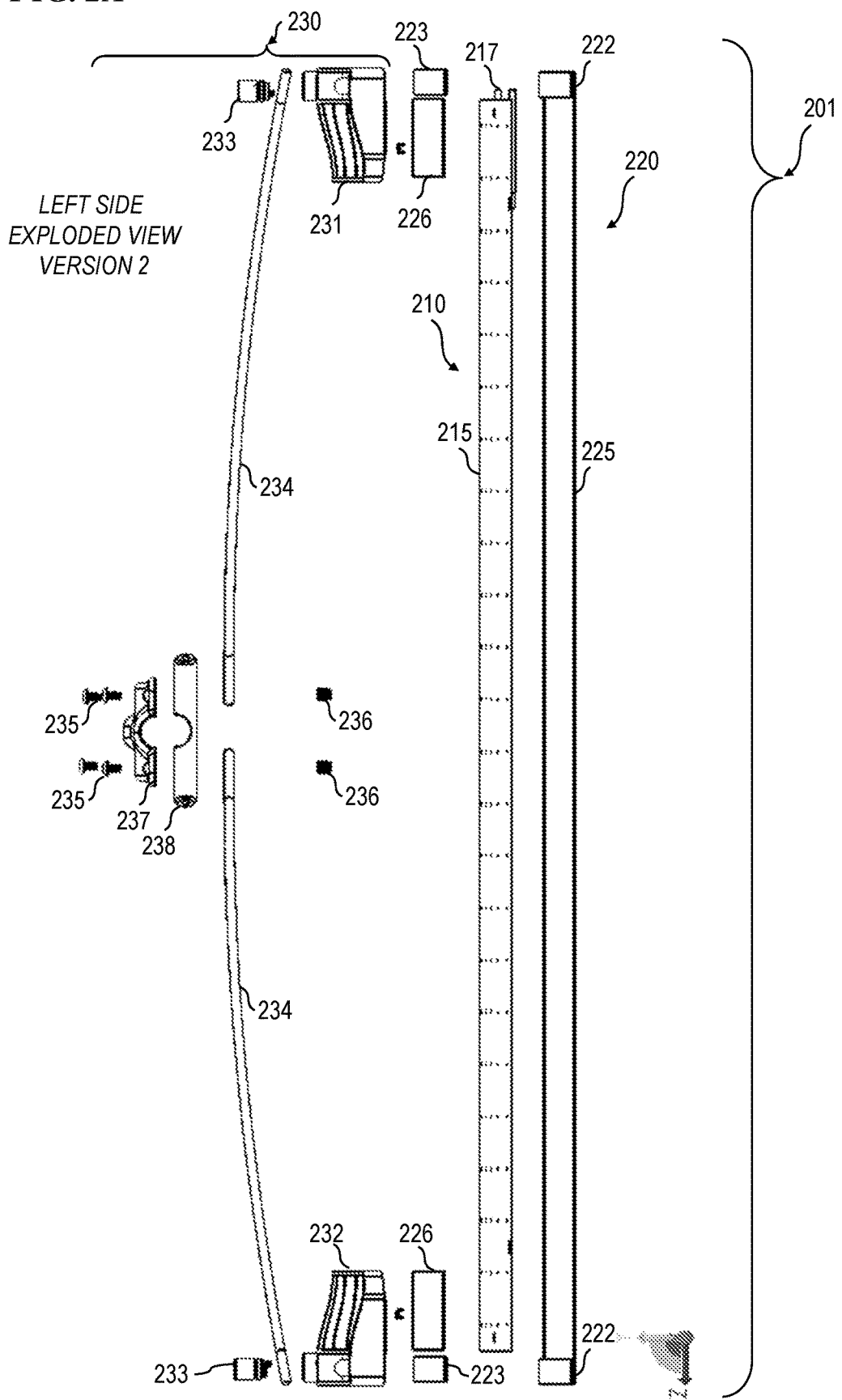
FIG. 2A is a left-side exploded view of a plant light apparatus 201, according to some embodiments of the present invention.

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and application publications incorporated by reference in the present application). Further, some embodiments include fewer than all the components described as part of any one of the embodiments described herein.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

In some embodiments, the present invention provides a 12" by 24" 2-mil polyethylene terephthalate (PET)/1-oz. copper flex circuit with 288 LEDs spaced uniformly at one-inch pitch in both the X and Y directions and operating at a power density of 48 W/ft$^2$ can have on the order of 60% (or more) of the substrate removed leaving the circuit containing LEDs intact. Higher power densities can be accommodated by increasing the copper thickness and, if needed, replacing the PET substrate with higher-temperature-capable substrates such as polyethylene naphthalate (PEN) or polyimide.

Various degrees of perforation can be achieved in a 12" by 24" circuit containing 288 LEDs as shown in Table 1 (see also sketches FIG. 13B and FIG. 13C):

TABLE 1

| Shape | Size | Number of holes | Total open area (in$^2$) | % Open area |
|---|---|---|---|---|
| Circle | 0.25" Dia. | Up to 230 | 11.3 | 3.9 |
| Circle | 0.5" Dia. | Up to 230 | 45.2 | 16 |
| Rectangle | 0.5625" × 0.75" | Up to 230 | 97 | 34 |

For a circuit of 144 LEDs, there could be up to quantity one-hundred ten (110) rectangular openings at 1.75"× 0.5625" and up to quantity ten (10) rectangular openings at 0.75"×0.5625" for a total open area of 112.5 in$^2$, or 39.1%.

In some embodiments, perforated GrowFilm™-brand flexible plant-illumination sheets are used to facilitate air flow, control temperature, and control $CO_2$ and humidity levels. Small perforations can be used with a plenum or perimeter dams (for gases or vapors with a density greater than that of air) to uniformly distribute gases of beneficial composition or water vapor for humidity adjustment.

It is understood that these concepts can be produced in various shapes and sizes and in a broad range of LED and power densities.

In some embodiments, perforated GrowFilm™-brand flexible plant-illumination sheets are used as tiled sheets, attached to carrier materials (either flexible or rigid), and incorporated into cartridges as described below.

Flexible Plant-Illumination-Sheet Cartridges

In some embodiments, perforated flexible LED plant-illumination sheets (such as GrowFilm™-brand perforated sheets) are incorporated into a cartridge format for use in both vertical and horizontal CEA growing configurations (see FIG. 15A, FIG. 15B, and FIG. 15C). Cartridges can be tiled together, either rigidly or hinged, to facilitate use. An example is a 4' by 8' horizontal assembly for use over a horizontal grow bed. Another example is an 8' wide by 28' tall vertical cartridge assembly. Cartridge assemblies can be mounted such that the assembly can be moved across vertical grow walls to provide two zones that can be exposed for equal periods of 12 hours or fractions thereof, or three zones of eight hours each. In similar fashion, cartridge assemblies can be moved to adjacent horizontal beds. In both cases, this reduces the number of cartridges needed to ½ or ⅓ of that which otherwise would be needed.

Power and time can be controlled to provide the optimum Daily Light Integral (DLI) and light/dark ratio for the plants being grown. In some embodiments, vertical heights are controlled to allow vertical growth zones. The distance from initial position can be changed to accommodate plant growth for both horizontal bed and vertical wall growth configurations. See also the novel track system of FIG. 12A and FIG. 12B described below.

In some embodiments, cartridge systems 1501 and 1503 include modular power and control connections between cartridges and cord management for power and control cords for moveable cartridge assemblies.

In some embodiments, cartridges 1511 are enclosed with a transparent and cleanable front surface to provide isolation from high voltage for personnel safety, mechanical and environmental protection of the GrowFilm™ light sheet, and cartridge wash-down capability.

In some embodiments, used with a front surface or without, a GrowFilm™ light sheet is optionally protected against water, corrosion, and chemicals with a conformal coating. Parylene, acrylic, polyurethane, and silicone are some of the materials that are used, in some embodiments. In some embodiments, spray, dip, and vacuum deposition are some of the methods for applying the coating. In some embodiments, it is important that the coating used does not adversely affect the performance (color, light output, etc.) of the LEDs. In some embodiments, without a surface in front of the LEDs, the cartridge optionally includes a circumferential and/or intermediate lip on the cartridge. The lip helps protect the LEDs. Further, the lip can be an advantage in a slide-in horizontal rack system so that the rack features do not contact the LEDs.

Figure 12A:
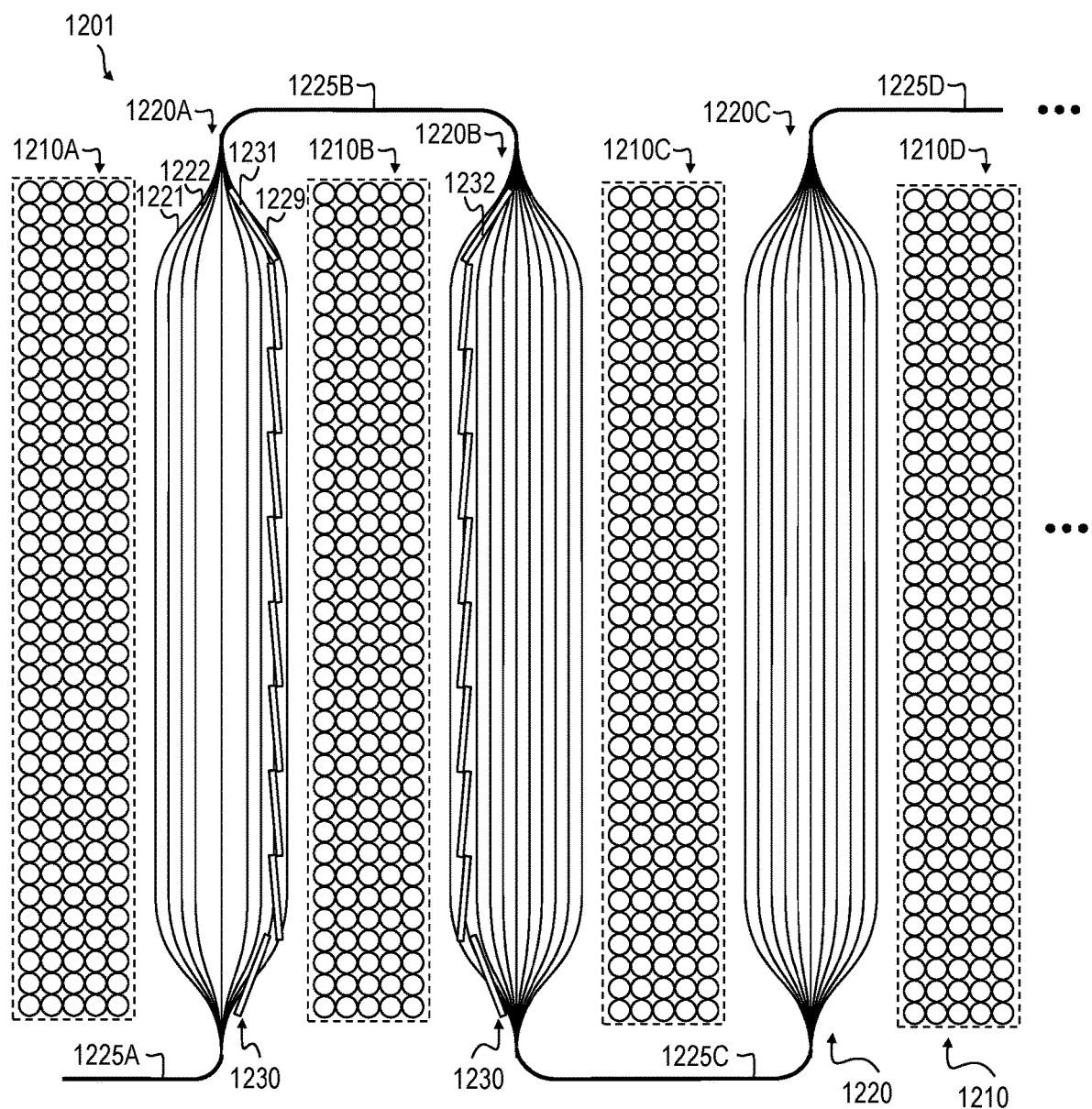
FIG. 12A is a top view of plant light system 1201, with a plurality of parallel tracks for variable light-to-plant spacings, according to some embodiments of the present invention.
Figure 12B:
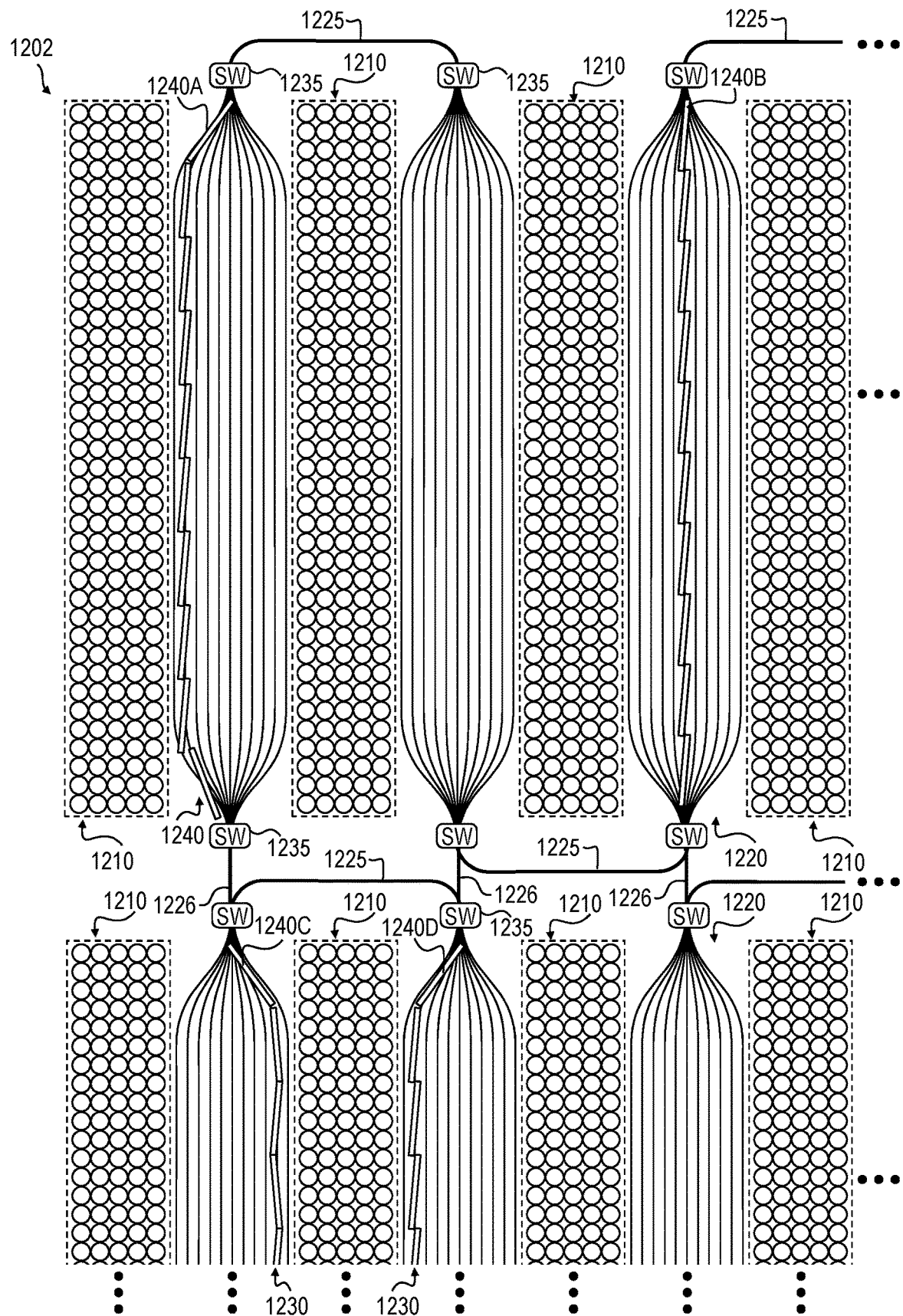
FIG. 12B is a top view of plant light system 1202, with a plurality of parallel tracks and motorized light sheets and switches for automated variable light-to-plant spacings, according to some embodiments of the present invention.

Novel Track System for Vertical-grow Lights that Accommodates Both Multiple Growth Zones and Adjustable Distance from Plants, to Compensate for Plant Growth See FIG. 12B. Multiple tracks and switches are provided. In some embodiments, light assemblies 1230 are moved to any of several zones to provide required DLI (Daily Light Integral) and light/dark ratio with fewer light assemblies than would be used with total coverage and turning lighting zones on and off.

In some embodiments, chained light assemblies 1230 (optionally including hinged cartridges) are moved between tracks 1221, 1222, . . . 1229 to maintain optimum plant-to-light distance as plants grow. In some embodiments, light-assembly movement and switching is automated, using electronically controlled motors and switches to move the chained light assemblies 1230 to the track location at the desired distance from a first set of plants, and then later move the chained light assemblies 1230 to the track location at the desired distance from a second set of plants.

In some embodiments, tracks and switches are at the top of a light assembly or, in other embodiments, at both the top and bottom. If desired, top-only tracks are stabilized at the bottom by, for example, ferromagnetic plates and magnets positioned on the light assemblies and floor as desired. In some embodiments, mechanical positioning features are also or alternatively employed. Please see the extended discussion below regarding FIGS. 11A-15D.

In some embodiments, the present invention provides a unique flexible printed circuit supporting a two-dimensional array of LEDs that, in some embodiments, is curved to allow growers to light their plants from above, from the side, and from below, resulting in up to a 40% increase in yield. In some embodiments, the LED light spectrum of the present invention is engineered to provide selected colors and intensities that optimize both yield and quality of all plant varieties—"one light source for all gardens, from tomatoes to cannabis." As a result, in some embodiments, the home grower no longer needs three (3) different lighting systems (fluorescent, HPS, and Metal Halide) to accommodate a varietal garden.

In some other embodiments, the LED light spectrum of the present invention is custom engineered for each one of a plurality of different plant varieties to optimize both yield and quality for each selected plant variety, and to shorten crop turnaround time. For example, different numbers of red LEDs, blue LEDs as well as optional ultraviolet (UV) and/or infrared (IR) are selected based on empirical tests as to how much of each color results in the optimal growth curve. In some such embodiments, a plurality of such sets of LEDs, each set producing light of a different spectrum, are provided, along with circuitry that activates each set or a subset of LEDs in each set based on which variety or type of plant is being grown. In some such embodiments, the circuit is configured to provide different spectra at different plant-growth phases (i.e., certain periods of time such as germination phase, growth phase, flowering phase and the like). In some such embodiments, the circuit is configured to provide light delivered from different directions during different periods of time such that the plant does not need to be rotated due to phototropism (where the plant grows in a particular direction or orientation in response to the direction of light).

In some embodiments, the present invention provides a lighting apparatus that includes a flexible circuit substrate having dimensions of at least 30 cm width and at least 30 cm length, the flexible circuit substrate having a first face and an opposite second face, and a first end and an opposite second end; a first plurality of LED dice affixed to a first face of the flexible circuit substrate, wherein each die of the first plurality of LED dice emits blue light having a peak wavelength in a range of 400 nm and 500 nm, inclusive, and a full-width half maximum bandwidth of no more than 50 nm; a second plurality of LED dice affixed to the first face of the flexible circuit substrate, wherein each die of the second plurality of LED dice emits red light having a peak wavelength in a range of 600 nm and 700 nm, inclusive, and a full-width half maximum bandwidth of no more than 50 nm; a third plurality of LED dice affixed to the first face of the flexible circuit substrate, wherein each die of the third plurality of LED dice emits infrared light having a peak wavelength in a range of 700 nm and 800 nm, inclusive, and a full-width half maximum bandwidth of no more than 50 nm; a first end cap affixed to the first end of the flexible circuit substrate; a second end cap affixed to the second end of the flexible circuit substrate, wherein the first and second end caps are configured to curve the first face of the flexible circuit substrate into a concave shape; and at least a first pole bracket, wherein the first pole bracket is connected to the first end cap, and wherein the first pole bracket is configured to attach to a first pole that supports the lighting apparatus. In some embodiments, ultraviolet LEDs are also included.

In some embodiments, rather than a flexible circuit, a rigid or semi-rigid light-sheet circuit substrate (e.g., in some embodiments, a circuit that is formable by the temporary application of heat to a temperature above the normal operating temperature) is used, wherein the rigid or semi-rigid circuit also provides a thin curved light source that has one or more end caps that provide support and a functionality of attachment to a vertical or horizontal (or other angle) pole.

In some embodiments, the thin curved LED circuit (whether using flexible circuitry or semi-rigid or rigid circuit boards) of the present invention requires no fans or heavy metal heat sinks, which significantly reduces the cost of the LED system of the present invention versus others on the market by up to 50%. In some embodiments, the flexible circuit of the present invention makes growing more productive, less expensive, and more fun. In some embodiments, the present invention provides higher yields and better quality, at a reasonable price. In some embodiments, the present invention is today's answer for tomorrow's harvest.

In some embodiments, the present invention helps feed a hungry planet by optimizing yields for indoor controlled environmental agriculture. In some embodiments, the flexible, low-heat lighting system of the present invention revolutionizes current growing practices. In some conventional systems, yields are limited due to the uneven distribution of vegetative flux. In some embodiments of the present invention, the vegetative flux is redistributed to the plant in a "surround light" distribution that optimizes photosynthesis and resulting yields. In some embodiments, the entire plant (top, middle, and bottom) is fed with a uniform/measured dose of vegetative flux that optimizes yield and quality.

In some embodiments, the present invention is thin and efficient. In some embodiments, the present invention requires no fan or bulky metal housing to dissipate heat. In some embodiments, the present invention is both minimalistic and functional.

In some conventional plant-growth systems, heat not only stimulates mold and fungus growth, but also consumes non-essential electricity due to additional cooling systems needed, contributing to the high cost of controlled environment agriculture (CEA). In some embodiments, in addition to higher yields, the low-heat delivery system of the present invention contributes to healthier growing environments. In some embodiments, the present invention benefits the grower by significantly increasing yields while reducing unwanted environmental bi-products that reduce plant quality.

In some embodiments, the spectral distribution of the present invention stimulates previously dormant photosynthetic triggers and increases the nutrient values of all plants grown with the present invention. In some embodiments, the present invention includes digital lighting controls to further enhance its benefits. In some embodiments, the present invention includes "tunable" spectrum management and variable intensity control from a remote "smart device" (phone/tablet). In some embodiments, the present invention will allow indoor growers (from hobbyist to professional greenhouse owners) to produce unprecedented yields and profits.

In general, home growers are not optimizing plant yields when using conventional indoor lighting systems because all conventional lighting (including sunlight) produces vegetative light flux delivered exclusively or mostly from an above-the-plant direction, or from only a particular angle from vertical from vertical, which produces a "canopy" lighting effect. "Canopy" photosynthesis occurs primarily due to absorption of much of the vegetative light flux at the top (canopy) layer of the plant, resulting in insufficient stimulation of the plant's receptors below the canopy and under the leaf due to the shading and blocking of light by the top layer of vegetation. Consequently, plant growth is less than optimum, and the ensuing long crop-turnaround times negatively impact production and profits of growers.

In some embodiments, the present invention provides a flexible substrate having a plurality of LEDs affixed thereto, such as described in U.S. Pat. No. 8,471,274 to Aaron J. Golle, et al., which is incorporated herein by reference. In some embodiments, the color spectra emitted by a plurality of LEDs are selected to optimize one or more aspects of plant growth. In some embodiments, a large number of LEDs (e.g., in some embodiments, two sets of 144 LEDs per set) are provided, while in other embodiments, some other suitable number of LEDs such as one or more sets, each set having 64, 100, 121, 144, 169, 196, 225 or some other suitable number of LEDs are used), wherein the LEDs are driven with a relatively low amount of electrical current in order to minimize excess heat.

FIG. 1A is a left-side exploded view schematic diagram of a plant light apparatus 101, according to some embodiments of the present invention. In some embodiments, plant light apparatus 101 includes a flexible circuit substrate 110 having a plurality of LEDs mounted on a front surface of the substrate 110, wherein substrate 110 is attached at its first end to a first endcap 131 and is attached at its second end to a second endcap 132. In some embodiments, the first and second endcaps 131 and 132 are attached to a pole-mount hub 137 by four flexible rods 134 (e.g., in some embodiments, poles 134 are fiberglass-reinforced epoxy rods that are inserted into receptacle holes in pole-mount hub 137 at one end of each rod and into receptacle holes in endcaps 131 or 132 at the opposite ends of each rod). In some embodiments, pole-mount hub 137 includes holes that allow attaching pole-mount hub 137 in a plurality of orientations to, for example, a pole 88 that extends from a base stand 89. In some embodiments, plant light apparatus 101 can thus be mounted to a vertical pole in a portrait orientation (with the longer dimension of the front face vertically oriented and the shorter dimension of the front face horizontally oriented) or a landscape orientation (with the shorter dimension of the front face vertically oriented and the longer dimension of the front face horizontally oriented), or can be mounted to a horizontal pole in a top-down-light orientation (with the both the longer and shorter dimension of the front face horizontally oriented). In some embodiments, first and second endcaps 131 and 132 are curved to impart a curved (e.g., concave semi-cylindrical light-emitting surface) front face. In some embodiments, the concave light-emitting face helps point more of the light from the LEDs toward the light-receiving leaves of the plant.

The parts and reference numbers from the description of FIG. 1A apply to FIG. 1B, FIG. 1C, FIG. 1D, FIG. 1E, FIG. 1F, FIG. 1G and FIG. 1H.

FIG. 1B is a left-side view of assembled plant light apparatus 101, according to some embodiments of the present invention.

FIG. 1C is a top view of assembled plant light apparatus 101, according to some embodiments of the present invention.

FIG. 1D is a bottom view of assembled plant light apparatus 101, according to some embodiments of the present invention.

FIG. 1E is a back view of assembled plant light apparatus 101, according to some embodiments of the present invention.

FIG. 1F is a right-side view of assembled plant light apparatus 101, according to some embodiments of the present invention.

FIG. 1G is a front view of assembled plant light apparatus 101, according to some embodiments of the present invention. Note the plurality of LEDs 111 on the front concave light-emitting surface of flexible substrate 110.

FIG. 1H is a back-side perspective view of assembled plant light apparatus 101, according to some embodiments of the present invention.

FIG. 2A is a left-side exploded view of a plant light apparatus 201, according to some embodiments of the present invention. In some embodiments, plant light apparatus 201 includes a flexible LED circuit sheet 210 having a plurality of LEDs mounted on a front surface of the substrate 215, wherein flexible LED sheet 210 is attached at its first end using adhesive tape 226 (e.g., in some embodiments, a pressure-sensitive double-sided adhesive product) to a first endcap 231 and is attached at its second end, also using adhesive tape 226, to a second endcap 232. In some embodiments, flexible magnetic strips 223 are adhesively attached to the front faces of endcaps 231 and 232, and are used to stick to adhesive strips 222 located at opposite ends of transparent sheet 225 that form protective transparent cover 220. In some embodiments, protective transparent cover 220 is removable for cleaning and then replaceable, and/or is disposable to be replaced by a new cover 220, thus eliminating the need to carefully clean or scrub the LED dice on the front face of flexible LED sheet 210. In some embodiments, transparent sheet 225 can be replaced while reusing the magnetic strips 222. In some embodiments, the first and second endcaps 231 and 232 are attached to a pole-mount hub 238 by four flexible rods 234 (e.g., in some embodiments, poles 234 are flexible fiberglass-reinforced epoxy rods that are inserted into receptacle holes in pole-mount hub 237 at one end of each rod and into receptacle holes in endcaps 231 or 232 at the opposite ends of each rod). In some embodiments, pole-mount hub clamping plate 238 is bolted to pole-mount hub 237 in order to form holes that allow attaching pole-mount hub 237 and clamping plate 238 in different ones of a plurality of orientations to, for example, a pole 88 (as shown in FIG. 1H) that extends from a base stand 89. In some embodiments, plant light apparatus 201 can thus be mounted to a vertical pole in a portrait orientation (with the longer dimension of the front face vertically oriented and the shorter dimension of the front face horizontally oriented) or a landscape orientation (with the shorter dimension of the front face vertically oriented and the longer dimension of the front face horizontally oriented), or can be mounted to a horizontal pole in a top-down-light orientation (with the both the longer and shorter dimension of the front face horizontally oriented). In some embodiments, first and second endcaps 231 and 232 are curved to impart a concave curved front face (e.g., concave semi-cylindrical light-emitting surface). In some embodiments, the concave light-emitting face helps point more of the light from the LEDs toward the light-receiving leaves of the plant that is possible if the LED circuit sheet 210 were flat in a single plane. In some embodiments, a cylindrical electrical-cord "barrel" receptacle 233 is provided and is used to connect an electrical power cord at one or both endcaps, wherein the electrical power cord connects to electrical contacts 217 on flexible LED circuit sheet 210.

The parts and reference numbers from the description of FIG. 2A apply to FIG. 2B, FIG. 2C, FIG. 2D, FIG. 2E, FIG. 2F, FIG. 2G and FIG. 2H.

Figure 2B:
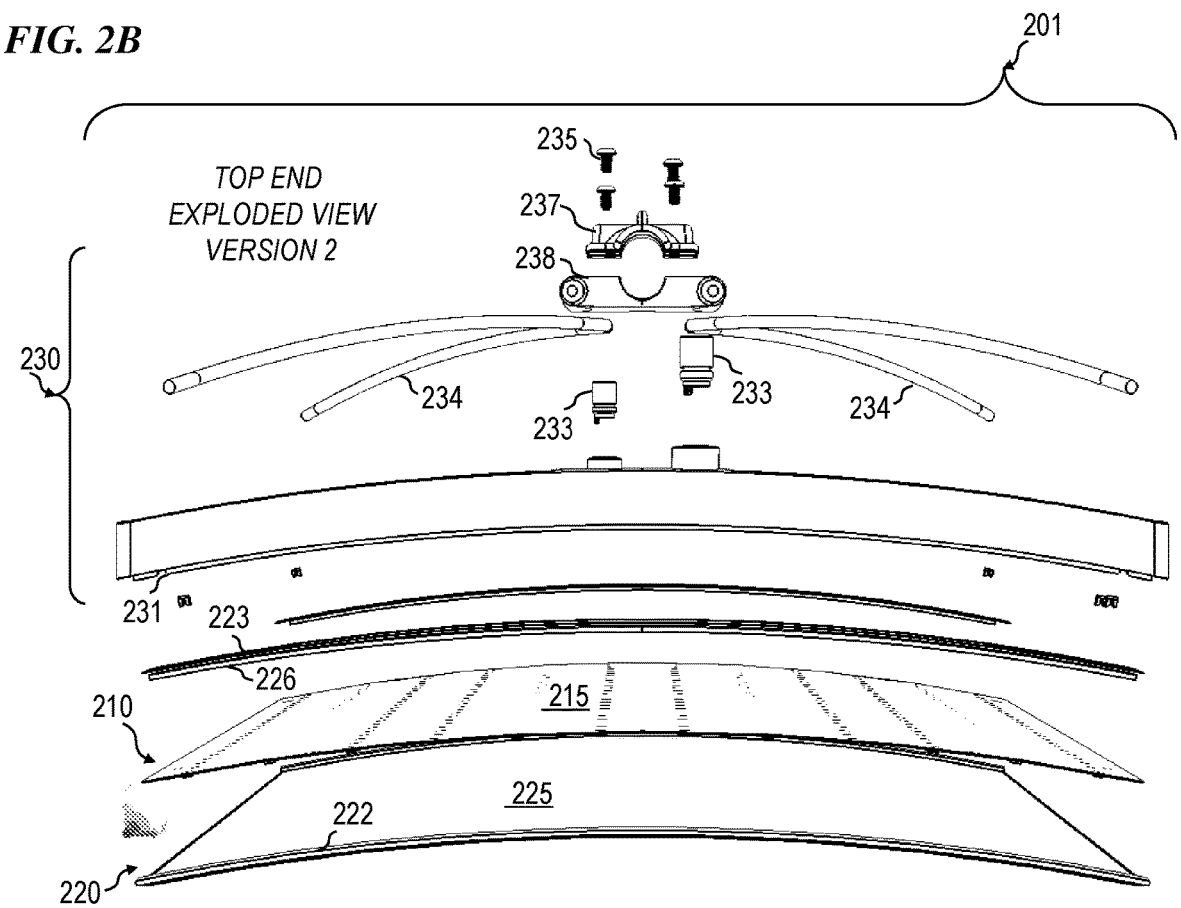
FIG. 2B is a top-end exploded view of plant light apparatus 201, according to some embodiments of the present invention.

FIG. 2B is a top-end exploded view of plant light apparatus 201, according to some embodiments of the present invention.

Figure 2C:
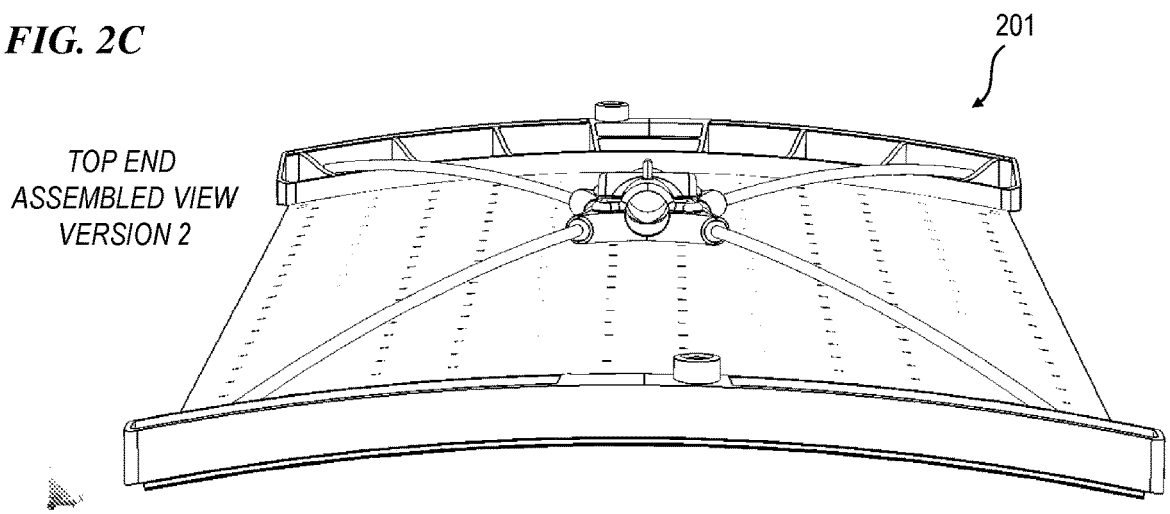
FIG. 2C is a top-end view of assembled plant light apparatus 201, according to some embodiments of the present invention.

FIG. 2C is a top-end view of assembled plant light apparatus 201, according to some embodiments of the present invention.

FIG. 2D is a back-left-side view of assembled plant light apparatus 201, according to some embodiments of the present invention.

FIG. 2E is a front-left-side view of assembled plant light apparatus 201, according to some embodiments of the present invention.

FIG. 2F is a perspective view with two assembled plant light devices 201 positioned at the top and side relative to plant 99, according to some embodiments of the present invention. In this FIG. 2F, a plant 99 (such as a Cannabis spp., or other botanical plant) is schematically shown to illustrate the feature that a vertical apparatus 201V in a portrait orientation provides light from the side and bottom of leaves, as well as from the top, thus providing faster growth than if light is provided only from the top-down direction such as would be the case if only the horizontal apparatus 201H were provided, since, in that case, the upper canopy leaves of plant 99 will shade the lower leaves. By using light from both apparatus 201H and 201V, more of the plant's leaf surfaces receive light and a faster, more optimal growth rate can be achieved.

Figure 3A:
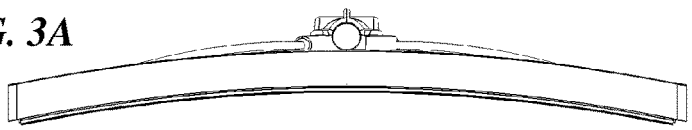
FIG. 3A is a top-end view of the design of plant light apparatus 201, according to some embodiments of the present invention.

FIG. 3A is a top-end view of the design of plant light apparatus 201, according to some embodiments of the present invention.

Figure 3B:
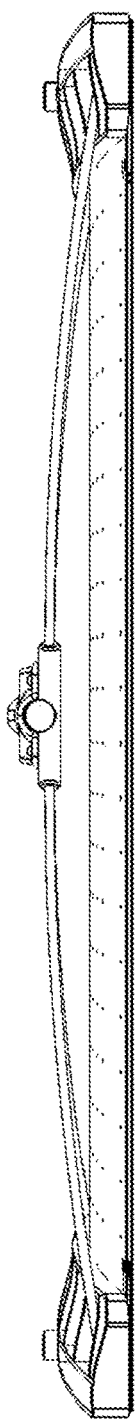
FIG. 3B is a left-side view of the design of plant light apparatus 201, according to some embodiments of the present invention.

FIG. 3B is a left-side view of the design of plant light apparatus 201, according to some embodiments of the present invention.

Figure 3C:
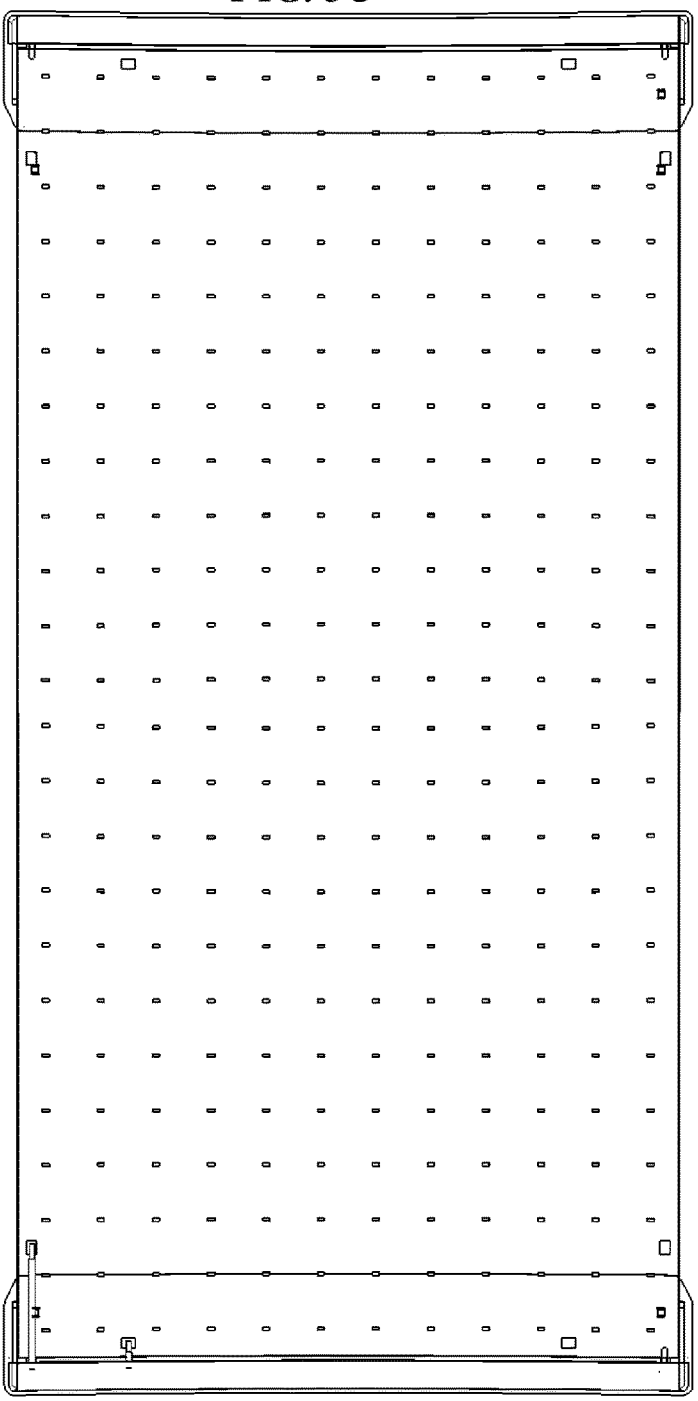
FIG. 3C is a front view of the design of plant light apparatus 201, according to some embodiments of the present invention.

FIG. 3C is a front view of the design of plant light apparatus 201, according to some embodiments of the present invention.

Figure 3D:
FIG. 3D is a right-side view of the design of plant light apparatus 201, according to some embodiments of the present invention.

FIG. 3D is a right-side view of the design of plant light apparatus 201, according to some embodiments of the present invention.

Figure 3E:
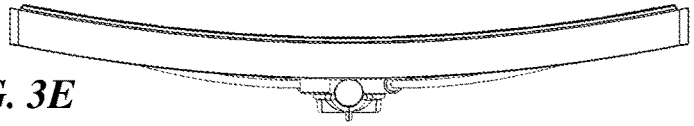
FIG. 3E is a bottom-end view of the design of plant light apparatus 201, according to some embodiments of the present invention.

FIG. 3E is a bottom-end view of the design of plant light apparatus 201, according to some embodiments of the present invention.

Figure 3F:
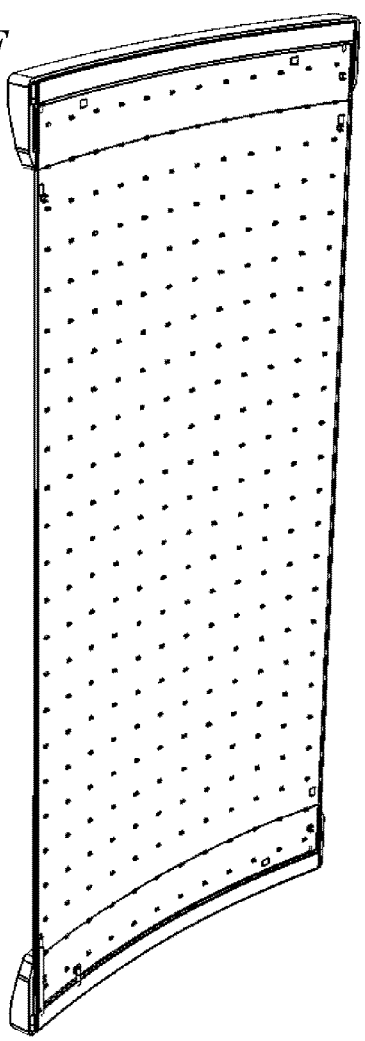
FIG. 3F is a front perspective view of the design of plant light apparatus 201, according to some embodiments of the present invention.

FIG. 3F is a front perspective view of the design of plant light apparatus 201, according to some embodiments of the present invention.

Figure 3G:
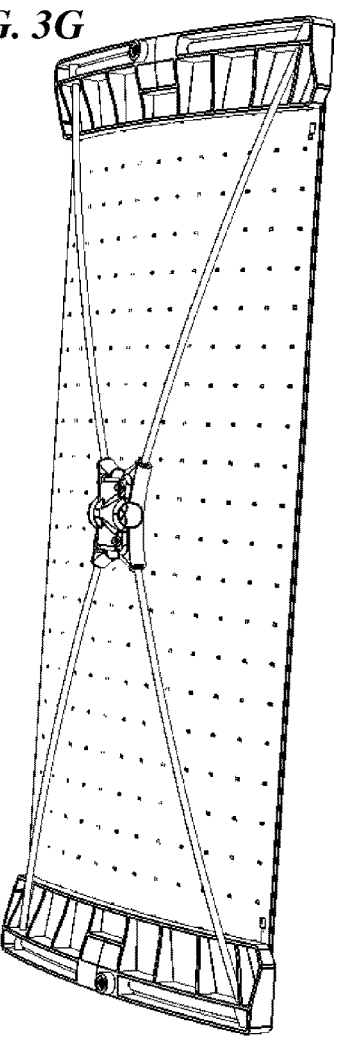
FIG. 3G is a back-perspective view of the design of plant light apparatus 201, according to some embodiments of the present invention.

FIG. 3G is a back-perspective view of the design of plant light apparatus 201, according to some embodiments of the present invention.

Figure 3H:
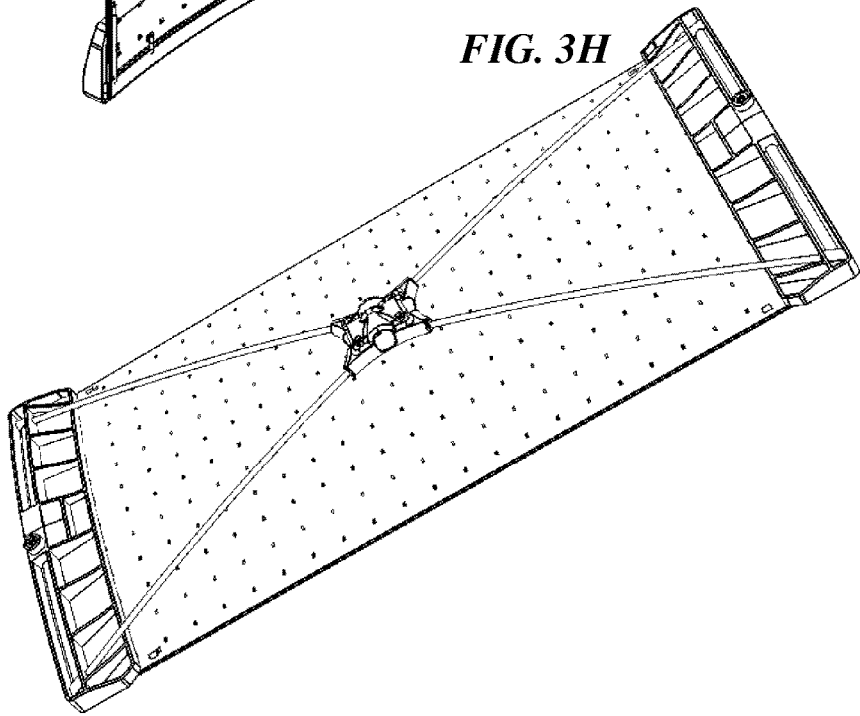
FIG. 3H is another back-perspective view of the design of plant light apparatus 201, according to some embodiments of the present invention.

FIG. 3H is another back-perspective view of the design of plant light apparatus 201, according to some embodiments of the present invention.

Figure 3I:
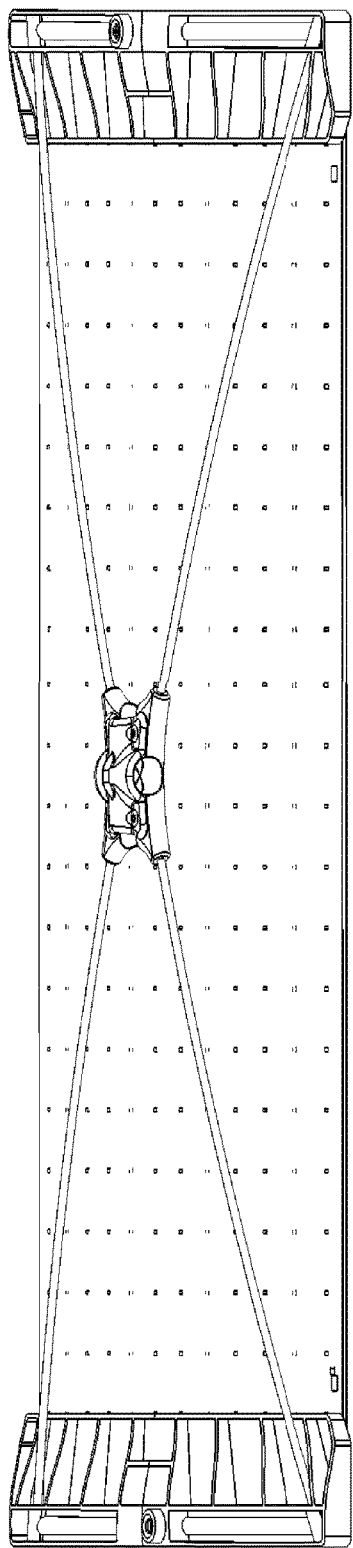
FIG. 3I is left-back-side isometric view of the design of plant light apparatus 201, according to some embodiments of the present invention.

FIG. 3I is left-back-side isometric view of the design of plant light apparatus 201, according to some embodiments of the present invention.

Figure 3J:
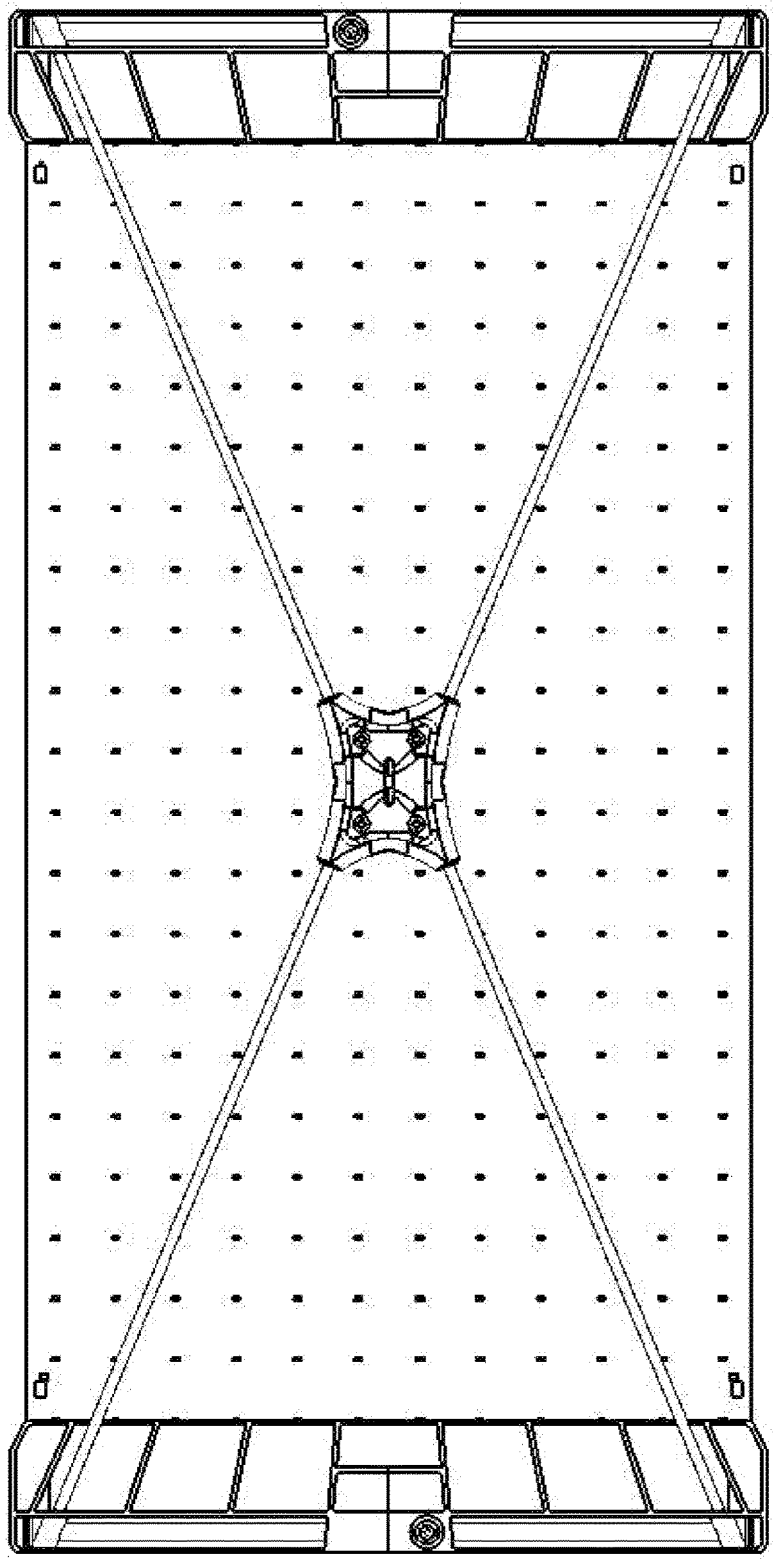
FIG. 3J is back view of the design of plant light apparatus 201, according to some embodiments of the present invention.

FIG. 3J is back view of the design of plant light apparatus 201, according to some embodiments of the present invention.

FIG. 4A is a top-end view of the design of pole-mount hub 238, according to some embodiments of the present invention.

FIG. 4B is a left-side view of the design of pole-mount hub 238, according to some embodiments of the present invention.

FIG. 4C is a back view of the design of pole-mount hub 238, according to some embodiments of the present invention.

FIG. 4D is a right-side view of the design of pole-mount hub 238, according to some embodiments of the present invention.

FIG. 4E is a bottom-end view of the design of pole-mount hub 238, according to some embodiments of the present invention.

FIG. 4F is a front view of the design of pole-mount hub 238, according to some embodiments of the present invention.

FIG. 4G is a back-perspective view of the design of pole-mount hub 238, according to some embodiments of the present invention.

FIG. 4H is a front perspective view of the design of pole-mount hub 238, according to some embodiments of the present invention.

FIG. 5A is a top-end view of the design of pole-mount hub clamp plate 237, according to some embodiments of the present invention.

FIG. 5B is a left-side view of the design of pole-mount hub clamp plate 237, according to some embodiments of the present invention.

FIG. 5C is a back view of the design of pole-mount hub clamp plate 237, according to some embodiments of the present invention.

FIG. 5D is a right-side view of the design of pole-mount hub clamp plate 237, according to some embodiments of the present invention.

FIG. 5E is a bottom-end view of the design of pole-mount hub clamp plate 237, according to some embodiments of the present invention.

FIG. 5F is a front view of the design of pole-mount hub clamp plate 237, according to some embodiments of the present invention.

FIG. 5G is a back-perspective view of the design of pole-mount hub clamp plate 237, according to some embodiments of the present invention.

FIG. 5H is a front-perspective view of the design of pole-mount hub clamp plate 237, according to some embodiments of the present invention.

Figure 6A:
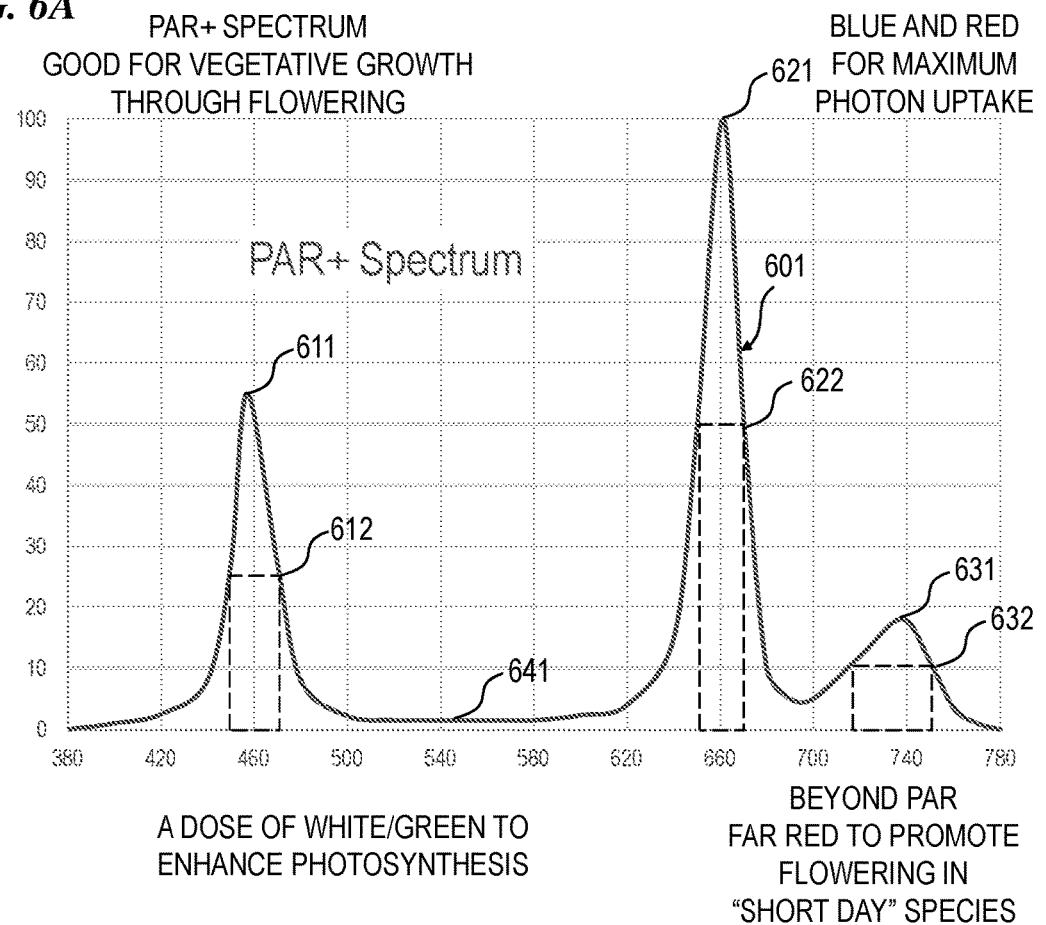
FIG. 6A is a graph of the PAR$^+$ spectrum 601 of plant light apparatus 201 showing some advantages of the present invention, according to some embodiments of the present invention.

FIG. 6A is a graph of the PAR$^+$ spectrum 601 of plant light apparatus 201 showing some advantages of the present invention, according to some embodiments of the present invention. In some embodiments, the number and spectral-intensity characteristics of the red-color LEDs on plant light apparatus 201, as compared to the numbers of blue-color LEDs and infrared LEDs, are selected on the basis of empirical studies of plant-growth rates and other characteristics to provide improved plant growth rate, nutrient uptake, and plant health. In some embodiments, the various LEDs are selected to provide blue light with a peak wavelength of about 458 nm and a relative intensity, relative to the intensity of the red light, of about 55% (reference number 611) and a full-width half-maximum (FWHM) bandwidth of about 20 nm (reference number 612), red light with a peak wavelength of about 662 nm (reference number 621) and a full-width half-maximum (FWHM) bandwidth of about 20 nm (reference number 622), and infrared light with a peak wavelength of about 738 nm and a relative intensity, relative to the intensity of the red light, of about 18% (reference number 631) and a full-width half-maximum (FWHM) bandwidth of about 40 nm (reference number 632). Some embodiments further include a dose of green and/or white light (reference number 641) at a relative intensity, relative to the intensity of the red light, of about 1% to 3%, to enhance photosynthesis. Photosynthetically active radiation (PAR) light is typically in the visible part of the electromagnetic spectrum—about 400 nm to about 700 nm. Chlorophyll, the most abundant plant pigment, is most efficient in capturing red and blue light. Accessory pigments such as carotenes and xanthophylls harvest some green light and pass it on to the photosynthetic process, but much of the green wavelengths are simply reflected, which gives leaves their green color. In some embodiments, the present invention provides a PAR$^+$ spectrum—i.e., the visible-light PAR (red and blue) spectrum, plus infrared light at about 740 nm to promote flowering in "short day" species and a small but useful dose of green light from white or green LEDs to enhance photosynthesis.

Figure 6B:
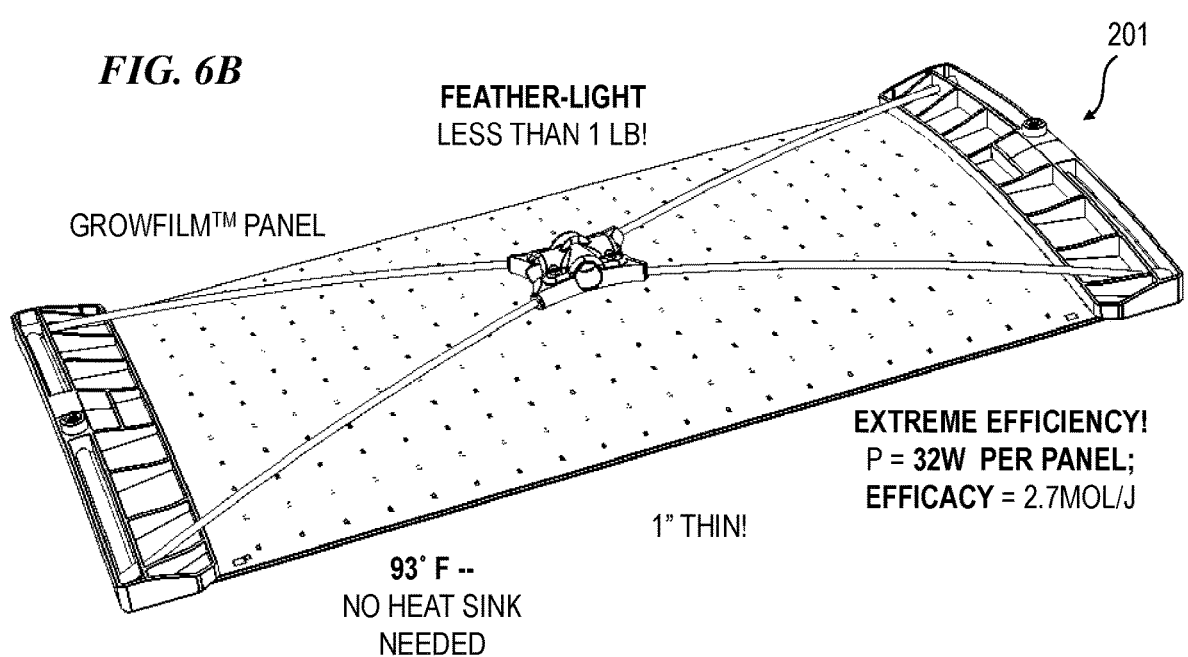
FIG. 6B is a back-perspective view of plant light apparatus 201 showing some advantages of the present invention, according to some embodiments of the present invention.

FIG. 6B is a back-perspective view of plant light apparatus 201 showing some advantages of the present invention, according to some embodiments of the present invention. In some embodiments, the GROWFILM™ panel of the present invention (e.g., plant light apparatus 201) is "feather light," weighing less than one pound (less than about 0.45 kg) and is about one-inch (about 2.5 cm) thin, provides extreme efficiency (a 32-watt panel provides an efficacy of 2.7 micromol/joule), and maintains a temperature of about 35 degrees Celsius or less by normal air convection without fans or additional heat sinks.

Figure 7A:
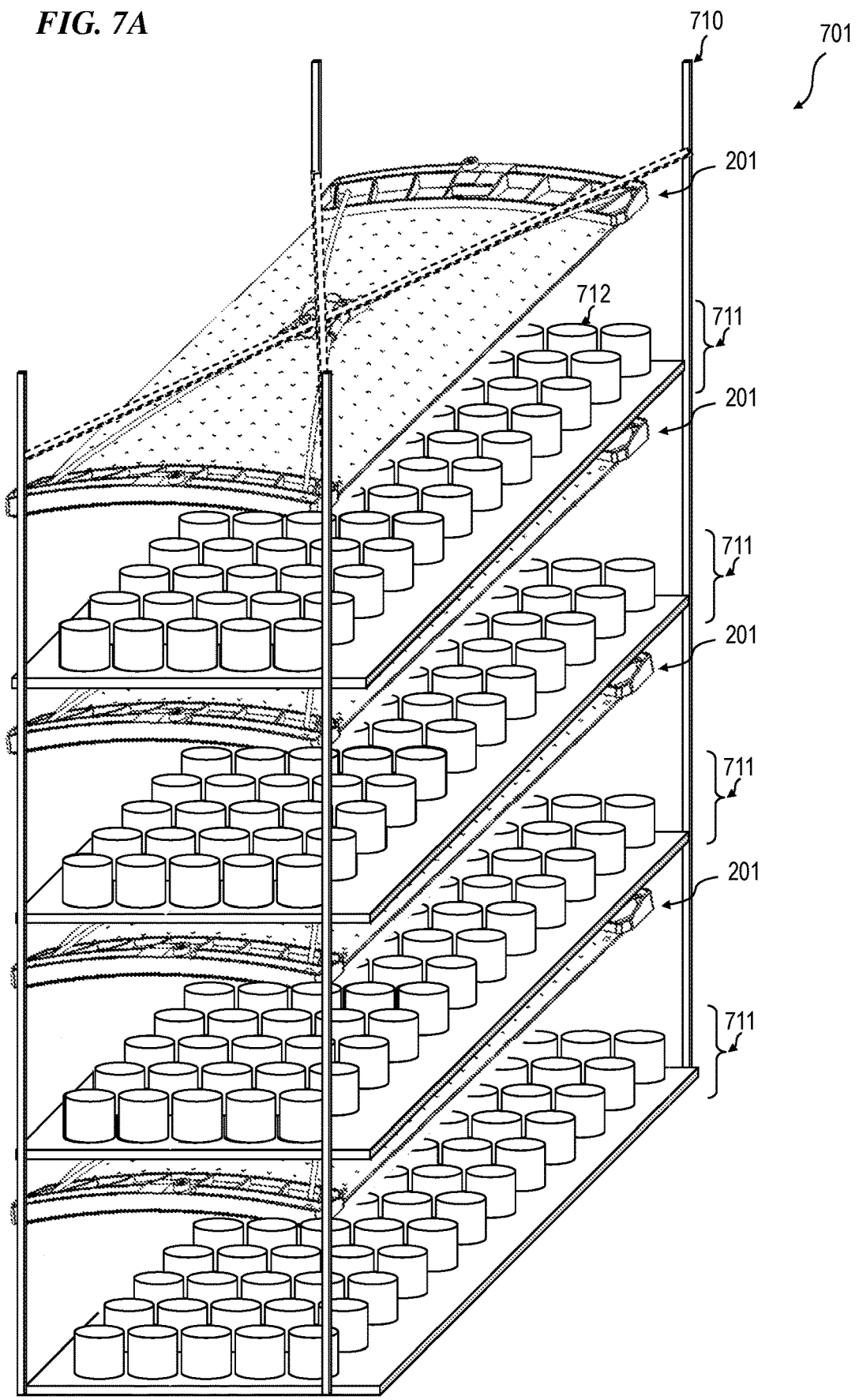
FIG. 7A is a perspective view of plant light system 701, according to some embodiments of the present invention.

FIG. 7A is a perspective view of a multiple-shelf plant light system 701, according to some embodiments of the present invention. Due to the low operating temperature achieved by the present invention, the shelves of a multiple-shelf plant light apparatus 701 can be placed closer together without the danger of burning the plants that grow too close to plant light apparatus 201 attached to the next shelf above, since without using fans or air-conditioned ventilation, some embodiments of the plant light apparatus 201 of the present invention operate at 95 degrees F. (35 degrees C.) via passive convective air movement only. This provides more plants and more plant light apparatus 201 in any given volume of space, reducing real-estate costs and increasing profitability. In some embodiments, each plant-growing rack 710 includes a plurality of shelves 711, each including a plurality of growing plants in pots 712.

Figure 7B:
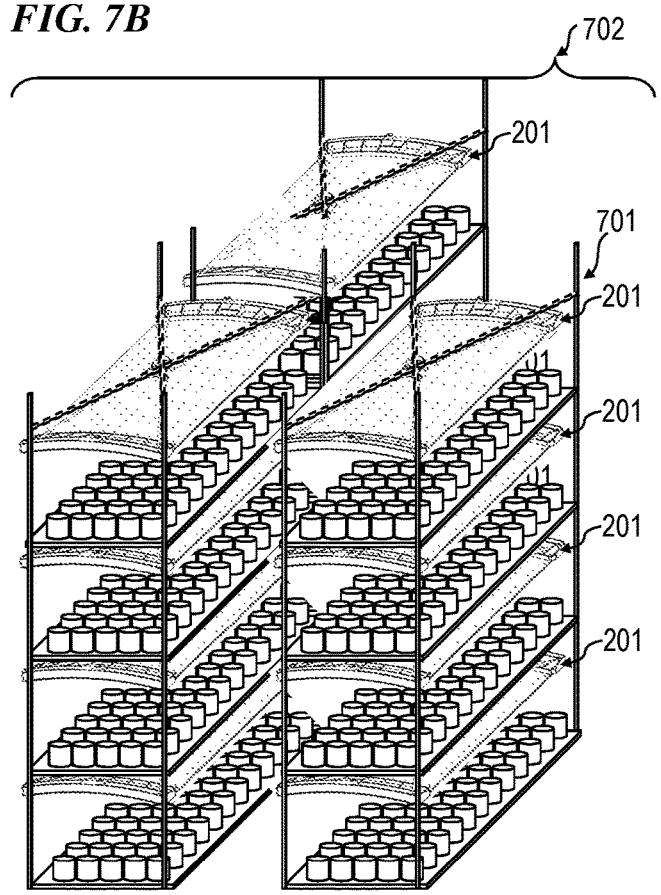
FIG. 7B is a perspective view of plant light system 702, according to some embodiments of the present invention.

FIG. 7B is a perspective view of a multiple-shelf plant light system 702 that uses a plurality of systems 701 as previously described in FIG. 7A, according to some embodiments of the present invention.

Figure 8:
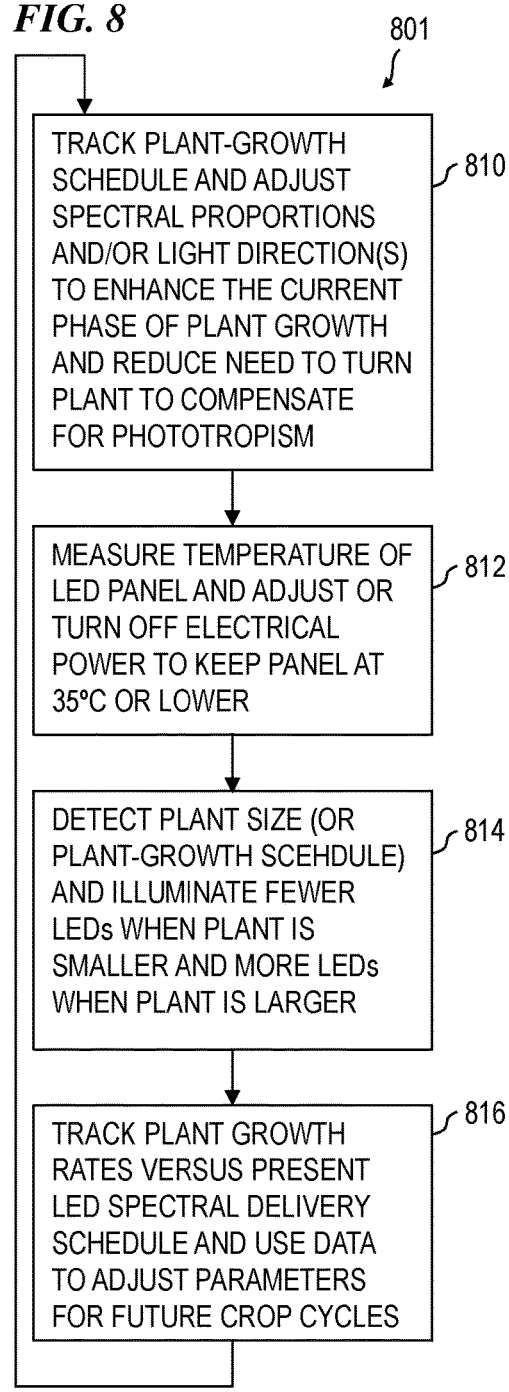
FIG. 8 is a flow chart of a method 801, according to some embodiments of the present invention.

FIG. 8 is a flow chart of a method 801, according to some embodiments of the present invention. In some embodiments, method 801 includes a subroutine that reads parameters from a non-transitory storage medium, wherein the parameters include empirically derived data (such as results from university studies of different light schedules and spectra versus plant growth and characteristics) that cause control of the method to track a plant-growth schedule and adjust spectral proportions and/or light direction(s) to enhance the current growth phase of plant life cycle and/or reduce need to physically turn a plant to compensate for phototropism (which reduces labor costs). In some embodiments, method 801 includes a subroutine that measures temperature of the LED panel (e.g., plant light apparatus 201) and adjusts or turns off electrical power to keep the panel at 35° C. or lower. In some embodiments, method 801 includes a subroutine that tracks plant growth rates versus present LED spectral delivery schedule and uses the resulting empirically obtained data to adjust parameters for future crop cycles.

FIG. 9A is a perspective view of plant growing system 901, with a plurality of plant light systems 910 in a first mode 910A, according to some embodiments of the present invention. In some embodiments, each plant light system 910 is approximately nine meters high and thirty meters long, and includes a plurality of lighting sheets 911 (e.g., in some embodiments, fifty plant-lighting sheets 911 that are each approximately 0.61 meters wide and 8.5 meters high). In some embodiments, each plant-lighting sheet 911 is tiled with a plurality of LED sheets that are each about 30.5 cm by about 61 cm. Referring again to FIG. 7A, plant-growing rack 710 includes a plurality of shelves 711, each including a plurality of growing plants in pots 712. In some embodiments, some of the LED sheets contain 144 LEDs of red and blue spectra as described above, spaced on a one-inch-by-one-inch grid or a one-inch-by-two-inch grid or a 1-inch-by-half-inch grid (144, 72, or 288 LEDs per square foot), and others of the LED sheets contain 288 LEDs of "white" spectra as described above. In some embodiments, each sheet includes red, blue and white LEDs all in a grid on each LED tile sheet. The red, blue and white spectra are selected to optimize plant production of the desired crop (e.g., food such as strawberries, tomatoes, or the like, spices or herbs such as basil, mint or catnip, or medicinal plants such as cannabis where legal). In some embodiments, the plurality of plant-lighting sheets 911 are grouped into subsets of six plant-lighting sheets 911 each (about 4 meters wide total), wherein each subset can be individually controlled (e.g., rotated from the third mode of being parallel to the long dimension (e.g., the thirty-meter direction) to the first mode of being perpendicular to the long dimension). In the first mode, the six plant-lighting sheets 911 of each of one or more subsets are perpendicular to the length of the plant shelves 710, permitting plant technicians to access and tend to the needs of the plants (e.g., individual plant pruning, fertilizing, or the like).

FIG. 9B is a perspective view of plant growing system 901, with plant light systems 910 in a second mode 910B, according to some embodiments of the present invention. In the second mode, the six plant-lighting sheets 911 of each of one or more subsets are perpendicular to the length of the plant shelves 710 and are withdrawn to one end of their range (or completely withdrawn to one very end or to the very center of the racks 710 of plants, permitting plant technicians to more extensive access to the plants (e.g., for harvesting an entire crop and replacing all the plants with seedlings for the next crop, or the like).

Figure 9D:
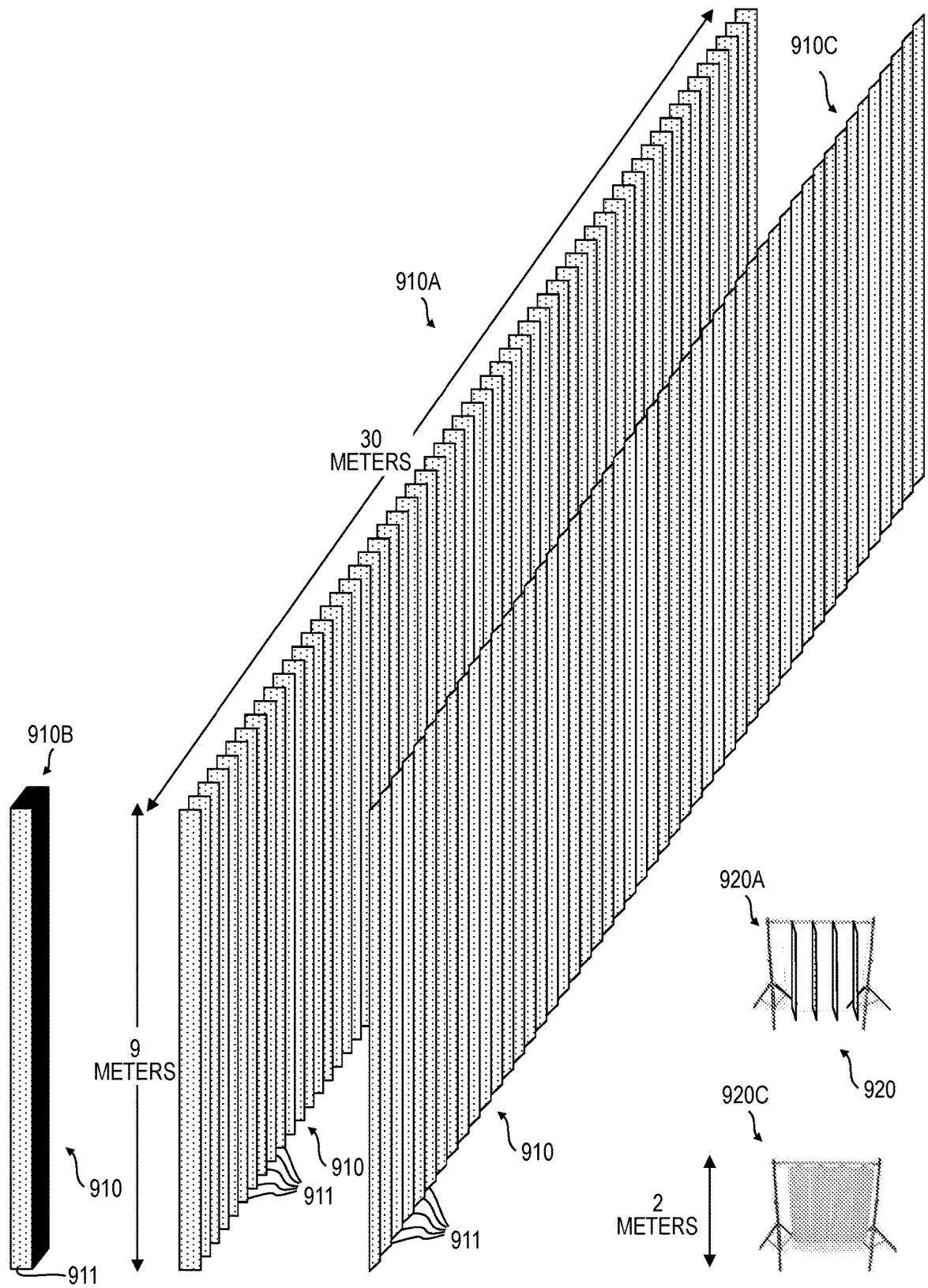
FIG. 9D is a perspective view of a plurality of plant light systems 910 in the second mode 910B, first mode 910A and deployed third mode 910C, according to some embodiments of the present invention.

FIG. 9C is a perspective view of plant growing system 901, with plant light systems 910 in a third deployed mode 910C, according to some embodiments of the present invention. In the third mode, the six plant-lighting sheets 911 of each of one or more subsets are parallel to the length of the plant shelves 710, and provide a continuous sheet of LED emitters FIG. 9D is a perspective view of a plurality of plant light systems 910 in the second mode 910B, first mode 910A and deployed third mode 910C, according to some embodiments of the present invention. Also shown is an alternative embodiment 920 having four plant lighting sheets that provide a sheet of about two meters by two meters for small specialty shelves of plants such as spices and herbs, or home greenhouses.

Figure 9E:
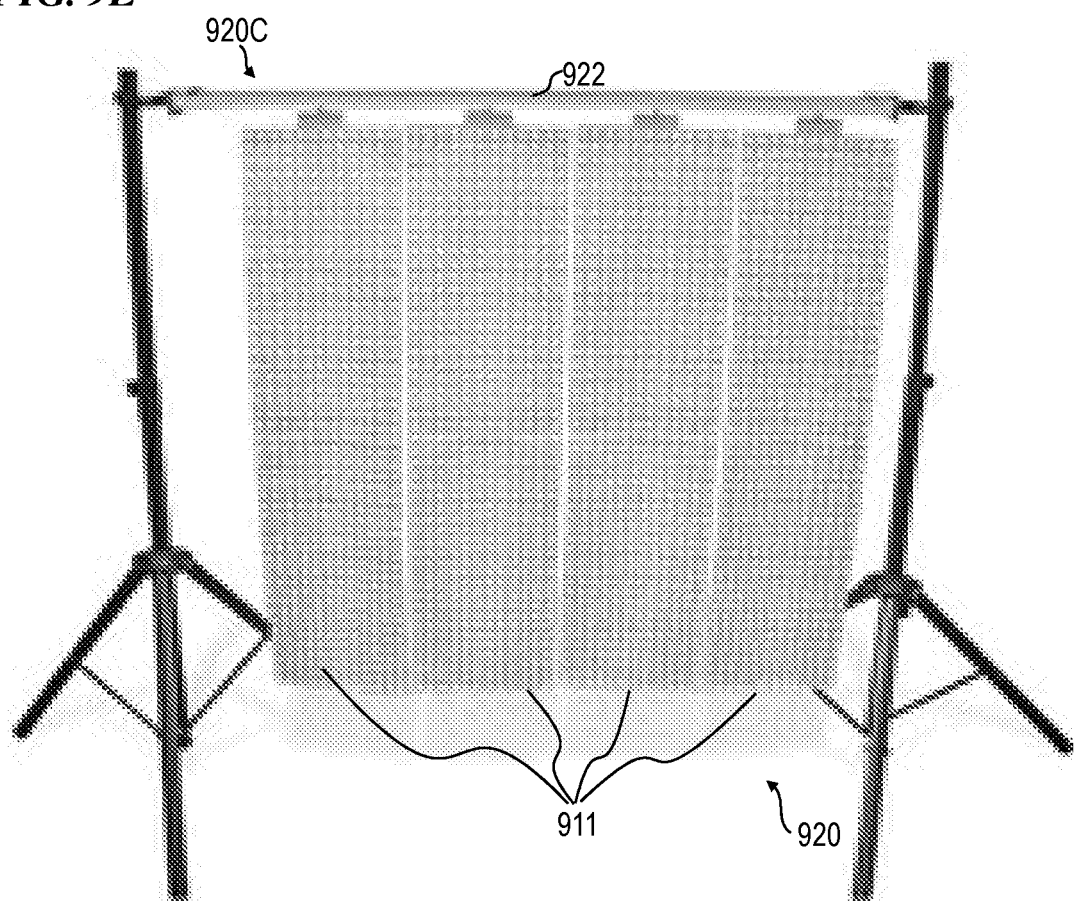
FIG. 9E is a perspective view of a plant light system 920 in the deployed mode 920C, according to some embodiments of the present invention.

FIG. 9E is a perspective view of a plant light system 920 in the deployed mode 920C, according to some embodiments of the present invention.

Figure 10:
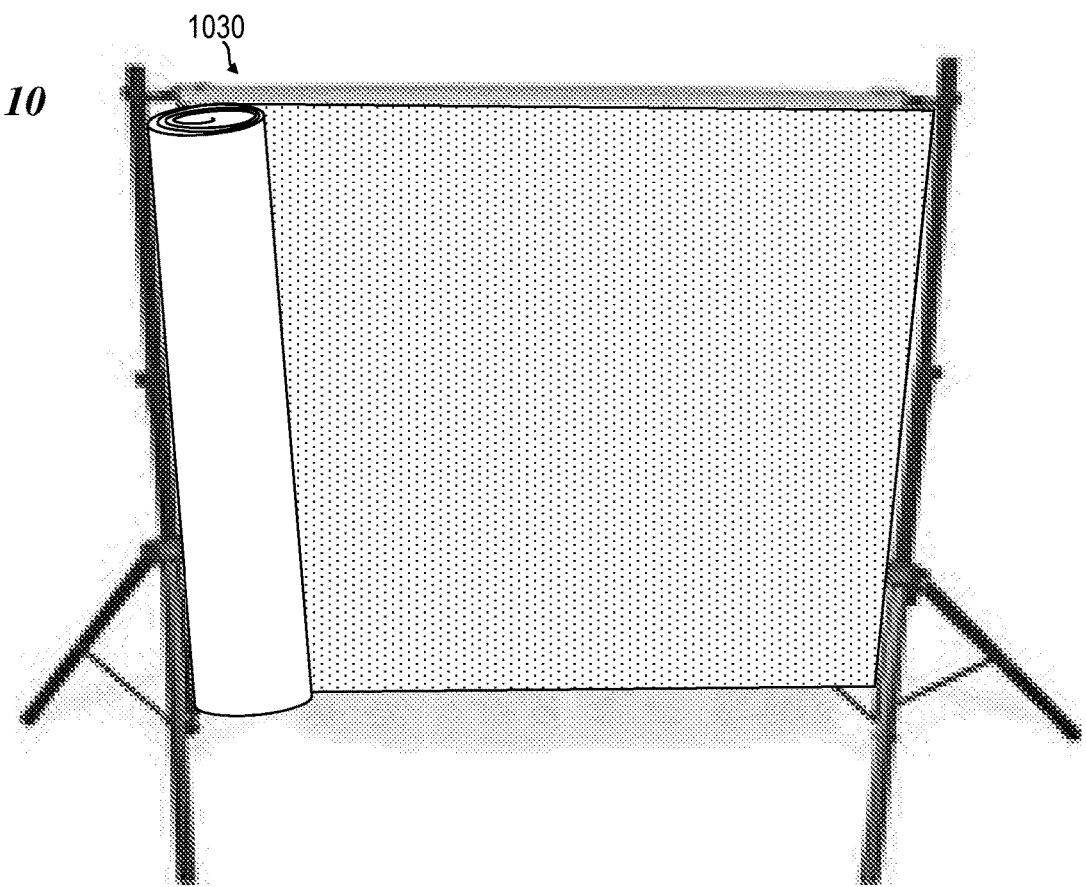
FIG. 10 is a perspective view of a plant light system 1030 in the deployed mode, according to some embodiments of the present invention.

FIG. 10 is a perspective view of a plant light system 1030 in the deployed mode, according to some embodiments of the present invention. In some embodiments, plant light system 1030 includes a retractable roll of flexible LED tiles, each having a grid of LED emitters, such as described above.

Figures 11A, 11B:
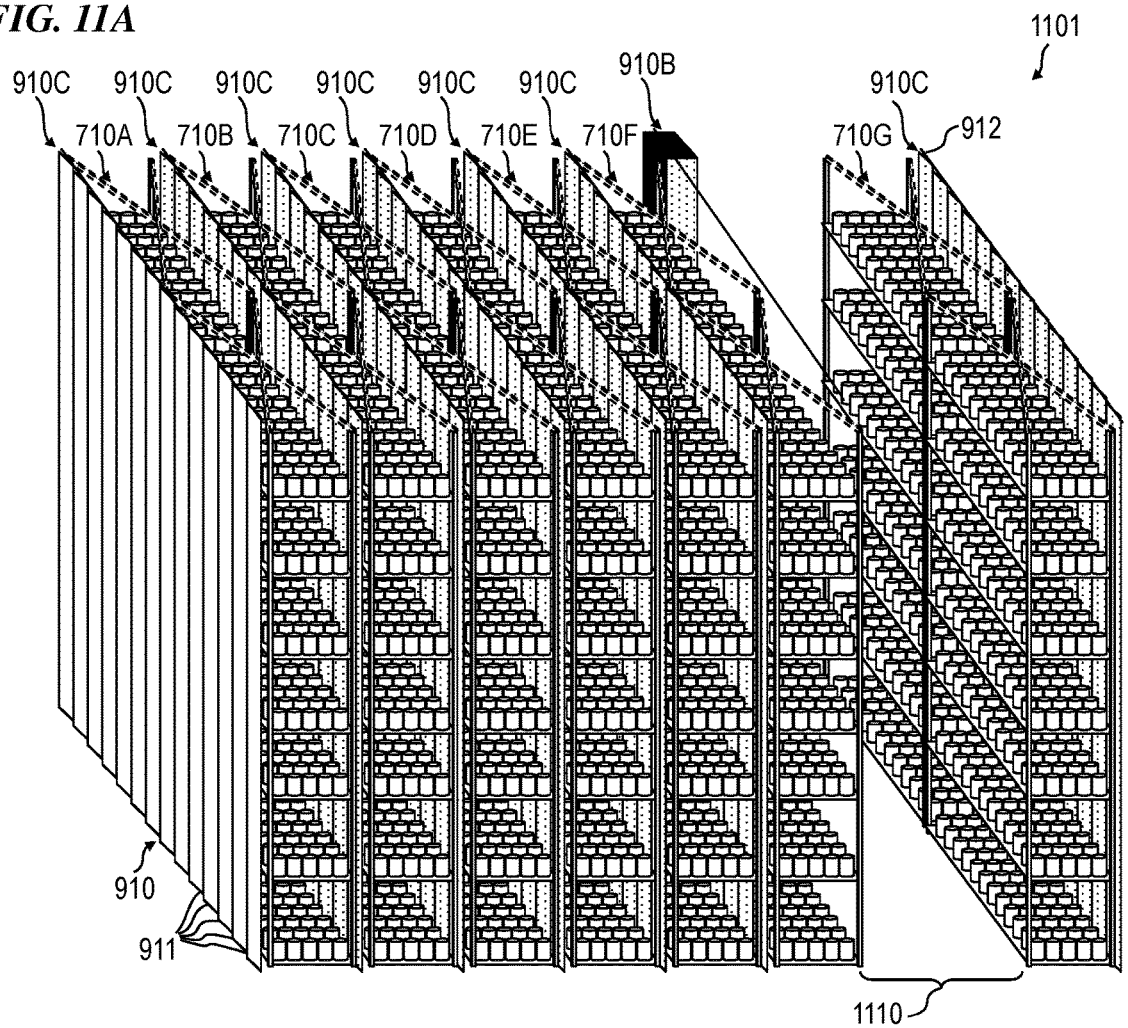
FIG. 11A is a perspective view of a plant light system 1101 with movable plant racks, according to some embodiments of the present invention.
FIG. 11B is an end view of plant light system 1101, according to some embodiments of the present invention.

FIG. 11A is a perspective view of a plant light system 1101 with movable plant racks, according to some embodiments of the present invention. In some embodiments, plant light system 1101 includes a plurality of plant light systems 910 in deployed mode 910C, with a plurality of movable plant shelf systems 710 (i.e., 710A-710G) that are movable laterally (and the deployed plant light systems 910 are centrally located between each pair of plant shelf systems 710), such that when the movable plant shelves 710 are spaced closer together (such as shown in the left-hand six movable plant shelves 710), there is a smaller distance between the deployed plant light systems 910 and the plants, and when the movable plant shelves 710 are spaced further apart, there is a greater distance between the deployed plant light systems 910 and the plants. In some embodiments, such a system allows a greater number of movable plant shelves 710 in a given warehouse space, while allowing the shelves to be moved such that there is one much-larger aisle 1110 to allow the plant light system 910 of that aisle to retract to the retracted configuration 910B, and to allow workers and/or machinery to move in that wide aisle to load, unload and/or service the many pots of plants along the sides of that aisle. For example, in the embodiment shown, the wide aisle is created between plant shelf systems 710G and 710F. Then, the plant light system 910 of that aisle is moved to the deployed configuration 910C, and plant shelf system 710F is moved to the right to create a wide aisle between plant shelf systems 710E and 710F and the plant light system 910 of that aisle is moved to the retracted configuration 910B and the plants along the sides of that newly created aisle can be serviced. Laterm when all required servicing has been completed, the movable plant shelves 710 are spaced to a desired spacing (which can be varied by the spacings is adjacent movable plant shelves 710) for the desired light-source-to-plant spacing.

FIG. 11B is an end view of plant light system 1101, according to some embodiments of the present invention. In some embodiments, a chain system 1120 that uses one or more chains 1121 and a hand crank 1122 (or, in other embodiments, a motorized system that can be manually or automatically controlled), along with sprockets 1123 located as needed, in order to laterally move the plurality of plant shelf systems 710 left or right.

Figure 11C:
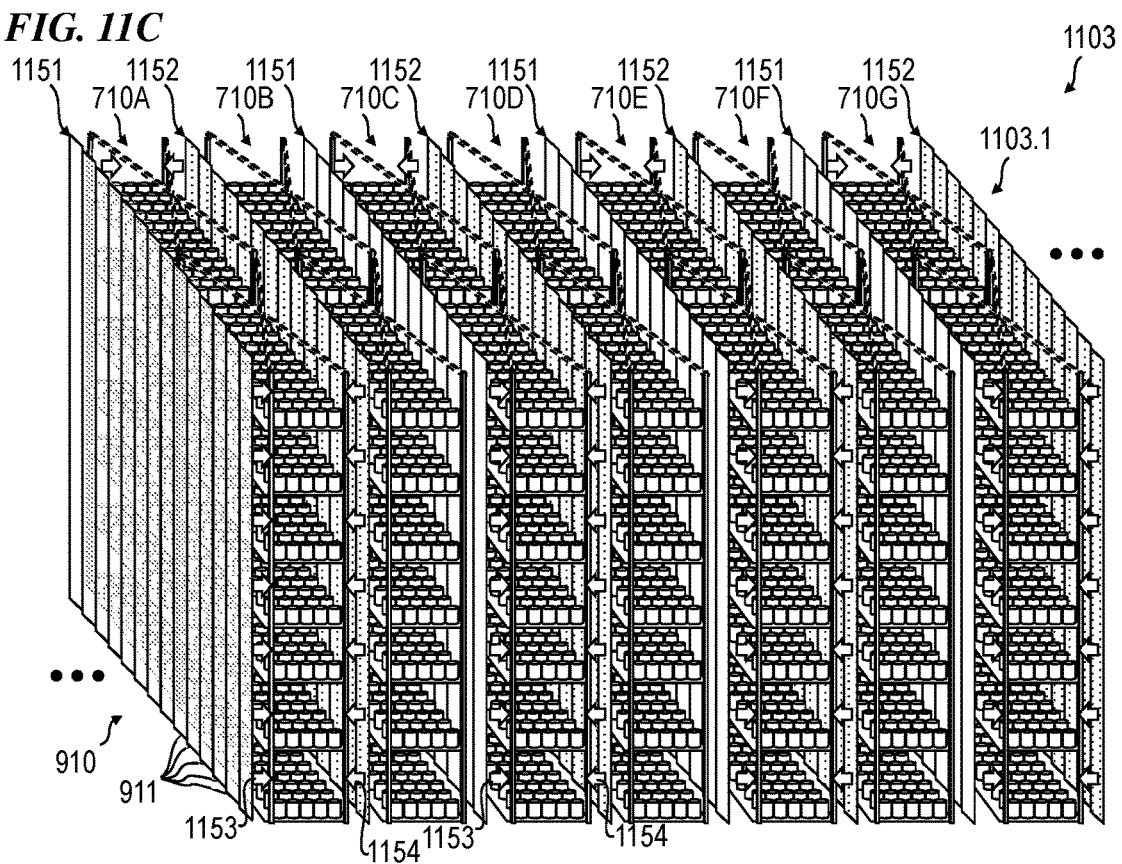
FIG. 11C is a perspective view of a plant light system 1103.1 in a first configuration with every odd-numbered row 1151 of light sheets facing leftward 1153 towards even-numbered racks 710A, 710C, 710E, 710G, . . . , and every even-numbered row 1152 of light sheets facing rightward 1154 towards even-numbered racks 710A, 710C, 710E, 710G, . . . , according to some embodiments of the present invention.
Figure 11D:
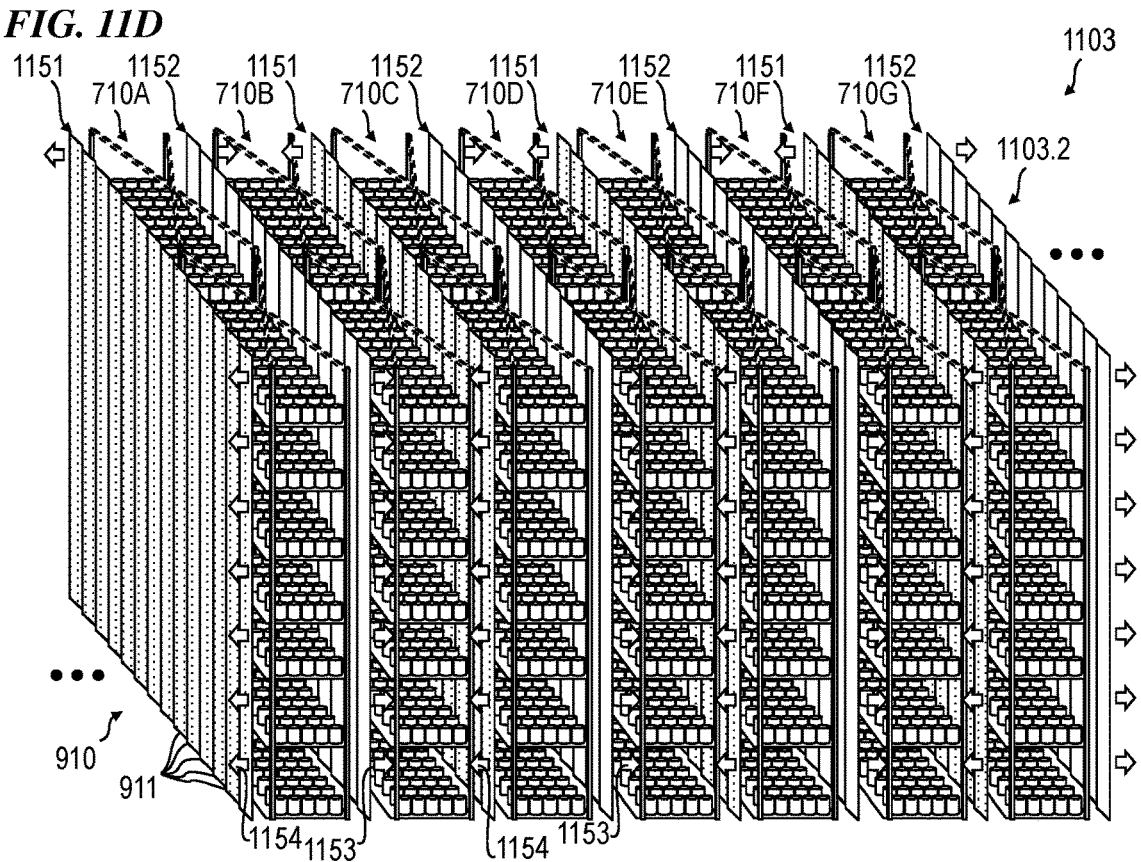
FIG. 11D is a perspective view of a plant light system 1103.1 in a first configuration with every odd-numbered row 1151 of light sheets facing rightward 1154 towards odd-numbered racks 710B, 710D, 710F, . . . , and every even-numbered row 1152 of light sheets facing leftward 1153 towards odd-numbered racks 710B, 710D, 710F, . . . , according to some embodiments of the present invention.

FIG. 11C is a perspective view of a plant light system 1103 in a first configuration 1103.1 with every odd-numbered row 1151 of light sheets facing leftward 1153 towards even-numbered racks 710A, 710C, 710E, 710G, . . . , and every even-numbered row 1152 of light sheets facing rightward 1154 towards even-numbered racks 710A, 710C, 710E, 710G, . . . , according to some embodiments of the present invention. In some embodiments, each light sheet has LEDs emitting light from only one side of the sheet, and a plurality of the light sheets of a row can each be rotated around a vertical axis so that all the light sheets of that row face the same way and emit light toward the same direction (e.g., either leftward or rightward). In some embodiments, for twelve hours each day, all of the light sheets are in configuration 1103.1 and face the even-numbered racks of plants, and at the end of that 12-hour period, all of the light sheets of each row are rotated around their respective vertical axes to face the opposite direction (configuration 1103.2 as is shown in FIG. 11D) for the next 12-hour period. At the end of that second 12-hour period, the light sheets are then returned to configuration 1103.1, so that each rack of plants 710 (i.e., 710A, 710B, and the like) is fully lit for alternating 12-hour periods, without having to move entire rows 910 of light sheets 911, but instead each lightsheet is rotated 180 degrees at the end of each 12-hour period. In other embodiments, other period durations are used (e.g., 8-hour-on 8-hour-off, 4-hour-on 4-hour-off or other period such as may be determined by empirical testing). In some embodiments, different rows may be illuminated for different durations (e.g., even-numbered rows for 8 hours each day and odd-numbered rows for 16 hours each day).

FIG. 11D is a perspective view of a plant light system 1103 in a second configuration 1103.2 with every odd-numbered row 1151 of light sheets facing rightward 1154 towards odd-numbered racks 710B, 710D, 710F, . . . , and every even-numbered row 1152 of light sheets facing leftward 1153 towards odd-numbered racks 710B, 710D, 710F, . . . , according to some embodiments of the present invention.

FIG. 12A is a top view of plant light system 1201, with a plurality of parallel tracks for variable light-to-plant spacings, according to some embodiments of the present invention. In some embodiments, one or more hanging chained (or hinged) light panel systems 1230 (in some embodiments, implemented by plant light systems 910 as shown in FIG. 9A, FIG. 9B, and FIG. 9C) are movable by sliding in an end-to-end direction from any of a plurality of tracks 1221, 1222, . . . 1229 of one set of parallel tracks 1220 (e.g., 1220A) to any of a plurality of tracks 1221, 1222, . . . 1229 of another set of parallel tracks 1220 (e.g., 1220B). The selectable one of the parallel tracks allows a desired spacing to the adjacent set of shelf systems 1210 (e.g., in some embodiments, implemented as per shelf systems 710 as shown in FIG. 9A having a plurality of parallel horizonal shelves 711 stacked one on another vertically), wherein a plurality of plant pots is vertically oriented on each shelf and the plants grow vertically from each pot in the space between the pot and the next shelf 711 above the pot. In other embodiments (not shown), the pots are oriented horizontally with the plants growing initially sideways (horizontal) and then upward and/or downward vertically (for example, tomato vines) over and along the sides of the shelves 711. In some embodiments, hanging light panel systems 1230 are held at their respective upper ends to a chain system that keeps each hanging light-sheet panel at a desired spacing to the neighboring hanging light-sheet panels, and the chain system allows the set of hanging light-sheet panels to be pulled lengthwise along the system of parallel aisle tracks 1220 and serial end tracks 1225 to move hanging light panel system 1230 from one track to another of the same aisle or of different aisles. While seven or nine parallel tracks are shown for each set of tracks 1220 in this FIG. 12A, other embodiments use other quantities of parallel tracks between adjacent shelf units 1210. In some embodiments, each hanging light-sheet panel of a given hanging light panel system 1230 is connected to the neighboring hanging light-sheet panels by a common chain along the track from which it is hanging. Such chain systems generally need the leading edge of a given hanging light panel system 1230 to be pulled towards its destination. In some other embodiments, each hanging light-sheet panel of a given hanging light panel system 1230 is connected to the neighboring hanging light-sheet panels by one or more hinges (such as indicated in FIG. 12B by hanging light panel system 1240C) along the vertical length of the adjacent panels, and each panel is optionally connected at tis top to the track currently being used. Such hinged systems allow either the leading edge of a given hanging light panel system 1230 to be pulled towards its destination or the trailing panel to be pushed so that the hanging light panel system 1230 moves towards the desired destination. In other embodiments, still other systems (such as those various ones used for vertical Venetian blinds) are used.

FIG. 12B is a top view of plant light system 1202, with a plurality of parallel tracks and motorized light sheets and switches for automated variable light-to-plant spacings, according to some embodiments of the present invention. In some embodiments, a plurality of hanging chained (or hinged) light panel systems 1240 are on motorized units that are electronically controlled to move each chained light panel system 1240 from one to another aisle (either to and from parallel aisles such as across the top of the FIG. 12B (e.g., from one of the parallel tracks at the location of light panel system 1240A to the one of the parallel tracks at the location of light panel system 1240B using end-to-end parallel-connecting tracks 1225), or to and from serial aisles such as between the top and bottom of the FIG. 12B (e.g., from one of the parallel tracks at the location of light panel system 1240A to the one of the parallel tracks at the location of light panel system 1240C using end-to-end serial-connecting tracks 1226)). In some embodiments, a plurality of switches 1235 are controlled to guide the moving chained light panel system 1240 into the desired one of the parallel tracks 1221-1229. While nine parallel tracks are shown for each set of tracks 1220 in this FIG. 12B, other embodiments use other quantities of parallel tracks between adjacent shelf units 1210. In some embodiments, each hanging light-sheet panel of a given hanging light panel system 1240 is connected to the neighboring hanging light-sheet panels by a common chain along the track from which it is hanging.

Such chain systems generally need the leading edge of a given hanging light panel system 1240 to be pulled towards its destination. In some other embodiments, each hanging light-sheet panel of a given hanging light panel system 1240 is connected to the neighboring hanging light-sheet panels by one or more hinges (such as indicated in FIG. 12B by hanging light panel system 1240C) along the vertical length of the adjacent panels, and each panel is optionally connected at tis top to the track currently being used. Such hinged systems allow either the leading edge of a given hanging light panel system 1240 to be pulled towards its destination or the trailing panel to be pushed so that the hanging light panel system 1240 moves towards the desired destination. In other embodiments, still other systems (such as those various ones used for vertical Venetian blinds) are used.

Figure 12C:
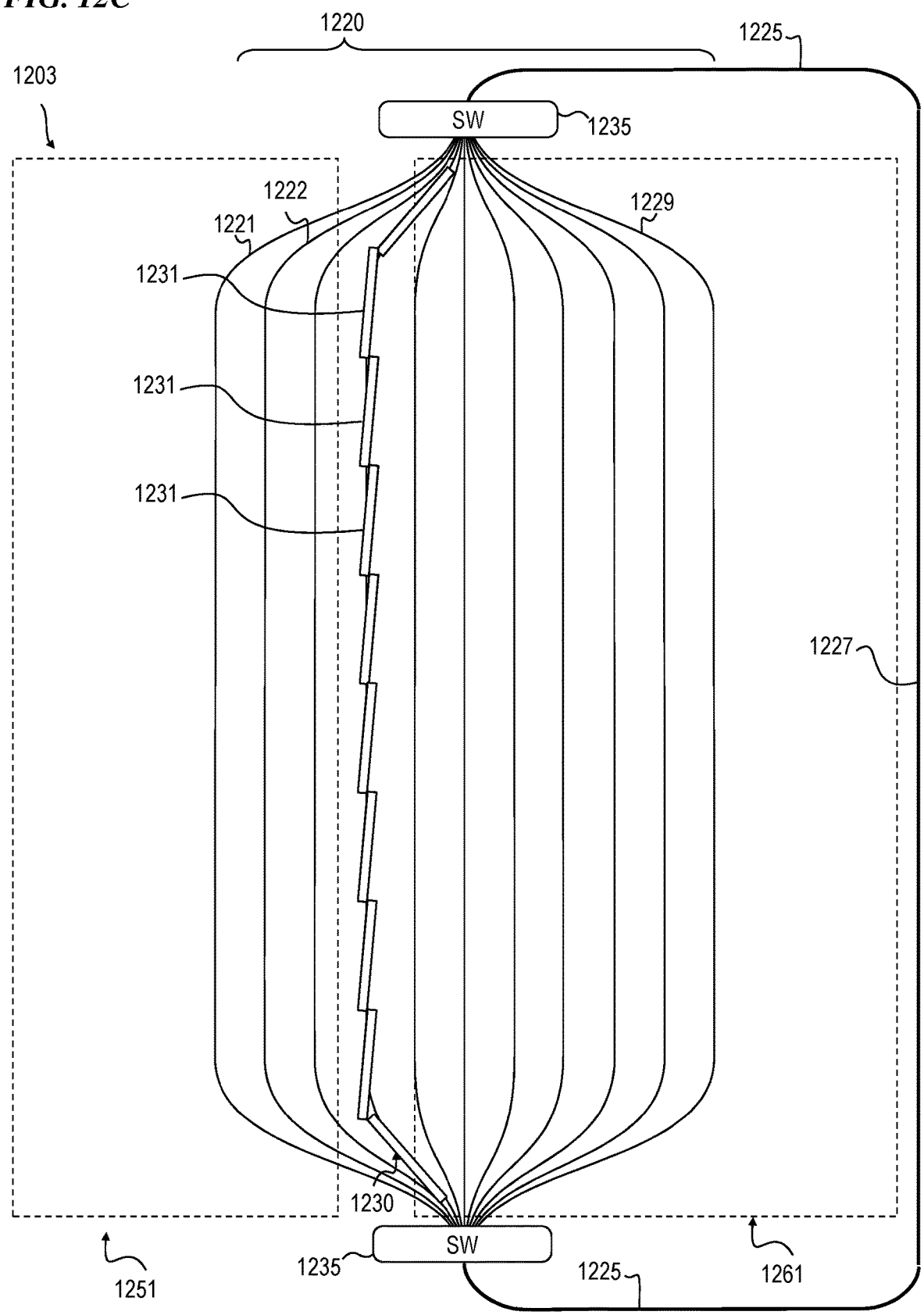
FIG. 12C is a top view of auditorium light system 1203, with a plurality of parallel tracks and light sheets for variable room sizes or spacings, according to some embodiments of the present invention.

FIG. 12C is a top view of auditorium light system 1203, with a plurality of parallel tracks and light sheets for variable room sizes or spacings, according to some embodiments of the present invention. In some embodiments, a single large room can be illuminated from the side by moving hanging light panel system 1230 to edge track 1227. At other times, hanging light panel system 1230 is moved to a selected one of the parallel tracks of track assembly 1220. In some embodiments, a switch 1235 is used to guide the hanging light panel system 1230 to the desired one of the parallel tracks. In some embodiments, hanging light panel system 1230 includes a plurality of light panels 1231 connected to each other by a top chain or by hinges, as described above.

Figure 13A:
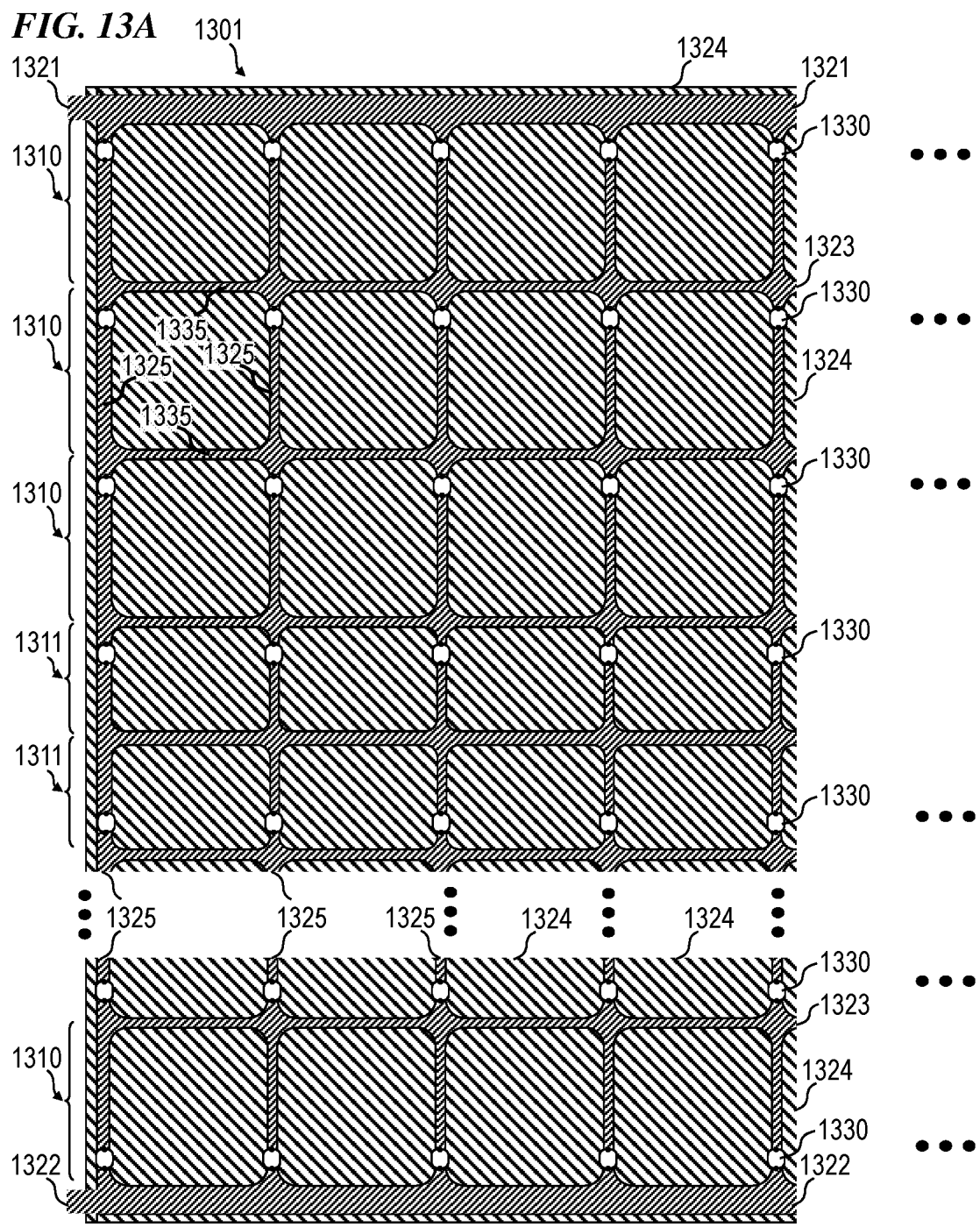
FIG. 13A is a plan view of a portion of a non-perforated light-sheet 1301, according to some embodiments of the present invention.

FIG. 13A is a plan view of a portion of a non-perforated light sheet 1301, according to some embodiments of the present invention. In some embodiments, light sheet 1301 includes a plurality of LEDs 1330 mounted on junctions of series conductors 1325, which are connected to one another between rows of LEDs by parallel conductors 1335, wherein a polymer substrate 1324 is visible in the rectangular space with rounded corners between each adjacent pair of series conductors 1325 and each adjacent pair of parallel conductors 1335. In some embodiments, each LED is mounted right next to a junction between parallel conductor and a series conductor, in order to be as close as possible to the larger metal area of the junction in order to better spread the heat from the operating LED to the horizontal parallel conductors 1335 to the left and right of the junction and to the vertical series conductors 1335 (above the junction and below the LED for LEDs in the upper half of non-perforated light sheet 1301, and below the junction and above the LED for LEDs in the lower half of non-perforated light sheet 1301). In some embodiments, each row 1310 has the same height, whereas two middle rows 1311 are of a smaller height, in order that all LEDs are evenly spaced vertically and the LEDs on the upper-edge row and the lower-edge row are closer to the top and bottom conductors 1321 and 1322. In some embodiments, top conductor 1321 is the DC power-supply conductor and bottom conductor 1322 is the DC ground conductor. In some embodiments, polymer substrate 1324 extends slightly beyond the outer edge of the top and bottom conductors 1321 and 1322, and of the left-most and right-most series conductors 1325.

Figure 13B:
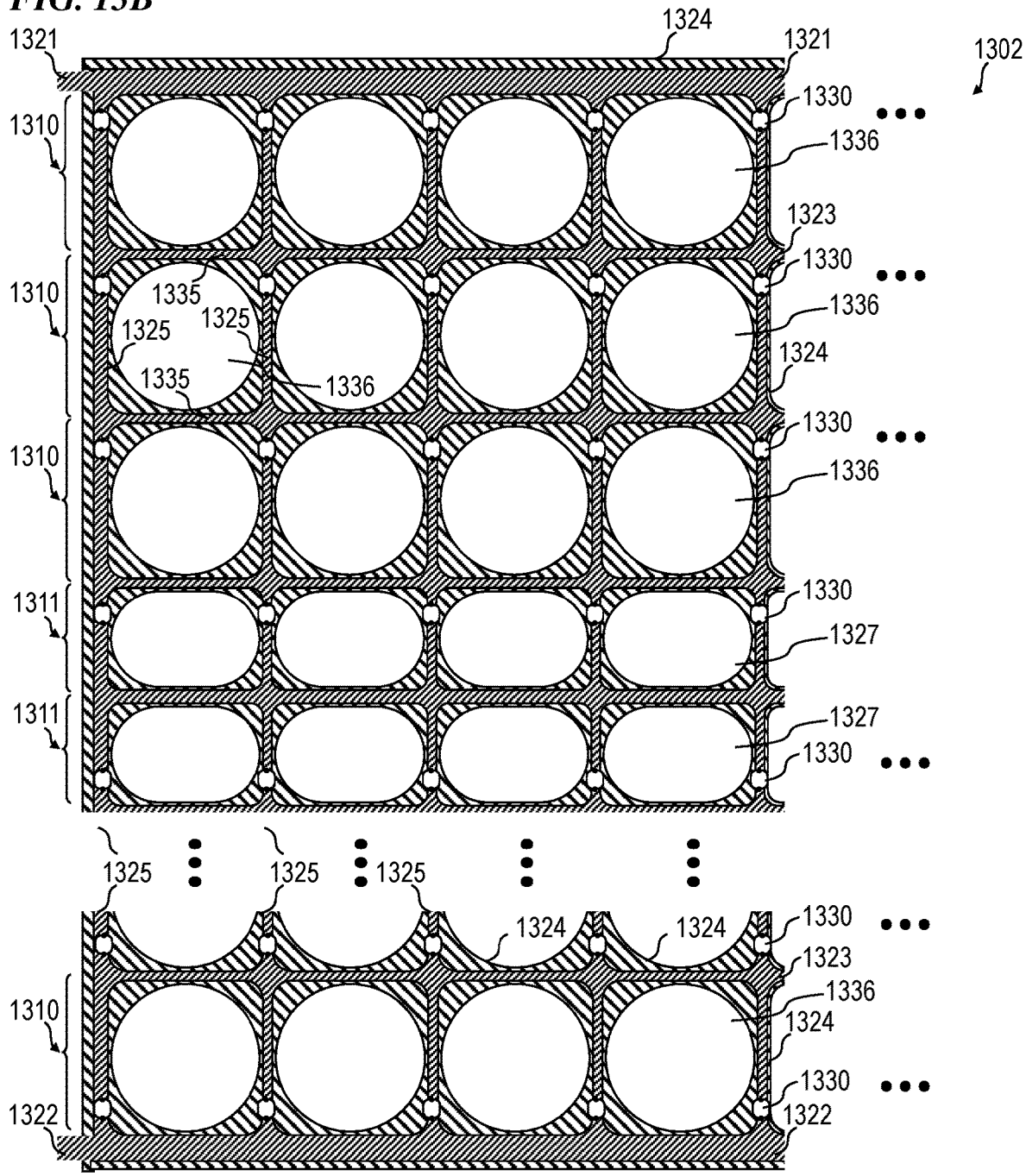
FIG. 13B is a plan view of a portion of a perforated light-sheet 1302 with round holes, according to some embodiments of the present invention.

FIG. 13B is a plan view of a portion of a perforated light-sheet 1302 with round holes, according to some embodiments of the present invention. In some embodiments, perforated light-sheet 1302 is substantially similar to light sheet 1301 as described above for FIG. 13A, with the difference being that rounded or circular holes 1336 are provided between each adjacent pair of series conductors 1325 and each adjacent pair of parallel conductors 1335. In some embodiments, round holes are used and the junctions between series conductors 1325 and parallel conductors 1335 are of larger area for increased physical panel strength and better heat spreading to keep the temperature rise smaller; however, the round holes permit less airflow and/or sound to pass through such holes.

Figure 13C:
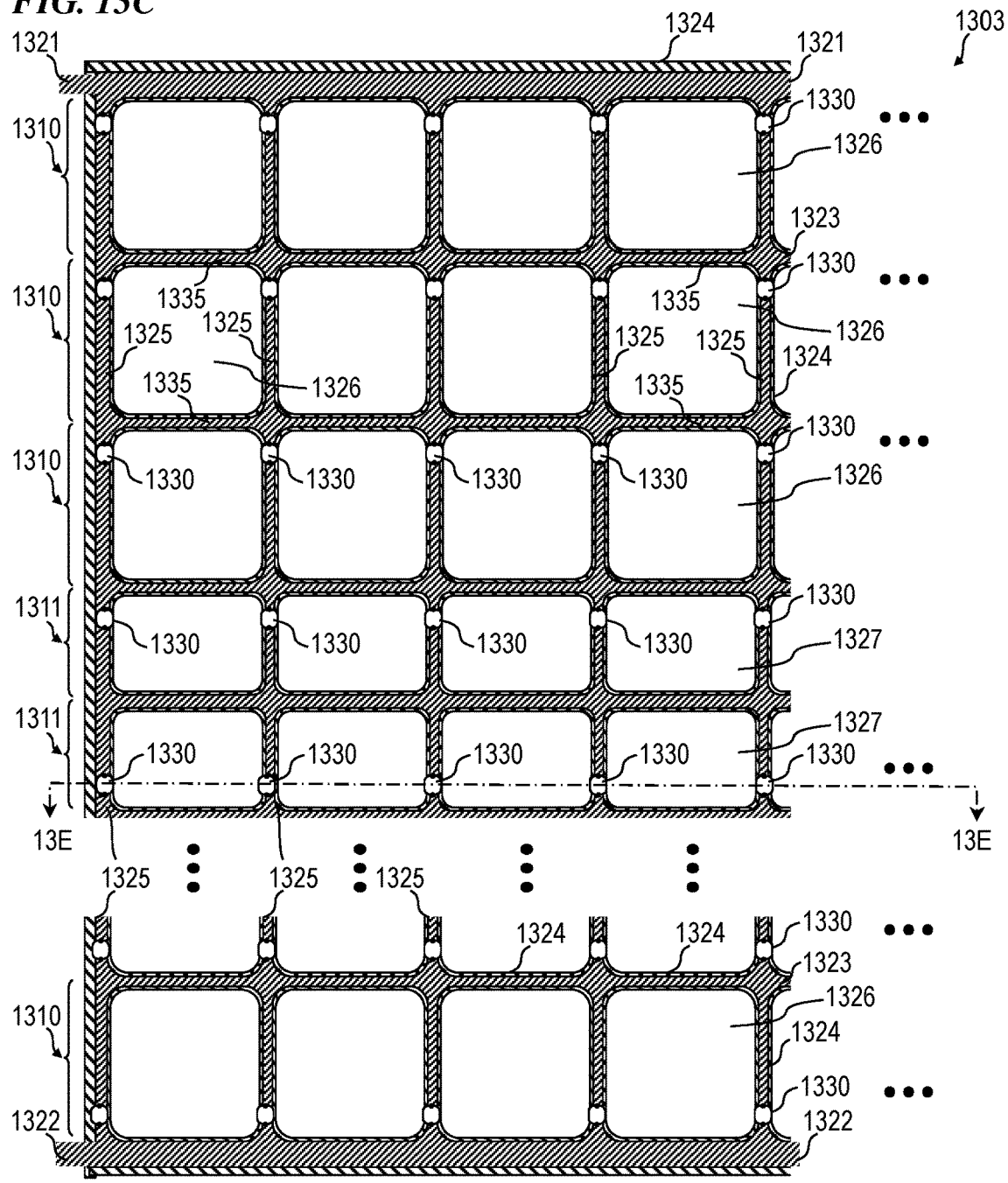
FIG. 13C is a plan view of a portion of a perforated light-sheet 1303 with square holes with rounded corners, according to some embodiments of the present invention.

FIG. 13C is a plan view of a portion of a perforated light-sheet 1303 with square holes with rounded corners, according to some embodiments of the present invention. In some embodiments, perforated light-sheet 1302 is substantially similar to light sheet 1302 as described above for FIG. 13B, with the difference being that square holes 1326 are provided between each adjacent pair of series conductors 1325 and each adjacent pair of parallel conductors 1335. In some embodiments, square holes are used and the junctions 1323 between series conductors 1325 and parallel conductors 1335 are of smaller area, in order for the square holes to permit more airflow and/or sound to pass through such holes than is the case for round holes, as well as providing a larger area for light from stacked perforated sheets to pass through.

Figure 13D:
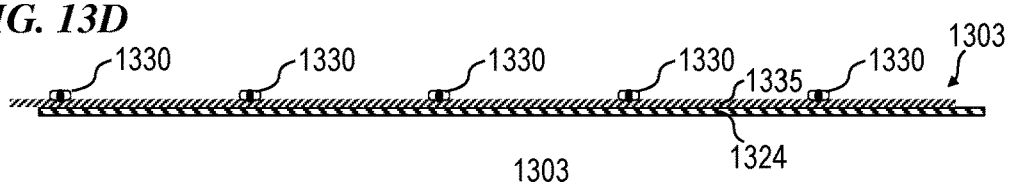
FIG. 13D is a side view of a portion of perforated light-sheet 1303, according to some embodiments of the present invention.

FIG. 13D is a side view of a portion of perforated light-sheet 1303, according to some embodiments of the present invention. FIG. 13D shows only the one edge parallel conductor 1335 under the LEDs 1330.

Figure 13E:
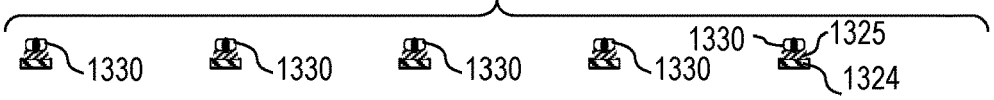
FIG. 13E is a cross-section view of a portion of perforated light-sheet 1303 along section line 13E of FIG. 13C, according to some embodiments of the present invention.

FIG. 13E is a cross-section view of a portion of perforated light-sheet 1303 along section line 13E of FIG. 13C, according to some embodiments of the present invention. FIG. 13E shows only the series conductors 1325 under the LEDs 1330.

Figure 13F:
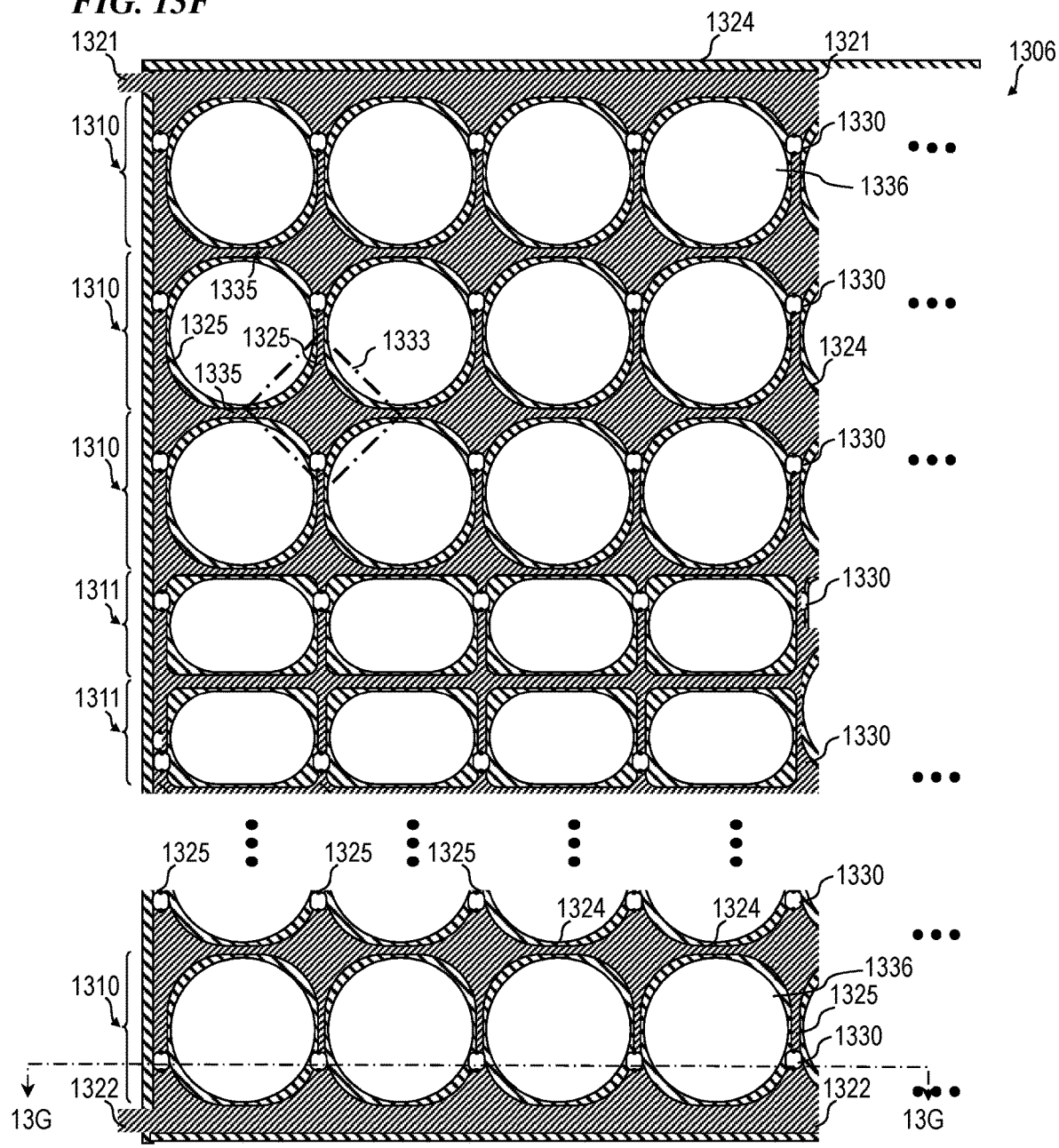
FIG. 13F is a plan view of a portion of a perforated light-sheet system 1306 with a single layer of perforated light-sheet 1303, according to some embodiments of the present invention.

FIG. 13F is a plan view of a portion of a perforated light-sheet system 1306 with a single layer of perforated light-sheet 1303, according to some embodiments of the present invention. In some embodiments, system 1306 is substantially similar to system 1302 of FIG. 13B except that the junctions 1333 between series conductors 1325 and parallel conductors 1335 are of an even larger area as compared to FIG. 13B.

Figure 13G:
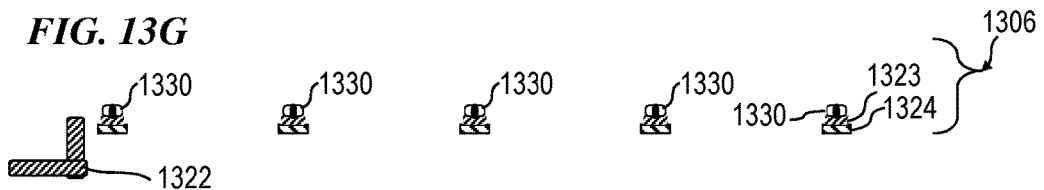
FIG. 13G is a cross-section view of a portion of perforated light-sheet system 1306 along section line 13G of FIG. 13F, according to some embodiments of the present invention.

FIG. 13G is a cross-section view of a portion of perforated light-sheet system 1306 along section line 13G of FIG. 13F, according to some embodiments of the present invention.

FIG. 13H1 is an end view of a portion of a perforated light-sheet 1308 with air scoops 1370, according to some embodiments of the present invention. In some embodiments, such air scoops allow better and more even air collection and/or air emission from plenum-mounted light sheets. For systems in which air is emitted from a supply-air plenum, the scoops extend outward from the side away from the LEDs and the light emission, while in systems in which air is collected into a return-air plenum, the scoops extend outward from the same side as the LEDs and the side of light emission.

FIG. 13H2 is a plan view of a portion of perforated light-sheet 1308 with air scoops 1370, according to some embodiments of the present invention. In some embodiments, holes 1326 occupy a portion of each space between each adjacent pair of series conductors 1325 and each adjacent pair of parallel conductors 1335 (see FIG. 13C for an indication of these conductors).

FIG. 13H3 is a side view of a portion of perforated light-sheet 1308 with air scoops 1370 that are all of the same height, according to some embodiments of the present invention.

FIG. 13H4 is a perspective view of a portion of perforated light-sheet 1308 with air scoops 1370, according to some embodiments of the present invention.

FIG. 13i is a side view of a portion of perforated light-sheet 1309 with air scoops 1371-1375 of varying heights, according to some embodiments of the present invention. In some embodiments, the different heights of air scoops 1371, air scoops 1372, air scoops 1373, air scoops 1374, and air scoops 1375 allow better control of air flow from a plenum and thus more even flow and velocity.

Figure 13J:
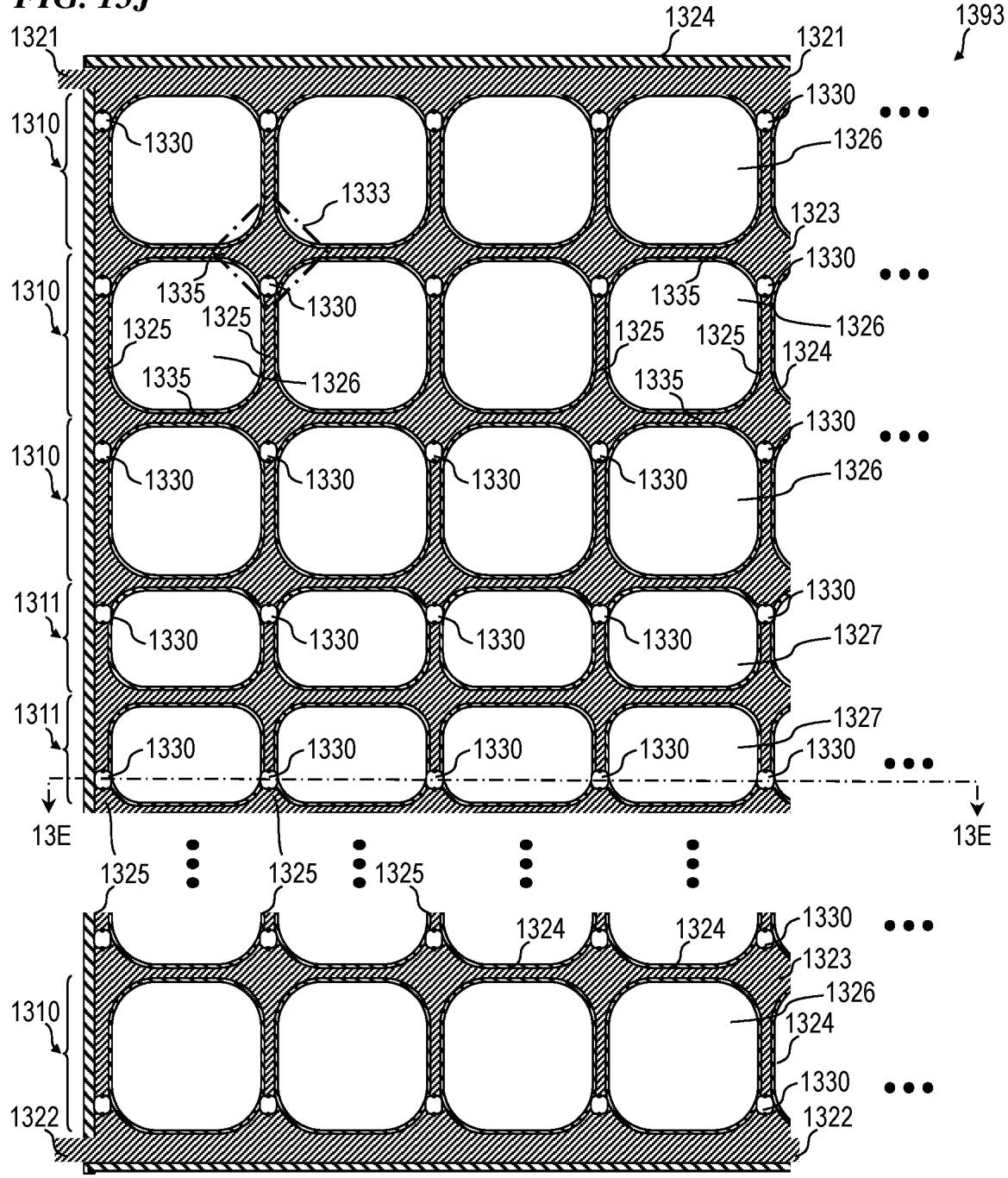
FIG. 13J is a plan view of a portion of perforated light-sheet 1393 with larger series-parallel junction areas 1333, according to some embodiments of the present invention.

FIG. 13J is a plan view of a portion of perforated light-sheet 1393 with larger series-parallel junction areas 1333, according to some embodiments of the present invention. In some embodiments, light sheet 1393 includes a plurality of LEDs 1330 mounted on junctions of series conductors 1325, which are connected to one another between rows of LEDs by parallel conductors 1335, wherein a thin rim of polymer substrate 1324 is visible around the edges of the rectangular space with rounded corners between each adjacent pair of series conductors 1325 and each adjacent pair of parallel conductors 1335. In some embodiments, each LED is mounted right next to an enlarged-area junction 1333 between parallel conductor and a series conductor, in order to be as close as possible to the larger metal area of the junction 1333 in order to better spread the heat from the operating LED to the horizontal parallel conductors 1335 to the left and right of the junction and to the vertical series conductors 1335 (above the junction and below the LED for LEDs in the upper half of perforated light sheet 1393 of FIG. 13J, and below the junction and above the LED for LEDs in the lower half of perforated light sheet 1393). Other aspects of perforated light sheet 1393 are as described above for non-perforated light sheet 1301 of FIG. 13A or perforated light sheet 1303 of FIG. 13C.

FIG. 14A is a plan view of a portion of a stacked perforated light-sheet system 1401 with a plurality of layers of perforated light-sheet 1303, according to some embodiments of the present invention. In some embodiments, the outermost layer 1303A is stacked on a middle layer 1303B and innermost layer 1303C. In other embodiments, other numbers of layers are used. In some embodiments, each different layer includes a plurality of LEDs having an overall different spectrum than the spectra of other layers. In some embodiments, this allows the intensity of light of each spectrum to be controlled independent of the pother spectra (e.g., by using different duty cycles of pulse-width modulation (PWM) or different current amounts), while each light sheet 1303 needs only a single layer of conductor, thus reducing costs. In other embodiments, two or more of the layers have the same of substantially similar spectra.

FIG. 14B is a cross-section view of a portion of perforated light-sheet system 1401, according to some embodiments of the present invention. In some embodiments, stacked perforated light-sheet system 1401 includes a plurality of perforated light sheets (e.g., in some embodiments, 1303A, 1303B, 1303C). In some embodiments, system 1401 includes a common insulated conductor 1460 used to supply power to all three light sheets 1303A, 1303B, and 1303C. In some embodiments, system 1401 further includes individual conductors 1461, 1462, and 1463 that are individually connected to their own respective sheet (e.g., in some embodiments, conductor 1461 is connected to sheet 1303A, conductor 1462 is connected to sheet 1303B, and conductor 1463 is connected to sheet 1303C) in order to provide sheet-specific control of amount of current, pulse-width modulation, and/or other suitable signal control, in order to control brightness (amount of light) and/or color spectrum (which wavelengths and how much of each wavelengths are emitted) and/or time-of-day or time-of week or season to use for each spectrum and/or brightness.

Figure 14C:
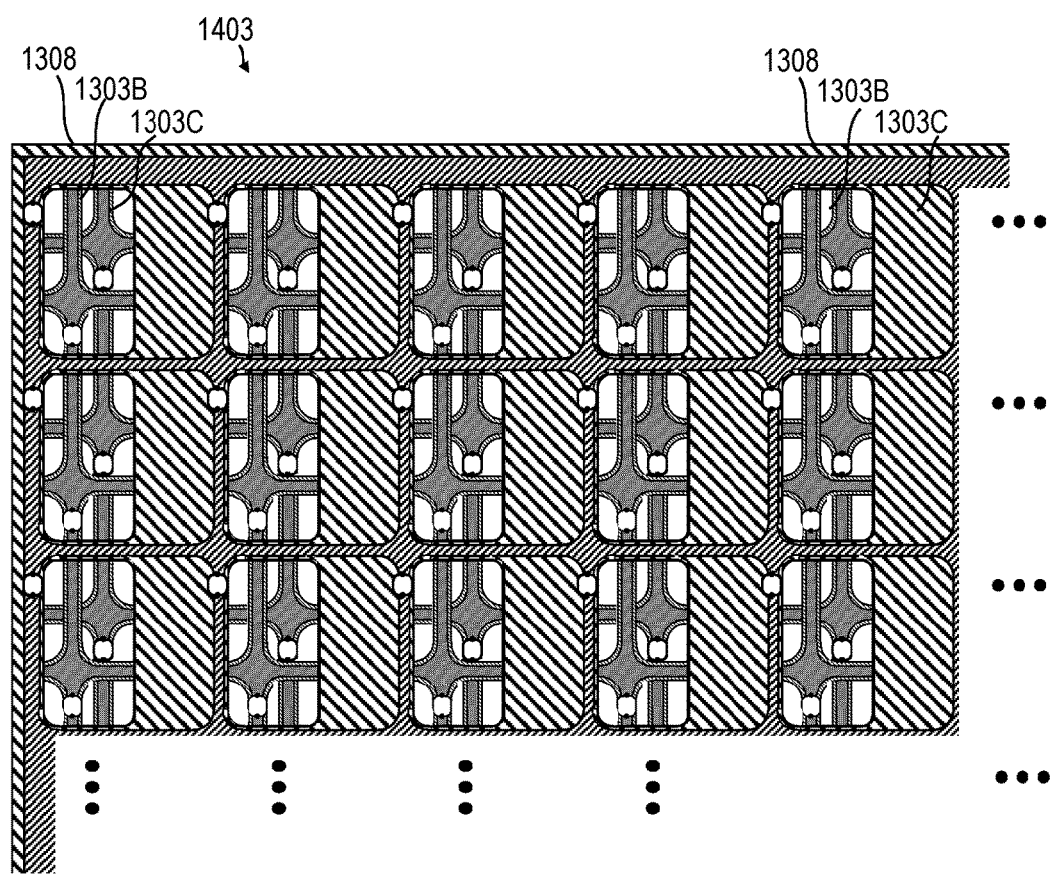
FIG. 14C is a plan view of a portion of a perforated light-sheet system 1403 with a perforated light-sheet 1308 with air scoops 1370 and one or more layers of perforated light-sheet 1303, according to some embodiments of the present invention.

FIG. 14C is a plan view of a portion of a stacked perforated scooped light-sheet system 1403 with a perforated light-sheet 1308 with air scoops 1370 and one or more layers of perforated light-sheet 1303, according to some embodiments of the present invention. In some embodiments, the scooped layer 1308 (with scoops formed inward (away from the LEDs) or outward (towards the side with LEDs), as the case may be) is stacked on one or more regular perforated light sheets 1303 (e.g., in some embodiments, 1303B and 1303C as shown here) to form a stacked perforated scooped light-sheet system 1403. In some embodiments, different layers have different spectra, different LED densities (quantities of LEDs per unit area), or different PWM duty cycles or current amounts.

Figure 14D:
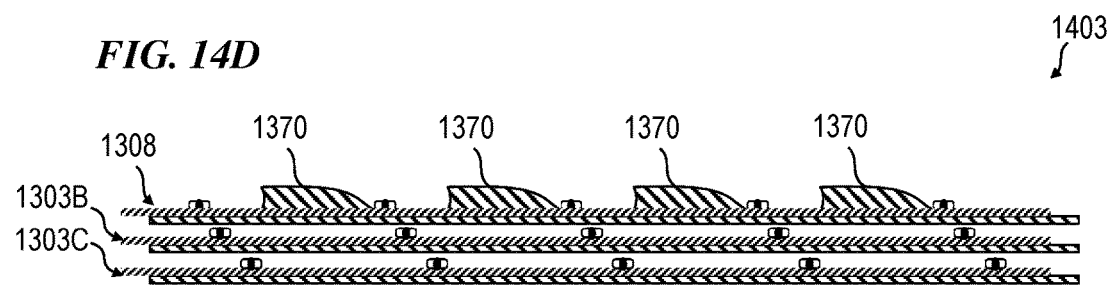
FIG. 14D is a side view of a portion of perforated light-sheet system 1403 with air scoops 1370 and one or more layers of perforated light-sheet 1303, according to some embodiments of the present invention.

FIG. 14D is a side view of a portion of perforated light-sheet system 1403 with air scoops 1370 and one or more layers of perforated light-sheet 1303 (e.g., 1303B and 1303C here), according to some embodiments of the present invention.

FIG. 15A is a side perspective view of a portion of a plant light system 1501, with a plurality of cartridges 1511 that are spaced apart on vertical rods 1512 for variable light-to-plant spacings and less wasted light adjacent to non-plant portions of plant shelves 711, according to some embodiments of the present invention. In some embodiments, each light sheet 1510 includes its own rod 1512 and a plurality of light-sheet cartridges 1512 affixed to rod 1512 at different selectable vertical locations. In some embodiments, each light sheet 1510 is connected to a top junction 1514 at a track 1515. In some embodiments, plant light system 1501 can be used in place of plant light system 910 or any other plant light systems described herein.

FIG. 15B is a perspective view of a portion of a plant light system 1501, with a plurality of cartridges that are spaced apart on vertical rods for variable light-to-plant spacings and less wasted light adjacent to non-plant portions of plant shelves 711, according to some embodiments of the present invention.

FIG. 15C is a perspective view of a portion of a plant light system 1503, with a plurality of cartridges 1511 that are are movable to different vertical locations and spacings on vertical rods 1512, according to some embodiments of the present invention.

FIG. 15D is a perspective view of a plant light cartridge 1504, with a raised flange 1521 that spaces the LEDs of light sheet 1525 (which is implemented as light sheet 1301 of FIG. 13A, light sheet 1302 of FIG. 13B, light sheet 1303 of FIG. 13C, stacked light sheet system 1401 of FIG. 14A, or other light sheets as described and shown herein), according to some embodiments of the present invention.

Figure 15E:
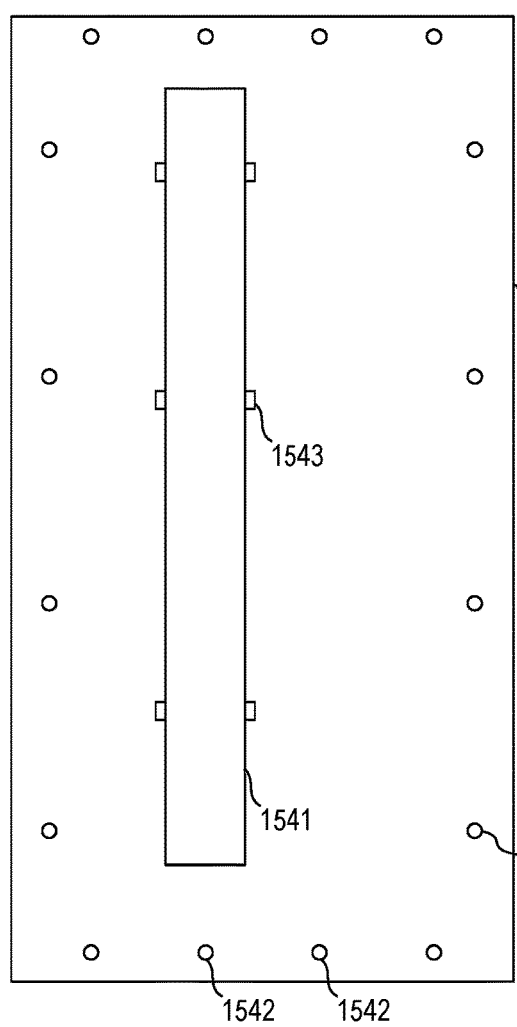
FIG. 15E is a plan back-side view of a plant light cartridge 1505, according to some embodiments of the present invention.

FIG. 15E is a plan back-side view of a plant light cartridge 1505, according to some embodiments of the present invention. In some embodiments, an electronics box 1541 is attached to a plurality of mounting slits 1542 (e.g., in some embodiments, using brackets 1572 as shown in FIG. 15G). In some embodiments, electronics box 1541 encloses one or more power supplies and other circuitry for safety and ruggedness. In some embodiments, a plurality of threaded holes 1542 are provided for mounting purposes.

Figure 15F:
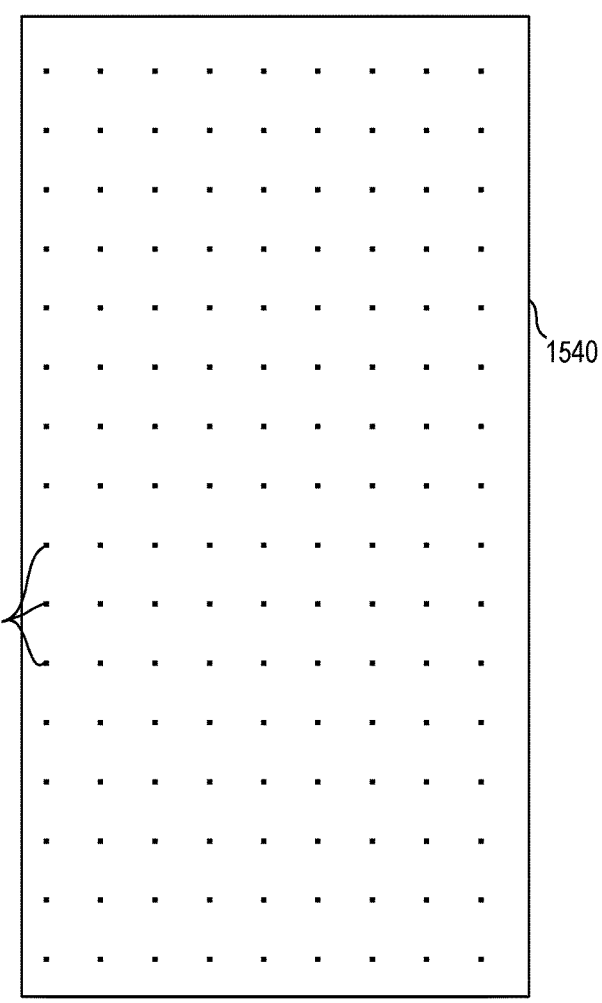
FIG. 15F is a plan front-side view of a plant light cartridge 1505, according to some embodiments of the present invention.

FIG. 15F is a plan front-side view of a plant light cartridge 1505, according to some embodiments of the present invention. In some embodiments, a plurality of LEDs 1551 is mounted in parallel-series configuration on light sheet 1540 (see FIGS. 13A-13F for examples of such light sheets used in some embodiments).

FIG. 15G is a side view of an electronics box 1541 used on plant light cartridge 1505, according to some embodiments of the present invention. In some embodiments, one or more hanging fixtures 1571 are provided on the sides, and a plurality of mounting flanges 1572 are provided.

Figure 15H:
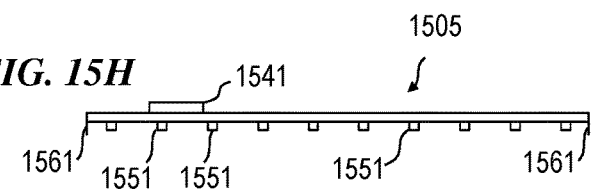
FIG. 15H is a cross-section view of a plant light cartridge 1505, according to some embodiments of the present invention.
Figure 15G:
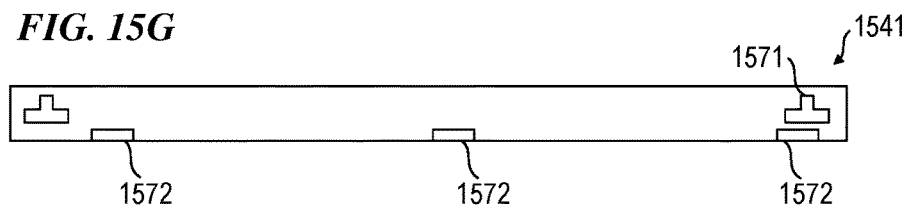
FIG. 15G is a side view of an electronics box 1541 used on plant light cartridge 1505, according to some embodiments of the present invention.

FIG. 15H is a cross-section view of a plant light cartridge 1505, according to some embodiments of the present invention. In some embodiments, a raised lip or flange 1561 extends outward on all sides (and, in some embodiments, in the middle) of light sheet 1540, thus providing protection for LEDs 1551 when plant light cartridge 1505 is slid onto a horizontal shelf (such as in the system 702 of FIG. 7B, where, instead of using light sheets 201, one or more shelf brackets are provided at one or more different heights above each shelf of plant pots). In some embodiments, a front-side sheet of transparent or translucent polymer (such as acetate or polycarbonate) is affixed over the light-emitting side of the LEDs 1551 (i.e., the bottom side of FIG. 15H).

FIG. 16 is a plan view of a hinged plant light cartridge system 1601, according to some embodiments of the present invention. In some embodiments, hinged plant light cartridge system 1601 includes a plurality of plant light cartridges 1505 connected along their edges (e.g., in some embodiments, these edges include brackets 1611) with hinges 1612.

Figure 17:
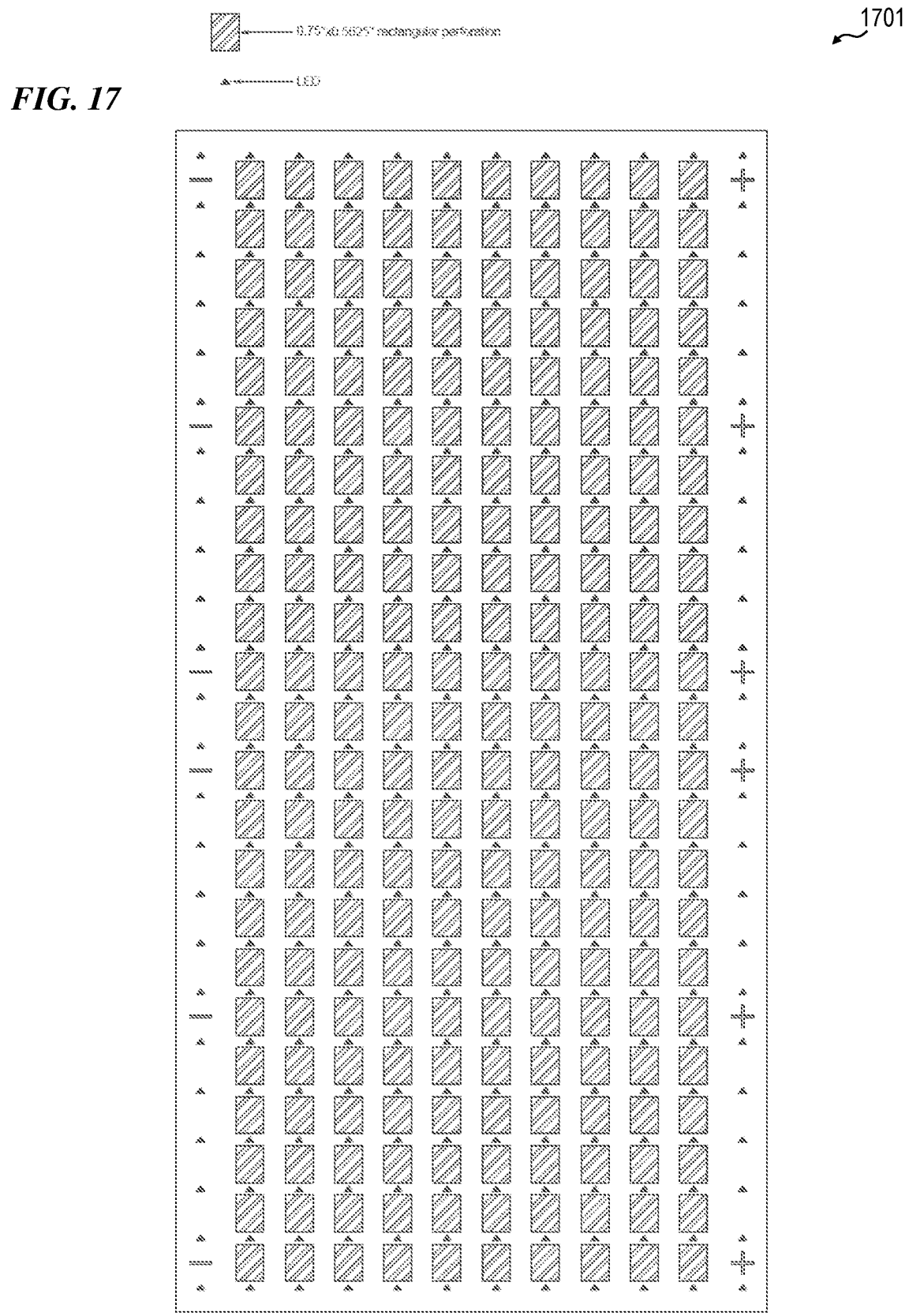
FIG. 17 is a plan view of a perforated light-sheet system 1701 with rectangular holes, according to some embodiments of the present invention.

FIG. 17 is a plan view of a perforated light-sheet system 1701 with rectangular holes, according to some embodiments of the present invention.

Figure 18:
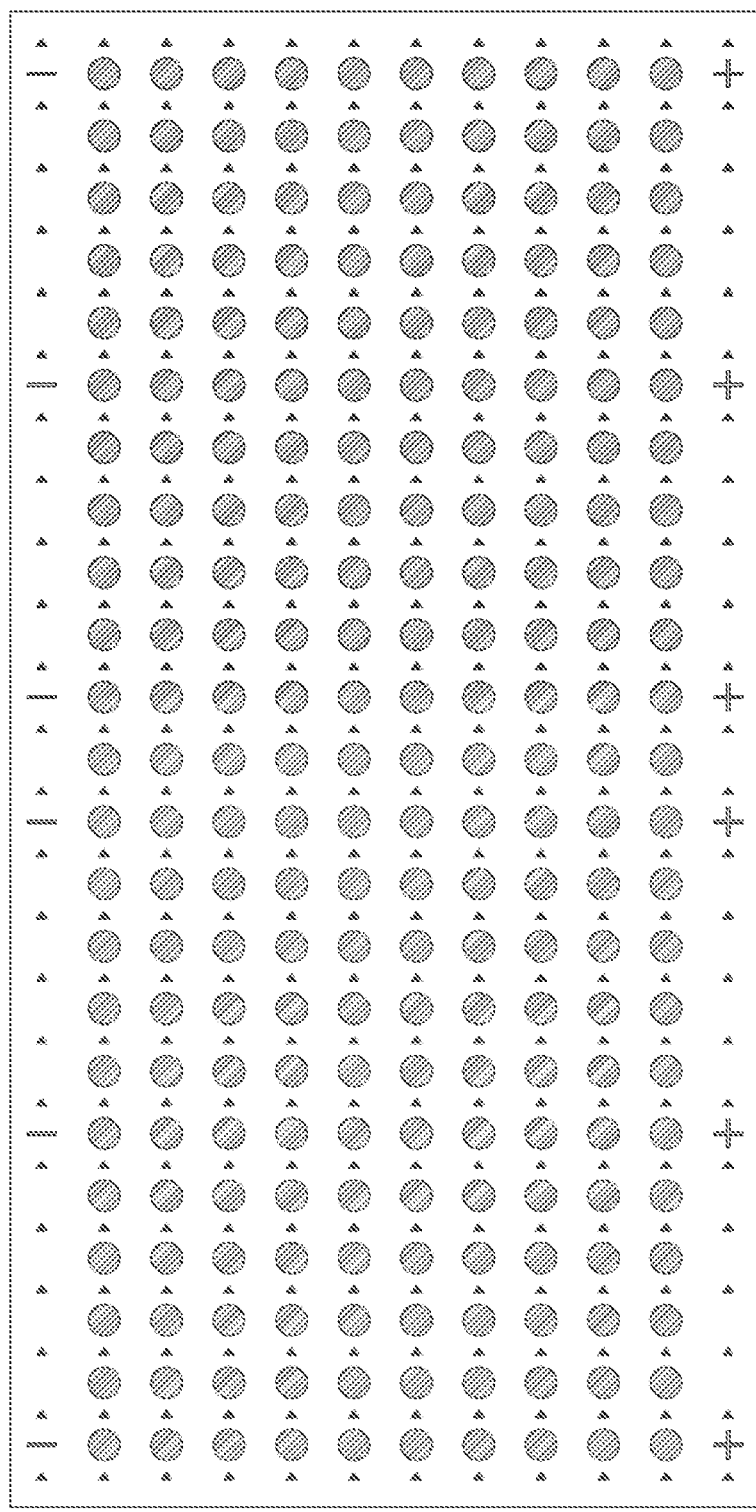
FIG. 18 is a plan view of a perforated light-sheet system 1801 with large circular holes, according to some embodiments of the present invention.

FIG. 18 is a plan view of a perforated light-sheet system 1801 with large circular holes, according to some embodiments of the present invention.

Figure 19:
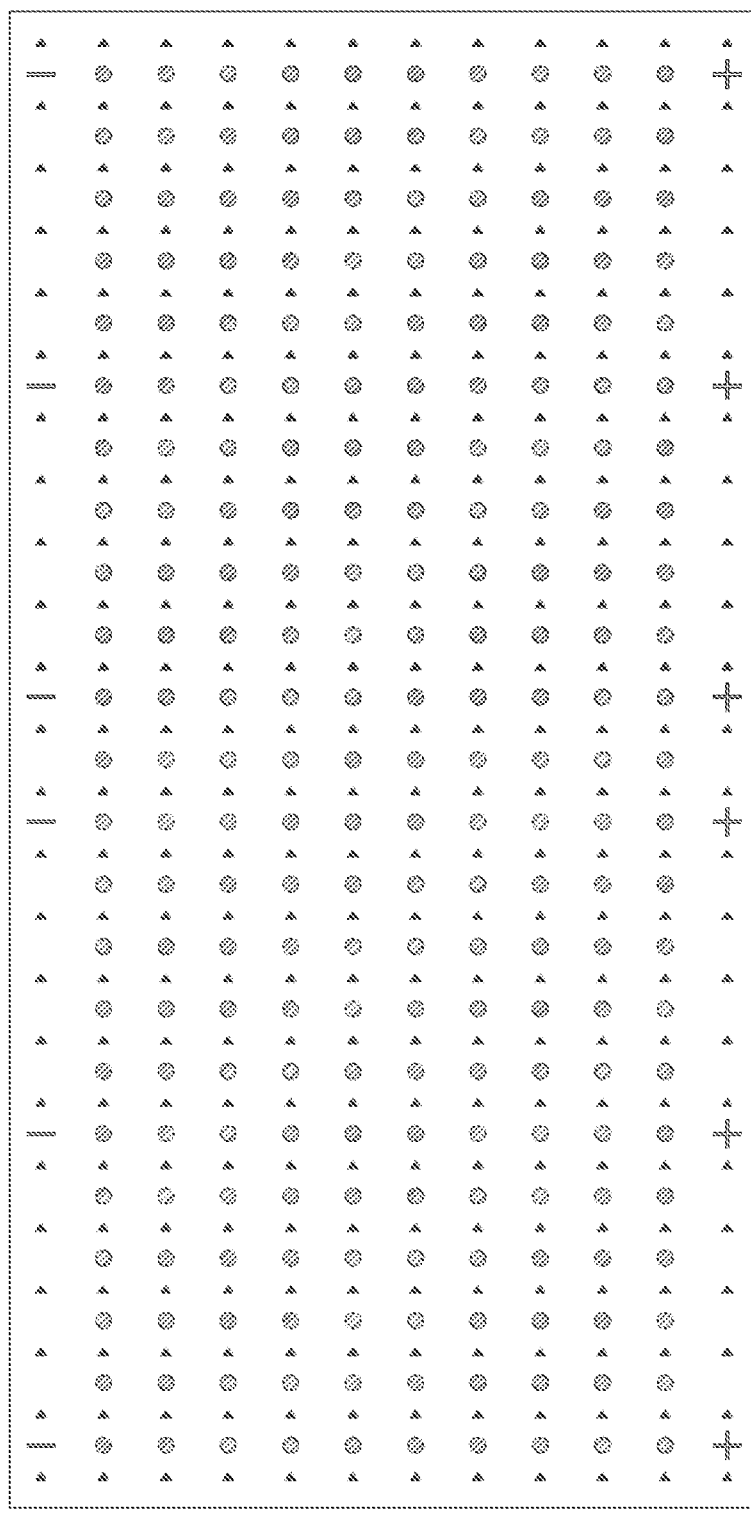
FIG. 19 is a plan view of a perforated light-sheet system 1901 with small circular holes, according to some embodiments of the present invention.

FIG. 19 is a plan view of a perforated light-sheet system 1901 with small circular holes, according to some embodiments of the present invention.

Figure 20:
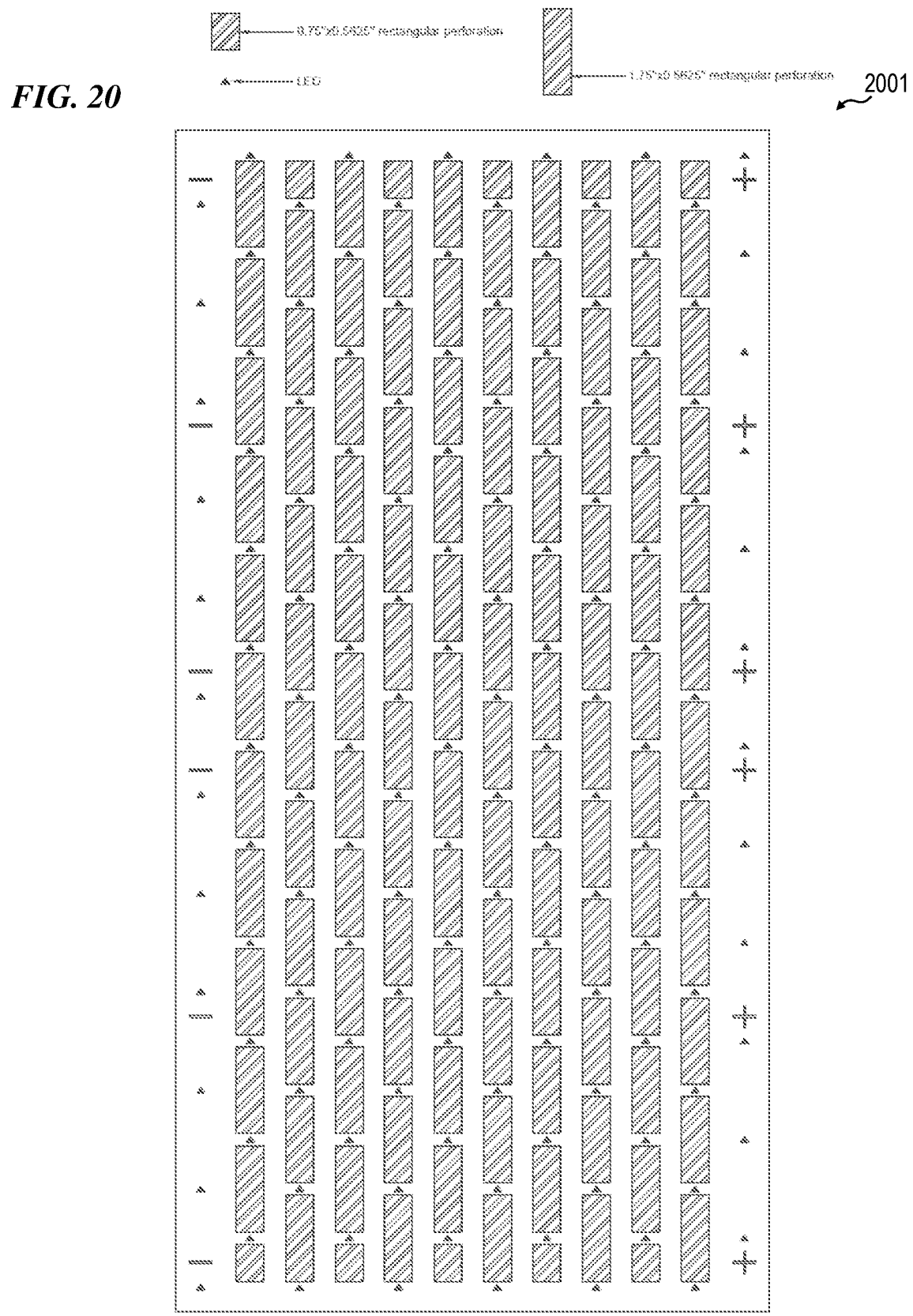
FIG. 20 is a plan view of a perforated light-sheet system 2001 with rectangular holes of differing sizes, according to some embodiments of the present invention.

FIG. 20 is a plan view of a perforated light-sheet system 2001 with rectangular holes of differing sizes, according to some embodiments of the present invention.

Limiting Excess Heat

In some embodiments, the present invention includes one-hundred forty-four (144) low-wattage LEDs and a flexible circuit that produces little temperature rise over the ambient temperature (e.g., in some embodiments, the flexible circuit operates at about 95 degrees Fahrenheit (about 35 degrees Celsius) with no fans and convection cooling only for the flexible circuit). Accordingly, in some embodiments, the present invention does not require active fans or clunky metal heat sinks attached to the circuit substrate. In some embodiments, the present invention minimizes fungus and mold resulting from "hot" lighting systems operating indoors.

GROWFILM™-Brand Light Sheets

In some embodiments, the present invention provides a unique vegetative light flux distribution that stimulates plants' photosynthetic triggers to optimize nutrient values and yield.

Surround Light (Volumetric Light Flux)

In some embodiments, the present invention provides a nutritionally balanced light flux distributed to the canopy, lateral, and bottom surfaces of the plant that triggers all of the plant's receptors. Accordingly, nutrients (deriving from soil, fertilizer, and other chemical and organic supplements) are more efficiently utilized by the plant, reducing cost and increasing yield. In addition, this reduces water and electrical energy usage due to a shortened growth cycle.

Modular

In some embodiments, thin and minimal independent light modules and a separate power pack are connected by low-voltage cable for easy installation, maintenance and optimized light delivery.

Curve (Shaped Light)

In some embodiments, "shaped" vegetative light flux (e.g., concentrated from an inward-directed cylindrical emitting face towards a center or core of the plants) is delivered to the plant as in nature, optimizing distribution to stimulate all photosynthetic receptors.

Three (3) Grow Settings

In some embodiments, the present invention provides one light for all stages of plant growth (germination, vegetative growth, and flowering). In some embodiments, the unique and adaptable system of the present invention eliminates the need for multiple lamps and lighting systems.

Integral Mounting Hardware

In some embodiments, the present invention includes a universal mounting hardware system that allows the light modules of the present invention to be mounted to the floor, wall, and/or ceiling.

In some embodiments, the present invention includes everything that is needed to set up and use the present invention in one box (e.g., cord, plug, and How-To-Use manual).

Minimal Heat

Some embodiment use 144 low-wattage LEDs and a patented flexible circuit (e.g., U.S. Pat. No. 8,471,274 to Golle, et al., which is incorporated herein by reference) produces minimal temperature rise (operates at 95° F. (35° C.)) allowing GROWFILM™ to be placed close to the plants which increases micromols per watt-second (micromols per joule) to accelerate growth/yield. Visible-light energy between 400 and 700 nanometers is the spectral region known as Photosynthetically Active Radiation or PAR; however, much light in the green region is reflected, which is why plant leaves look green. Accordingly, some embodiments of the present invention use LEDs that emit wavelengths that are absorbed by plants (such as selected red and blue wavelengths) without generating other wavelengths of white light that are not absorbed by plants and thus "wasted."

In some embodiments, the low increase in temperature relative to ambient temperature eliminates need for active fans or clunky metal heat sinks, thus lowering the cost of electricity, maintenance and replacement parts. Because of the low temperature rise, the LEDs can be placed right next to the plants (rather than being spaced 18 or more inches away, as is required by high-current LEDs, HPC, metal-halide, fluorescent or other conventional plant lights), thus reducing the volume of space required to grow a given number of plants.

In some embodiments, the low operating temperature relative to other grow-light sources also minimizes fungus and mold resulting from "hot" lighting systems operating indoors, which improves yield and minimizes loss of plants.

Broad Spectrum of Light

Some embodiments provide a unique vegetative light flux spectral distribution that acts to stimulate plants' photosynthetic triggers to optimize nutrient values and yields.

Flexible Surround Light

Some embodiments provide thin, lightweight, flexible GROWFILM™ that can "surround" one or more plants, delivering light and extra yield under the canopy of plants.

All-Inclusive Package

In some embodiments, all elements of the invention that are needed are supplied in one box, with a How-to-Use manual that allows for quick, easy set-up and operation of the lighting system.

In some embodiments, the present invention provides a lighting apparatus that includes a flexible circuit substrate having dimensions of at least 30 cm width and at least 30 cm length, the flexible circuit substrate having a first face and an opposite second face, and a first end and an opposite second end; a first plurality of LED dice affixed to a first face of the flexible circuit substrate, wherein each die of the first plurality of LED dice emits blue light having a peak wavelength in a range of 400 nm and 500 nm, inclusive, and a full-width half maximum bandwidth of no more than 50 nm; a second plurality of LED dice affixed to the first face of the flexible circuit substrate, wherein each die of the second plurality of LED dice emits red light having a peak wavelength in a range of 600 nm and 700 nm, inclusive, and a full-width half maximum bandwidth of no more than 50 nm; a third plurality of LED dice affixed to the first face of the flexible circuit substrate, wherein each die of the third plurality of LED dice emits infrared light having a peak wavelength in a range of 700 nm and 800 nm, inclusive, and a full-width half maximum bandwidth of no more than 50 nm; a first end cap affixed to the first end of the flexible circuit substrate; a second end cap affixed to the second end of the flexible circuit substrate, wherein the first and second end caps are configured to curve the first face of the flexible circuit substrate into a concave shape; and at least a first pole bracket, wherein the first pole bracket is connected to the first end cap, and wherein the first pole bracket is configured to attach to a first pole that supports the lighting apparatus.

In some embodiments, the apparatus further includes an adhesive strip configured to affix the first end cap to the first end of the flexible circuit substrate. In some embodiments, the flexible circuit substrate includes a disposable protective sheet. In some embodiments, the first face of the flexible circuit substrate is on a first side of the flexible circuit substrate, and wherein the second face of the flexible circuit substrate is on a second side of the flexible circuit substrate, the lighting apparatus further including a plurality of flexible poles including the first pole; and a pole-mount hub located on the second side of the flexible circuit substrate, wherein the pole-mount hub is configured to connect to each one of the plurality of flexible poles. In some embodiments, the apparatus further includes a plurality of pole brackets including the first pole bracket, wherein each one of the plurality of flexible poles is configured to attach to a corresponding pole bracket of the plurality of pole brackets. In some embodiments, the pole-mount hub includes a clamp plate.

In some embodiments, the pole-mount hub includes a clamp plate, the lighting apparatus further including a free-standing mounting system configured to hold the lighting apparatus in a desired orientation, wherein the free-standing mounting system is configured to attach to the clamp plate of the pole-mount hub. In some embodiments, the pole-mount hub includes a clamp plate, the lighting apparatus further including a free-standing mounting system configured to hold the lighting apparatus in a desired orientation, wherein the free-standing mounting system is configured to attach to the clamp plate of the pole-mount hub, and wherein the desired orientation is a vertical orientation. In some embodiments, the pole-mount hub includes a clamp plate, the lighting apparatus further including a free-standing mounting system configured to hold the lighting apparatus in a desired orientation, wherein the free-standing mounting system is configured to attach to the clamp plate of the pole-mount hub, and wherein the desired orientation is a horizontal orientation.

In some embodiments, the apparatus further includes a free-standing mounting system, wherein the lighting apparatus is one of a plurality of lighting apparatuses, and wherein the free-standing mounting system is configured to hold each one of the plurality of lighting apparatuses in a desired orientation. In some embodiments, the lighting apparatus produces at least approximately 30 watts (W) of power.

In some embodiments of the apparatus, each die of the first plurality of LED dice emits the blue light with a peak wavelength in a range of 420 nm and 480 nm, inclusive, and a full-width half maximum bandwidth of no more than 20 nm. In some embodiments, each die of the second plurality of LED dice emits the red light with a peak wavelength in a range of 610 nm and 690 nm, inclusive, and a full-width half maximum bandwidth of no more than 20 nm. In some embodiments, each die of the third plurality of LED dice emits the infrared light with a peak wavelength in a range of 700 nm and 780 nm, inclusive, and a full-width half maximum bandwidth of no more than 40 nm. In some embodiments, each die of the first plurality of LED dice emits the blue light with a peak wavelength in a range of 420 nm and 480 nm, inclusive, and a full-width half maximum bandwidth of no more than 20 nm; wherein each die of the second plurality of LED dice emits the red light with a peak wavelength in a range of 610 nm and 690 nm, inclusive, and a full-width half maximum bandwidth of no more than 20 nm; and wherein each die of the third plurality of LED dice emits the infrared light with a peak wavelength in a range of 700 nm and 780 nm, inclusive, and a full-width half maximum bandwidth of no more than 40 nm.

In some embodiments, each die of the first plurality of LED dice emits the blue light at a first intensity, wherein each die of the second plurality of LED dice emits the red light at a second intensity, wherein each die of the third plurality of LED dice emits the infrared light at a third intensity, and wherein the first intensity is approximately 50 percent of the second intensity. In some embodiments, each die of the first plurality of LED dice emits the blue light at a first intensity, wherein each die of the second plurality of LED dice emits the red light at a second intensity, wherein each die of the third plurality of LED dice emits the infrared light at a third intensity, wherein the first intensity is approximately 50 percent of the second intensity, and wherein the third intensity is approximately 20 percent of the second intensity. In some embodiments, the apparatus further includes a fourth plurality of LED dice affixed to the first face of the flexible circuit substrate, wherein each die of the fourth plurality of LED dice emits green light having a fourth intensity, a peak wavelength in a range of 500 nm and 560 nm, inclusive, and a full-width half maximum bandwidth of no more than 60 nm, wherein the fourth intensity is no more than approximately three (3) percent of the second intensity. In some embodiments, the apparatus further includes a fifth plurality of LED dice affixed to the first face of the flexible circuit substrate, wherein each die of the fifth plurality of LED dice emits white light having a fifth intensity, wherein the fifth intensity is no more than approximately three (3) percent of the second intensity. In some embodiments, the apparatus further includes a fourth plurality of LED dice affixed to the first face of the flexible circuit substrate, wherein each die of the fourth plurality of LED dice emits green light having a fourth intensity, a peak wavelength in a range of 500 nm and 560 nm, inclusive, and a full-width half maximum bandwidth of no more than 60 nm, wherein the fourth intensity is no more than approximately three (3) percent of the second intensity; and a fifth plurality of LED dice affixed to the first face of the flexible circuit substrate, wherein each die of the fifth plurality of LED dice emits white light having a fifth intensity, wherein the fifth intensity is no more than approximately three (3) percent of the second intensity.

In some embodiments, the present invention provides a method that includes providing a flexible circuit substrate having dimensions of at least 30 cm width and at least 30 cm length, the flexible circuit substrate having a first face on a first side and an opposite second face on an opposite second side, and a first end and an opposite second end; affixing a first plurality of LED dice to a first face of the flexible circuit substrate; emitting from each die of the first plurality of LED dice blue light having a peak wavelength in a range of 400 nm and 500 nm, inclusive, and a full-width half maximum bandwidth of no more than 50 nm; affixing a second plurality of LED dice to the first face of the flexible circuit substrate; emitting from each die of the second plurality of LED dice red light having a peak wavelength in a range of 600 nm and 700 nm, inclusive, and a full-width half maximum bandwidth of no more than 50 nm; affixing a third plurality of LED dice affixed to the first face of the flexible circuit substrate; emitting from each die of the third plurality of LED dice infrared light having a peak wavelength in a range of 700 nm and 800 nm, inclusive, and a full-width half maximum bandwidth of no more than 50 nm; attaching a first end cap to the first end of the flexible circuit substrate; attaching a second end cap to the second end of the flexible circuit substrate, wherein the attaching of the first and second end caps includes curving the first face of the flexible circuit substrate into a concave shape; and supporting the lighting apparatus, wherein the supporting includes connecting a first pole to the first end cap.

In some embodiments, the method further includes providing an adhesive strip, wherein the attaching of the first end cap includes affixing the first end cap to the first end of the flexible circuit substrate using the adhesive strip. In some embodiments, the method further includes applying a disposable protective sheet to the first face of the flexible circuit substrate. In some embodiments, the method further includes providing a plurality of flexible poles including the first pole and a second pole; providing a pole-mount hub; and connecting a first end of each one of the plurality of flexible poles to the pole-mount hub on the second side of the flexible circuit substrate. In some embodiments, the connecting of the first pole to the first end cap includes connecting a second end the first pole to the first end cap, the method further including connecting a second end of the second pole to the second end cap.

In some embodiments, the method further includes mounting the flexible circuit substrate in a vertical orientation. In some embodiments, the method further includes mounting the flexible circuit substrate in a horizontal orientation. In some embodiments, the flexible circuit substrate is a first flexible circuit substrate of a plurality of flexible circuit substrates, the method further includes mounting each one of the plurality of flexible circuit substrates in a desired orientation.

In some embodiments of the method, the emitting from each die of the first plurality of LED dice includes emitting the blue light with a peak wavelength in a range of 420 nm and 480 nm, inclusive, and a full-width half maximum bandwidth of no more than 20 nm. In some embodiments, the emitting from each die of the second plurality of LED dice includes emitting the red light with a peak wavelength in a range of 610 nm and 690 nm, inclusive, and a full-width half maximum bandwidth of no more than 20 nm. In some embodiments, the emitting from each die of the third plurality of LED dice includes emitting the infrared light with a peak wavelength in a range of 700 nm and 780 nm, inclusive, and a full-width half maximum bandwidth of no more than 40 nm. In some embodiments, the emitting from each die of the first plurality of LED dice includes emitting the blue light with a peak wavelength in a range of 420 nm and 480 nm, inclusive, and a full-width half maximum bandwidth of no more than 20 nm; wherein the emitting from each die of the second plurality of LED dice includes emitting the red light with a peak wavelength in a range of 610 nm and 690 nm, inclusive, and a full-width half maximum bandwidth of no more than 20 nm; and wherein the emitting from each die of the third plurality of LED dice includes emitting the infrared light with a peak wavelength in a range of 700 nm and 780 nm, inclusive, and a full-width half maximum bandwidth of no more than 40 nm.

In some embodiments of the method, the emitting from each die of the first plurality of LED dice includes emitting the blue light at a first intensity, wherein the emitting from each die of the second plurality of LED dice includes emitting the red light at a second intensity, wherein the emitting from each die of the third plurality of LED dice includes emitting the infrared light at a third intensity, and wherein the first intensity is approximately 50 percent of the second intensity. In some embodiments, the emitting from each die of the first plurality of LED dice includes emitting the blue light at a first intensity, wherein the emitting from each die of the second plurality of LED dice includes emitting the red light at a second intensity, wherein the emitting from each die of the third plurality of LED dice includes emitting the infrared light at a third intensity, wherein the first intensity is approximately 50 percent of the second intensity, and wherein the third intensity is approximately 20 percent of the second intensity.

In some embodiments, the method further includes affixing a fourth plurality of LED dice to the first face of the flexible circuit substrate; and emitting from each die of the fourth plurality of LED dice green light having a fourth intensity, a peak wavelength in a range of 500 nm and 560 nm, inclusive, and a full-width half maximum bandwidth of no more than 60 nm, wherein the fourth intensity is no more than approximately three (3) percent of the second intensity. In some embodiments, the method further includes affixing a fifth plurality of LED dice affixed to the first face of the flexible circuit substrate; and emitting from each die of the fifth plurality of LED dice white light having a fifth intensity, wherein the fifth intensity is no more than approximately three (3) percent of the second intensity. In some embodiments, the method further includes affixing a fourth plurality of LED dice to the first face of the flexible circuit substrate; emitting from each die of the fourth plurality of LED dice green light having a fourth intensity, a peak wavelength in a range of 500 nm and 560 nm, inclusive, and a full-width half maximum bandwidth of no more than 60 nm, wherein the fourth intensity is no more than approximately three (3) percent of the second intensity; affixing a fifth plurality of LED dice affixed to the first face of the flexible circuit substrate; and emitting from each die of the fifth plurality of LED dice white light having a fifth intensity, wherein the fifth intensity is no more than approximately three (3) percent of the second intensity.

In some embodiments, the present invention provides an apparatus for mass production of plants, the apparatus including: a plant-light system that includes a plurality of plant-lighting sheets, wherein each plant-lighting sheet includes a plurality of LED tiles, each LED tile including a plurality of LEDs arranged on a grid, the plurality of LEDs including LEDs emitting light that appears red, light that appears blue and light that appears white, wherein each plant lighting sheet has a length and a width, wherein the length of each plant lighting sheet is at least five times the width, and wherein the plurality of lighting sheets is arranged along a length of a room; a plant-sheet rotation and withdrawal system arranged to rotate one or more of the plant lighting sheets between a first orientation substantially parallel relative to the length of the room and a second orientation substantially perpendicular relative to the length of the room; and a plurality of plant-holding shelves arranged along the length of the room facing the plurality of plant lighting sheets.

In some embodiments, the present invention provides an apparatus for mass production of plants, the apparatus including: a plant-light system that includes a plurality of plant-lighting sheets, wherein each plant-lighting sheet includes one or more LED tiles, each LED tile including a plurality of LEDs arranged on a grid; a plurality of parallel tracks for arranging the plurality of plant-lighting sheets; a plant-sheet movement system arranged to move one or more of the plant lighting sheets between a first location substantially parallel relative to the length of the room and a second location substantially parallel relative to the length of the room; and a plurality of plant-holding shelves arranged along the length of the room facing the plurality of plant lighting sheets, wherein the plurality of parallel tracks allows the plurality of plant-lighting sheets to be located at a plurality of different distances from the plant-holding shelves.

In some embodiments, the present invention provides an apparatus that includes: a first perforated plant-lighting sheet having a plurality of LEDs mounted thereon in a grid wired in parallel-series connected by a plurality of series conductors and a plurality of parallel conductors, wherein the first plant-lighting sheet has a plurality of holes therethrough, each of the plurality of holes located between two adjacent ones of the plurality of series conductors and between two adjacent ones of the plurality of parallel conductors.

Some embodiments further include a second perforated plant-lighting sheet having a plurality of LEDs mounted thereon in a grid wired in parallel-series connected by a plurality of series conductors and a plurality of parallel conductors, wherein the second plant-lighting sheet has a plurality of holes therethrough, each of the plurality of holes located between two adjacent ones of the plurality of series conductors and between two adjacent ones of the plurality of parallel conductors, and wherein the first plant-lighting sheet and the second plant-lighting sheet are stacked one on the other such that light from the LEDs on the second plant-lighting sheet is emitted through the holes of the first plant-lighting sheet.

In some embodiments, the present invention provides an apparatus that includes: a plant-lighting cartridge that includes: a first front-side plant-lighting sheet system having a plurality of LEDs mounted thereon in a grid wired in parallel-series connected by a plurality of series conductors and a plurality of parallel conductors; a raised lip surrounding the first plant-lighting sheet such that the LEDs are recessed from the outer edge of the raised lip; and a backside electronics enclosure that contains power-supply electronics that are operatively coupled to the plurality of LEDs.

In some embodiments, the plant-lighting sheet system further includes a plurality of perforated plant-lighting sheets including a first perforated plant-lighting sheet having a plurality of LEDs mounted thereon in a grid wired in parallel-series connected by a plurality of series conductors and a plurality of parallel conductors, wherein the first plant-lighting sheet has a plurality of holes therethrough, each of the plurality of holes located between two adjacent ones of the plurality of series conductors and between two adjacent ones of the plurality of parallel conductors, and a second perforated plant-lighting sheet having a plurality of LEDs mounted thereon in a grid wired in parallel-series connected by a plurality of series conductors and a plurality of parallel conductors, wherein the second plant-lighting sheet has a plurality of holes therethrough, each of the plurality of holes located between two adjacent ones of the plurality of series conductors and between two adjacent ones of the plurality of parallel conductors, and wherein the first plant-lighting sheet and the second plant-lighting sheet are stacked one on the other such that light from the LEDs on the second plant-lighting sheet is emitted through the holes of the first plant-lighting sheet.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An apparatus for mass production of plants, the apparatus comprising:
   a plant-light system that includes a plurality of plant-lighting sheets, wherein each plant-lighting sheet includes a plurality of LED tiles, each LED tile including a plurality of LEDs arranged on a grid, the plurality of LEDs including LEDs emitting light that appears red, light that appears blue and light that appears white, wherein each plant lighting sheet has a length and a width, wherein the length of each plant lighting sheet is at least five times the width, and wherein the plurality of lighting sheets is arranged along a length of a room;
   a plant-sheet rotation and withdrawal system arranged to rotate one or more of the plant lighting sheets between a first orientation substantially parallel relative to the length of the room and a second orientation substantially perpendicular relative to the length of the room; and
   a plurality of plant-holding shelves arranged along the length of the room facing the plurality of plant lighting sheets.

2. The apparatus of claim 1,
   wherein the plurality of plant-lighting sheets are arranged as a plurality of parallel lighting rows such that each one of the plurality of parallel lighting rows includes a sub-plurality of the plurality of plant-lighting sheets; and
   wherein the plurality of plant-holding shelves are further arranged as a plurality of shelf rows, wherein each shelf row of the plurality of shelf rows is located between a respective pair of parallel lighting rows of the plurality of parallel lighting rows along lengths of the respective pair of parallel lighting rows, wherein the plant-sheet rotation system is configured to orient a first lighting row of the plurality of parallel lighting rows to face towards a first shelf row of the plurality of shelf rows for a first time period, and then to rotate the first lighting row to face a different, second shelf row of the plurality of-shelf rows for a second time period that alternates with the first time period.

3. The apparatus of claim 2, wherein the first time period is twelve hours each day, wherein the plurality of parallel lighting rows face even-numbered shelf rows of the plurality of shelf rows during the first time period, and at the end of the first time period, the plurality of parallel lighting rows are rotated around their respective vertical axes to face odd-numbered shelf rows of the plurality of shelf rows for the second time period, wherein the second time period is twelve hours.

4. The apparatus of claim 2, wherein the first time period is eight hours each day, wherein the plurality of parallel lighting rows face even-numbered shelf rows of the plurality of shelf rows during the first time period, and at the end of the first time period, the plurality of parallel lighting rows are rotated around their respective vertical axes to face odd-numbered shelf rows of the plurality of shelf rows for the second time period, wherein the second time period is eight hours.

5. The apparatus of claim 2, wherein, for the first time period, the plurality of parallel lighting rows face even-numbered shelf rows of the plurality of shelf rows, and at the end of the first time period, the plurality of parallel lighting rows are rotated around their respective vertical axes to face odd-numbered shelf rows of the plurality of shelf rows for the second time period.

6. The apparatus of claim 1, wherein the plant-sheet rotation and withdrawal system is further configured, when the plurality of plant-lighting sheets is in the second orientation, to move the plurality of plant-lighting sheets to a withdrawn configuration that pushes the plurality of plant-lighting sheets together such that a majority of a width of the plurality of plant-holding shelves is no longer adjacent the plurality of plant-lighting sheets.

7. The apparatus of claim 1,
wherein the plurality of plant-holding shelves are further arranged to form a plurality of shelf rows,
wherein the plurality of plant-lighting sheets are arranged in a plurality of parallel lighting rows such that each one of the plurality of parallel lighting rows includes a sub-plurality of the plurality of plant-lighting sheets,
wherein the plurality of parallel lighting rows includes a first lighting row,
wherein each shelf row of the plurality of shelf rows is located between a respective pair of parallel lighting rows of the plurality of parallel lighting rows along lengths of the respective pair of parallel lighting rows, the apparatus further comprising:
a shelf-movement system configured to move at least two of the shelf rows to form at least a first aisle to be temporarily wider than others of aisles that are between pairs of shelf rows, in order to allow plant workers to move in that first wider aisle to service plants in the first aisle, wherein the light-sheet rotation and withdrawal system is further configured to move light sheets of the first lighting row in the first aisle to a withdrawn configuration such that the plant-lighting sheets in the first lighting row is pushed together, in order to allow the plant workers to move in that first wider aisle to service plants in the first wider aisle while the first lighting row is in the withdrawn configuration.

8. The apparatus of claim 1,
wherein the plant-sheet rotation and withdrawal system includes a track system having a plurality of parallel tracks that are at different distances from the plurality of plant-holding shelves, wherein the track system is operatively coupled to the plurality of plant-lighting sheets,
wherein the track system is configured to hold, at different points in time, the plurality of plant-lighting sheets on one of the plurality of tracks that is at one of the different distances from the plurality of plant-holding shelves, and
wherein the track system is configured to move the plurality of plant-lighting sheets from a first track between a first pair of shelf rows of the plurality of shelf rows to a second track between the first pair of shelf rows of the plurality of shelf rows.

9. The apparatus of claim 1,
wherein the plurality of plant-holding shelves is further arranged as a plurality of shelf rows, and
wherein the plant-sheet rotation and withdrawal system includes a track system operatively coupled to the plurality of plant-lighting sheets,
wherein the track system includes a plurality of parallel tracks between at least one pair of shelf rows of the plurality of shelf rows, and
wherein the track system is configured to move the plurality of plant-lighting sheets from a first track between a first pair of shelf rows of the plurality of shelf rows to a second track between a second pair of shelf rows of the plurality of shelf rows.

10. The apparatus of claim 1,
wherein the plurality of plant-holding shelves is further arranged in a plurality of shelf rows, and
wherein the plant-sheet rotation and withdrawal system includes a track system operatively coupled to the plurality of plant-lighting sheets, wherein the track system includes:
a hinge system configured to hold the plurality of plant-lighting sheets in a hanging arrangement,
a plurality of parallel tracks located between each respective pair of shelf rows of the plurality of shelf rows, and
a plurality of switches configured to guide the plurality of plant-lighting sheets into a desired track of a respective plurality of parallel tracks between a respective pair of shelf rows.

11. A method for mass producing plants comprising:
providing a plurality of hanging plant-lighting sheets hanging from a plant-sheet rotation and withdrawal system, wherein each hanging plant-lighting sheet of the plurality of hanging plant-lighting sheets includes a plurality of LED tiles, each LED tile including a plurality of LEDs arranged on a grid, wherein each plant lighting sheet has a length and a width;
arranging the plurality of hanging plant-lighting sheets along a length of a room;
rotating one or more of the hanging plant-lighting sheets, using the plant-sheet rotation and withdrawal system, between a first orientation substantially parallel relative to the length of the room and a second orientation substantially perpendicular relative to the length of the room, and selectively withdrawing one or more of the hanging plant-lighting sheets to an end of the room using the plant-sheet rotation and withdrawal system;
providing a plurality of plant-holding supports configured to hold a plurality of plants, wherein a plurality of subsets of the plurality of plants are arranged such that the plants in each subset are spaced vertically directly above one another; and arranging the plurality of plant-holding supports along the length of the room facing the plurality of plant lighting sheets.

12. The method of claim 11, further comprising:
arranging the plurality of plant-lighting sheets as a plurality of parallel lighting rows such that each one of parallel lighting rows includes a sub-plurality of the plurality of plant-lighting sheets;
arranging the plurality of plant-holding supports as a plurality of plant rows, wherein each plant row of the plurality of plant rows is located between a respective pair of parallel lighting rows of the plurality of parallel lighting rows along lengths of the respective pair of parallel lighting rows;
orienting a first lighting row of the plurality of parallel lighting rows to face towards a first plant row of the plurality of plant rows for a first time period; and
rotating the first lighting row to face a different, second plant row of the plurality of plant rows for a second time period that alternates with the first time period.

13. The method of claim 11, wherein the first and second time periods are each twelve hours, the method further comprising:
orienting the plurality of parallel lighting rows to face even-numbered plant rows of the plurality of plant rows during the first time period; and
rotating the plurality of parallel lighting rows to face odd-numbered plant rows of the plurality of plant rows for the second time period.

14. The method of claim 11, wherein the first and second time periods are each eight hours, the method further comprising:
orienting the plurality of parallel lighting rows to face even-numbered plant rows of the plurality of plant rows during the first time period; and
rotating the plurality of parallel lighting rows to face odd-numbered plant rows of the plurality of plant rows for the second time period.

15. The method of claim 11, wherein the plurality of plant-lighting sheets is in the second orientation, the method further comprising:
withdrawing the plurality of plant-lighting sheets together such that a majority of the plurality of plant-holding supports is no longer facing the plurality of plant-lighting sheets.

16. The method of claim 11, wherein the plurality of plant-lighting sheets is in the second orientation, the method further comprising:
arranging the plurality of plant-lighting sheets in a plurality of parallel lighting rows such that each one of the plurality of parallel lighting rows includes a sub-plurality of the plurality of plant-lighting sheets;
placing a first lighting row of the plurality of parallel lighting rows in a withdrawn configuration,
arranging the plurality of plant-holding supports as a plurality of plant rows, wherein each plant row of the plurality of plant rows is located between a respective pair of parallel lighting rows of the plurality of parallel lighting rows along lengths of the respective pair of parallel lighting rows; and
moving a first plant row of the plurality of plant rows laterally past the first lighting row while the first lighting row is in the withdrawn configuration.

17. The method of claim 11, further comprising:
moving the plurality of plant-lighting sheets from a first distance away from the plurality of plant-holding supports to a different, second distance away from the plurality of plant-holding supports.

18. The method of claim 11, further comprising:
arranging the plurality of plant-holding supports in a plurality of plant rows; and
moving the plurality of plant-lighting sheets from a first location between a first pair of plant rows that includes a first plant row and a second plant row of the plurality of plant rows to a second location between a second pair of plant rows that includes the second plant row and a third plant row of the plurality of plant rows.

19. The method of claim 11, further comprising:
arranging the plurality of plant-holding supports in a plurality of plant rows;
placing a plurality of parallel tracks between each respective pair of plant rows of the plurality of plant rows; and
guiding the plurality of plant-lighting sheets into a first track of the plurality of parallel tracks between a first pair of plant rows.

20. An apparatus for mass production of a plurality of plants, wherein the plurality of plants are held on a plurality of plant-holding supports arranged along a length of a room, wherein a plurality of subsets of the plurality of plants are arranged such that the plants in each subset are spaced vertically directly above one another, and wherein the plurality of plant-holding supports are further arranged as a plurality of support rows, the apparatus comprising:
a plant-light system that includes a plurality of hanging plant-lighting sheets, wherein each plant-lighting sheet includes one or more LED tiles, each LED tile including a plurality of LEDs arranged on a grid, the plurality of LEDs including a plurality of LEDs emitting light that appears red, a plurality of LEDs emitting light that appears blue and a plurality of LEDs emitting light that that appears white, wherein each plant lighting sheet has a length and a width, wherein the length of each plant lighting sheet is at least five times the width, and wherein each one of the plurality of lighting sheets hangs below a track arranged along a length of a room; and
a plant-sheet rotation and withdrawal system configured to rotate the plurality of the hanging plant-lighting sheets between a first orientation substantially parallel relative to the length of the room, a second orientation substantially perpendicular relative to the length of the room, and a third orientation substantially parallel relative to the length of the room, wherein the plurality of hanging plant-lighting sheets face towards a first support row of the plurality of support rows when in the first orientation, and wherein the plurality of the hanging plant-lighting sheets face towards a second support row of the plurality of support rows when in the third orientation.

21. An apparatus for mass production of a plurality of plants, wherein the plurality of plants are held on a plurality of plant-holding supports arranged along a length of a room, wherein a plurality of subsets of the plurality of plants are arranged such that the plants in each subset are spaced vertically directly above one another, the apparatus comprising:
a plant-light system that includes a plurality of hanging plant-lighting sheets, wherein each plant-lighting sheet includes one or more LED tiles, each LED tile including a plurality of LEDs arranged on a grid, the plurality of LEDs including a plurality of LEDs emitting light that appears red, a plurality of LEDs emitting light that appears blue and a plurality of LEDs emitting light that that appears white, wherein each plant lighting sheet has a length and a width, wherein the length of each plant lighting sheet is at least five times the width, and wherein each one of the plurality of lighting sheets hangs below a track arranged along a length of a room; and a plant-sheet rotation and withdrawal system configured to rotate the plurality of the hanging plant-lighting sheets between a first orientation substantially parallel relative to the length of the room and a second orientation substantially perpendicular relative to the length of the room, wherein the plurality of plant-holding supports arranged along the length of the room face the plurality of plant lighting sheets when the plurality of lighting sheets are in the first orientation substantially parallel relative to the length of the room, wherein at least one plant-lighting sheet of the plurality of hanging plant-lighting sheets includes an interior gas-delivery plenum and a plurality of holes such that a gas in the plenum passes through the plurality of holes toward plants growing from at least one of the plant-holding supports.

* * * * *